United States Patent
Takahashi et al.

(10) Patent No.: US 6,834,020 B2
(45) Date of Patent: Dec. 21, 2004

(54) SEMICONDUCTOR STORAGE DEVICE

(75) Inventors: Hiroyuki Takahashi, Tokyo (JP); Hideo Inaba, Tokyo (JP); Atsushi Nakagawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 77 days.

(21) Appl. No.: 10/257,193

(22) PCT Filed: Apr. 10, 2001

(86) PCT No.: PCT/JP01/03065
§ 371 (c)(1),
(2), (4) Date: Oct. 9, 2002

(87) PCT Pub. No.: WO01/78079
PCT Pub. Date: Oct. 18, 2001

(65) Prior Publication Data
US 2003/0063512 A1 Apr. 3, 2003

(30) Foreign Application Priority Data
Apr. 11, 2000 (JP) .................... 2000-109689
Apr. 4, 2001 (JP) .................... 2001-105837

(51) Int. Cl.$^7$ .............................................. G11C 7/00
(52) U.S. Cl. ............. 365/222; 365/189.01; 365/230.01; 365/230.08
(58) Field of Search .................... 365/222, 189.01, 365/230.01, 230.08

(56) References Cited

U.S. PATENT DOCUMENTS 4,677,592 A 6/1987 Sakurai et al.
6,313,844 B1 * 11/2001 Yamashita .................. 345/531

FOREIGN PATENT DOCUMENTS

| EP | 0166974 A2 | 5/1985 |
|---|---|---|
| EP | 0166974 B1 | 11/1991 |
| JP | 60-113393 | 6/1985 |
| JP | 61-5495 | 1/1986 |
| JP | 62-188906 | 8/1987 |
| JP | 63-206994 | 8/1988 |
| JP | 1-94593 | 4/1989 |
| JP | 2-18780 | 1/1990 |
| JP | 4-243087 | 8/1992 |
| JP | 5-189961 | 7/1993 |
| JP | 6-36557 | 2/1994 |

* cited by examiner

Primary Examiner—Richard Elms
Assistant Examiner—Pho M. Luu
(74) Attorney, Agent, or Firm—Choate, Hall & Stewart

(57) ABSTRACT

A semiconductor memory device is provided which operates according to the specification of an SRAM, and which is capable of making the memory cycle shorter than heretofore, without normal access being delayed by the influence of refresh. An ATD circuit (4) receives change of an address ("Address"), and generates a one shot pulse in an address transition detect signal (ATD) after an address skew period has elapsed. In the case of a write request, a write enable signal (/WE) is dropped within the address skew period. First, writing or reading is performed from the rising edge of the one shot pulse, and, in the case of writing, late writing is performed using the address and the data which were presented at the time of the directly preceding write request. Next, refresh is performed during the period from the falling edge of the one shot pulse until the address skew period of the subsequent memory cycle is completed. And, for late writing at the time of the next write request, the address and the data are taken into register circuits (3, 12) upon the rising edge of the write enable signal (/WE).

18 Claims, 21 Drawing Sheets

SEMICONDUCTOR STORAGE DEVICE

TECHNICAL FIELD

The present invention relates to a semiconductor memory device in which the memory cell array is made up from memory cells which are the same as a DRAM (dynamic random access memory), and moreover which, when seen from the outside of the semiconductor memory device, operates with the same specifications as a general-purpose SRAM (static RAM). In particular, the present invention relates to a semiconductor memory device which is suitable for incorporation into a portable instrument, as represented by a portable telephone or PHS (personal handyphone system) or the like.

BACKGROUND ART

SRAMs and DRAMs are typical representatives of semiconductor memory devices which are capable of random access. When compared with a DRAM, generally an SRAM is high speed, and if it is supplied with power source and merely an address is input, it is possible for change of this address to be detected, and for sequential circuits in the interior to operate so as to perform reading and writing. Since in this manner an SRAM, operates only by being provided with a simple input signal waveform, as compared with a DRAM, therefore it is possible to simplify the structure of the circuitry which generates this type of input signal waveform.

Furthermore, since with an SRAM no refresh is required for maintaining the data which is stored in the memory cells as is the case with a DRAM, therefore, since no refresh is necessary, along with its operation being simple, it also has the merit that the electrical current for maintaining the data in the standby state is small. Owing to these facts, SRAMs are widely used for many applications. However, since generally an SRAM needs six transistors for each memory cell, if a great capacity is anticipated, the chip size becomes undesirably great as compared to a DRAM, and there is also the shortcoming that the price itself inevitably becomes high as compared to a DRAM.

On the other hand, for a DRAM, because the address is divided into two portions, the row address and the column address, which must be supplied separately, because a RAS (row address strobe)/CAS (column address strobe) becomes necessary as a signal for determining the input timings of these addresses, because it is necessary to refresh the memory cells periodically, and the like, therefore the timing control inevitably becomes more complicated as compared with an SRAM, moreover, extra circuitry and so on for refresh control becomes necessary.

Furthermore with a DRAM there is also the problem that, due to the fact that refresh for the memory cells becomes necessary even when there is no access from the outside, the consumption of electrical current becomes undesirably great. However, since the memory cells of a DRAM can be made up from one capacitor and one transistor each, therefore there is no need to increase the chip size, and it is comparatively easy to count upon increase in capacity. Accordingly, if it is a question of manufacturing semiconductor memory devices of the same capacity, a DRAM is cheaper than an SRAM.

By the way, as semiconductor memory devices which are to be employed in portable instruments of which representative types are the portable telephone and the like, up till the present, SRAMs are the main type used. This is because only simple functions have been incorporated in portable telephones up until now and therefore high capacity semiconductor memory devices have not been required until the present, because in comparison with DRAMs the operation of SRAMs is simple as far as the points of timing control and the like are concerned, because SRAMs are well adapted for portable telephones and the like in which it is desired to extend the continuous speech time period and the continuous standby receive time period as much as possible since their standby current is small and therefore their power consumption is low, and the like.

Nevertheless, nowadays, portable telephones which are endowed with very rich functionality are becoming progressively more popular, and functions are being implemented such as sending and receiving electronic mail, or, by accessing various sites, obtaining urban information such as data about restaurants in the vicinity and the like. Moreover, with the most recent portable telephones, functions such as display of simplified contents of home pages accessed on web servers upon the internet are also imminently to be provided, and it is also being assumed that in the near future it will become possible freely to access home pages and the like upon the internet in the same manner as with a current desktop type personal computer.

In order to implement these kinds of functions, it is useless only to perform simple text display as with old style portable telephones, and a graphic display becomes indispensable in order to present diverse multimedia information to the user. For this, the requirement has arisen for large quantities of data which have been received from a public network or the like to be temporarily stored in a semiconductor memory device within a portable telephone. In other words, for semiconductor memory devices which are to be fitted to portable instruments from now on, it is considered that having large capacity like a DRAM is an essential condition. However, since it is an absolute condition for a portable instrument that it should be small in size and light in weight, it is necessary to avoid increase in size and in weight of the instrument as a whole, even while increasing the capacity of the semiconductor memory device.

Although as described above an SRAM is desirable as a semiconductor memory device to be fitted to a portable instrument when the convenience of application and power consumption are considered, a DRAM comes to be desirable when viewed from the aspect of increasing capacity. In other words, it may be the that from now on semiconductor memory devices which employ the individual merits of SRAMs and of DRAMs will be most suitable for application to future portable instruments. As this type of semiconductor memory device, ones which are termed "pseudo-SRAMs" have already been contemplated which, while utilizing memory cells which are the same as those employed in DRAMs, have specifications almost identical to those of SRAMs, when seen from the outside.

With a pseudo-SRAM, when supplying the address, it is not necessary to separate it into a row address and a column address as with a DRAM, and furthermore timing signals such as RAS and CAS for implementing this separation are not required either. With a pseudo-SRAM, just as with a general-purpose SRAM, it is acceptable to supply the address only once, and to perform reading/writing by taking in the address internally upon trigger by a chip enable signal which is equivalent to a clock signal for a semiconductor memory device of the clock signal synchronized type.

Of course a pseudo-SRAM is not limited to having absolute compatibility with a general-purpose SRAM; many of them are equipped with refresh control terminals for controlling refresh of the memory cells from the outside, so that it is necessary to control refresh from the exterior of the pseudo-SRAM. In this manner, many pseudo-SRAMs are not so easy to operate as compared with SRAMs, and there is the defect that it becomes necessary to provide extra circuitry for refresh control. Due to this fact, as is introduced below, it has also come to be contemplated to manage without controlling the refresh of a pseudo-SRAM from the outside, and to provide a pseudo-SRAM which is made so that it can be operated with a specification which is exactly the same as that of a general-purpose SRAM. However various defects are present with this type of pseudo-SRAM as well, as will be described below.

First, as a first related art, the semiconductor memory device which has been disclosed in Japanese Unexamined Patent Application, First Publication No. Hei 4-243087 is proposed. With this related art, the pseudo-SRAM itself has no refresh timer, but rather it is arranged for a timer to be provided externally to the pseudo-SRAM. And an OE (output enable) signal is generated exterior to the pseudo-SRAM when an initial access request is made after the refresh time period has elapsed, and it is arranged for the reading or the writing which corresponds to the access request to be performed after performing a refresh according to this OE signal.

However with a structure like that of this first related art there is the problem that the power consumption becomes too great, and which renders application impossible to a low power consumption product like a portable telephone or the like, a premise for which is that it can be used for a long time period upon battery power. That is to say, with the first related art, it is arranged for the pseudo-SRAM to latch the address which has been input from the outside and to operate when the chip enable signal has become valid. However, since with the first related art it is necessary to change the chip enable signal each time the pseudo-SRAM is accessed, accordingly the power consumption becomes undesirably great due to charging and discharging of the bus lines of the chip enable signal which extend upon the circuit board.

Furthermore, with the first related art, when a read request arrives from the exterior of the pseudo-SRAM, reading of the memory cell which corresponds to the read request is performed after first performing refresh. Accordingly, there is the problem that the starting timing of the read operation is undesirably delayed by just the time period which is required for the refresh operation. In other words the address access time period—which means the time period from the time point at which the address is determined to the time point at which the read data is output (hereinafter termed $T_{AA}$)—comes to become undesirably long. This problem is generated in the same way in the case of writing. That is to say, there is the problem that it is not possible to start the write operation until after the refresh has been completed, even if, as an illustration, the write enable signal and the write data have been presented at an early timing within the memory cycle.

Next, as a second related art, the semiconductor memory device which has been disclosed in Japanese Patent No. 2529680 (Japanese Unexamined Patent Application, First Publication No. Sho 63-206994) is proposed. With this related art, a structure being disclosed which, just like a conventional pseudo-SRAM, is arranged so as to control refresh from the outside, a structure is also shown which, while incorporating the structure of this pseudo-SRAM, also incorporates further improvements.

With the former structure, an address transition detect signal is generated upon receipt of the fact that an output enable signal has become valid, refresh is performed according to a refresh address which has been generated interior to the pseudo-SRAM, the address transition detect signal is generated for a second time when the output enable signal has become invalid, and refresh is also performed for an external address which is supplied from the outside of the pseudo-SRAM. However, if the output enable signal is generated periodically for each refresh interval, the latter refresh whose object is the external address is not really necessary, and a useless and undesirable waste of electrical power takes place, insofar as refresh is performed for the external address.

On the other hand, with the latter structure, change of the external address is detected and an address transition detect signal is generated, and refresh is performed for a refresh address which has been generated internally to the pseudo-SRAM in response to this address transition detect signal, and after a fixed time period has elapsed thereafter, it is arranged to generate the address transition detect signal for a second time, and normal reading or writing is performed by taking the external address as an object. However, if reading or writing is performed for a second time after refresh is performed, the same undesirable problem arises as was pointed out with regard to the first related art.

Furthermore, with this type of structure, a problem arises when skew has appeared in the external address. That is to say, when skew is present in the external address, a plurality of address transition detect signals are generated due thereto. Due to this, although the initiation of a refresh by the initial address transition detect signal is acceptable, the normal access to the external address, which really should be performed after the refresh has been completed, is initiated by the second and subsequent address transition detect signals. In other words, in this case, the access request to the external address is undesirably performed, irrespective of whether or not refresh is taking place; and this causes the type of problem described below.

The memory cells of a DRAM are generally of the destructive read type, in which, when some word line is activated and reading is performed by the sense amplifier, it is necessary to write the data which was originally stored in all of the memory cells which are connected to this word line back into these memory cells from the sense amplifier. However, if reading or writing has been initiated during refresh as described above, a plurality of word lines are activated at the same time. If this is done, the data of the memory cells which are connected to these word lines comes to be simultaneously reading upon the same one bit line, so that the electrical potential upon the bit line which is generated in correspondence to the data of the memory cells which should be refreshed is no longer correct. Accordingly, when the electrical potential upon this bit line is amplified and write back (refresh) into the memory cells is performed, the data in the memory cells is destroyed.

Next, as a third related art, the semiconductor memory devices which have been disclosed in Japanese Unexamined Patent Application, First Publication No. Sho 61-5495 and in Japanese Unexamined Patent Application, First Publication No. Sho 62-188096 are proposed. The former semiconductor memory device is internally provided with a refresh timer for timing the refresh interval; a refresh start request is generated when a time period equivalent to the refresh interval has elapsed, and, after the amplification upon the bit line pair during the read operation has been completed, the word line is activated and refresh is performed for the refresh address. By doing this, it is possible to manage without controlling the refresh of the memory cell from the exterior of the semiconductor memory device.

Furthermore, the latter semiconductor memory device is one in which the detailed structure of an operation timing control circuit for implementing the former semiconductor memory device is disclosed in concrete terms, and basically it is the same as the former semiconductor memory device. It should be understood that in the third related art, just as with the first related art and the second related art, it is also disclosed to perform reading or writing after performing refresh. In addition, as a fourth related art which resembles the third related art, there has been proposed the semiconductor memory device which is disclosed in Japanese Unexamined Patent Application, First Publication No. Hei 6-36557. This semiconductor memory device, as well, is equipped internally with a timer for refresh, and it is arranged that a refresh start request is generated when a predetermined refresh time period has elapsed, and the refresh is performed after the reading has been completed.

However, as is disclosed in the third related art, a problem occurs as previously pointed out when the reading or the writing is performed after performing the refresh. Of course, with this third related art or fourth related art, it is also disclosed to perform the refresh after performing the reading or the writing. If this structure is adopted, the problem does not arise, as with the first related art or the second related art, that the address access time period $T_{AA}$ becomes great. However, with the third related art or the fourth related art, the question as to at what timing the write enable signal which determines the write timing is provided is not taken into account at all, and there is a possibility that the following type of problem may occur.

That is to say, if a pseudo-SRAM is operated with the same specification as a general-purpose SRAM, the write enable signal and the write data come to be supplied asynchronously with respect to change of the address. Due to this, it is not possible actually to start the write operation into the memory cell until the write enable signal and the write data are both determined, even if the write address is determined. In other words, until the write enable signal and the write data are determined, there is an undesirable empty time period in which no operation can be performed, and only when these are determined do the writing and the refresh come to be performed in sequence. Due to this, when compared with a structure in which the writing is performed after the refresh, as with the first related art or the second related art, there is the defect that the memory cycle becomes longer by the empty time period.

Here, with a pseudo-SRAM like the first related art through the fourth related art, generally the write operation is performed as follows. That is to say, activation of the word line and selection of the memory cell is continued during the write period, and the write operation to the memory cell is started from the time point that the write enable signal is made valid asynchronously, and the write data is actually written in to the memory cell while a predetermined time period (hereinafter termed the time period $T_{DW}$) elapses from the timing at which this write data is determined. After this the write enable signal is made invalid, and thenceforward, until again a predetermined time period (hereinafter termed the recovery time period $T_{WR}$) elapses, it is arranged for pre-charging of the bit line for subsequent access to be performed.

With a general-purpose SRAM a recovery time period $T_{WR}$ like the one described above is actually useless, but with a pseudo-SRAM it is not possible for the recovery time period $T_{WR}$ to be brought to zero, since it is necessary to pre-charge the bit lines just like a DRAM, because DRAM memory cells are employed. In this manner, with a pseudo-SRAM, it is necessary to guarantee the provision of the recovery time period $T_{WR}$, and there is the fault that the start timing of operation for the next address is delayed, as compared with a general-purpose SRAM. Accordingly, although it is desirable to shorten the above described empty time period or recovery time period $T_{WR}$, there is a problem with regard to implementing this with a structure like the first related art through the fourth related art.

Furthermore, there is also the following problem with a conventional pseudo-DRAM. That is to say, with a general-purpose SRAM or the like, it is often the case that a standby mode is provided in which the power source supply to the internal circuitry is stopped and the power consumption is extremely low. However, since with a pseudo-SRAM the memory cells themselves are the same as those in a DRAM, refresh is always necessary in order to preserve the data which is being stored in the memory cells. Due to this, with a conventional pseudo-SRAM, while it may be that the operation is the same as that for an SRAM, no standby mode such as that employed with a general purpose SRAM is particularly provided.

However, for operating with the same specification as an SRAM, and from the aspect of convenience of use as well, it is desirable to provide a low power consumption mode which is the same as the standby mode of a general-purpose SRAM. Furthermore, since it is anticipated that pseudo-SRAMs from now on will be put to various applications, it is also considered to be extremely beneficial to provide an individually characteristic pseudo-SRAM standby mode which is not present with a conventional SRAM or the like.

DISCLOSURE OF INVENTION

The present invention has been conceived in consideration of the above described points, and its objective is to provide a semiconductor memory device which suffers no influence such as the normal reading and write access being delayed due to refresh, with which no inconvenience such as access delay or destruction of the contents of memory cells occurs even in circumstances such as skew being present in the address, with which it is possible to shorten the entire memory cycle by reducing the write time period, and which is operated according to the specification of a general-purpose SRAM and is of enhanced capacity, and whose chip size is small and whose power consumption is low, and which moreover is of low cost. Furthermore, an objective of the present invention is to propose a semiconductor memory device which has a standby mode which is the same as that employed with a general-purpose SRAM, and a unique low power consumption mode which cannot be seen with a conventional semiconductor memory device.

The semiconductor memory device according to the first aspect of the present invention comprises: a memory cell array comprising memory cells which require refresh; an access circuit which performs refresh of the memory cell array after reading or writing for an access address has been performed for the memory cell array; and a control circuit which, after a memory cycle in which a write request and write data presented asynchronously for the access address is input, makes the access circuit perform late writing using the access address and the write data provided in the memory cycle. In other words, with this semiconductor memory device, for writing, late writing is employed which writing is performed after the memory cycle in which the write request was input. Due to this, both of the access address and the write data are determined when late writing is performed, so that it is possible, by using them, to start writing to the memory cell array immediately. Accordingly, no longer does an empty time period occur in the memory cycle because the write data is not determined, as in the related art, and it is possible to shorten the memory cycle. Furthermore, it is possible to perform the operations of writing and refresh, and the operation of taking in the access address and the write data, in parallel. Accordingly, it is not necessary to ensure any recovery time period after writing to the memory cell array as in the related art, so that it is possible to shorten the memory cycle.

With the semiconductor memory device according to the above described first aspect, in a memory cycle in which a next write request for the preceding write request is presented, the control circuit may perform writing corresponding to the preceding write request by late writing. Furthermore, the control circuit may detect that a chip is in the non selected state or the deactivated state, and performs the late writing during the non selected state or the deactivated state. By doing this, it no longer happens that a read request or a new write request is presented while late writing is being performed. Because of this the inconvenience does not occur of a read request or a new write request arriving while late writing is being performed, so that the start of operation with regard to these requests is delayed until the late writing is completed.

The semiconductor memory device according to the second aspect of the present invention is the semiconductor memory device of the above described first aspect, further comprising: an address transition detect circuit which detects whether a chip has transited from the non selected state to the selected state, or that the access address has changed, and wherein the control circuit starts the reading or the writing after a skew period has elapsed which is set greater than or equal to the maximum value of a skew included at least one of a chip select signal which controls the selected state or non selected state, and the access address, taking the time of detection as a reference, Furthermore, the semiconductor memory device according to the third aspect of the present invention comprises: a memory cell array comprising memory cells which require refresh; an access circuit which performs refresh of the memory cell array after performing reading of the memory cell array for an access address or writing of the memory cell array for the access address based on a write request and write data presented asynchronously for the access address; an address transition detect circuit which detects whether a chip has transited from the non selected state to the selected state, or that the access address has changed; and a control circuit which starts the reading or the writing after a skew period has elapsed which is set greater than or equal to the maximum value of a skew included at least one of a chip select signal which controls the selected or non selected state, and the access address, taking the time of detection as a reference.

According to the semiconductor memory devices according to the above described second and third aspects, it is possible to start the reading or the writing after the skew period has elapsed from when the chip select signal or the access address has changed. Accordingly, it is possible to start the operation for reading or writing immediately when the access address has been determined, so that it is possible to increase the speed of access for reading or writing.

With the semiconductor memory devices according to the above described second and third aspects, the control circuit may set the completion timing of the skew period after the time at which it is determined whether the write request is presented, and may determine within the skew period whether a write request has been presented. By doing this, no longer do the inconveniences occur, as in the related art, that the start of a write operation is delayed and a dummy read operation is started, and the dummy reading is interrupted by the write operation so that the memory cells are destroyed, or that the memory cycle is made longer by the start of a write operation being delayed until a dummy reading is completed.

The semiconductor memory device according to the fourth aspect of the present invention comprises: a memory cell array comprising memory cells which require refresh; an access circuit which performs refresh of the memory cell array after performing reading or writing of the memory cell array for the access address in the same memory cycle; an address transition detect circuit which detects whether a chip has transited from the non selected state to the selected state, or that the access address has changed; and a control circuit which sets a completion timing for a skew period having a length greater than or equal to the maximum value of a skew included at least one of a chip select signal which controls the selected state or non selected state, and the access address, taking the time of detection as a reference, after a write request and write data presented asynchronously for the access address are determined. In this manner, by determining both the write request and the write data for performing writing within the skew period, writing or reading and refresh are performed within the same memory cycle that the write request arrived. Accordingly it is no longer necessary to perform late writing as with the semiconductor memory device according to the first aspect, and it is possible to reduce the scale of the circuit structure and to simplify it by the amount which is gained by not providing the structure which is necessary for late write control.

And, with the semiconductor memory devices according to the above described second through fourth aspects, it is arranged to access the memory cells after the skew period has elapsed from the change of access address. Due to this, it becomes unnecessary to change the chip enable signal or the like every time the address is taken in, as with an existing pseudo-SRAM, so that it is possible to reduce the power consumption to that extent.

With the semiconductor memory devices according to the above described second through fourth aspects, if writing, reading, or refresh which was started in a memory cycle preceding to the current memory cycle in which a read request or a write request occurred has not been completed by the completion timing of a skew period for the current memory cycle, the control circuit delays the start of writing or reading in the current memory cycle until the writing, reading, or refresh has been completed. In other words, if the writing, reading, or refresh which has been started in the previous memory cycle has not been completed by the end of the skew period of the current memory cycle, then it will be acceptable to delay the start of writing or reading of the current memory cycle until these operations are completed. By doing this, it never happens that the writing, reading, or refresh compete mutually with one another even if writing or reading and the refresh following it are not completed within one memory cycle. Accordingly, it becomes possible to anticipate a shortening of the cycle time and an increase in speed of the semiconductor memory device.

With the semiconductor memory devices according to the above described first through fourth aspects, the access circuit may perform reading or late writing simultaneously for a plurality of addresses in the memory cell array, and the control circuit may perform the operation of sequentially outputting to the outside read data which have been obtained by the reading, or the operation of sequentially taking in write data which are input from the outside for the next late writing, in parallel with the refresh. By doing this it is possible to shorten the cycle time, since the refresh period has become invisible when seen from the outside of the semiconductor memory device. In this case, the control circuit may detect a change of predetermined upper bits in the access address, and, when performing the reading or the late writing, successively outputs the read data or successively takes in the write data for a plurality of addresses for which the predetermined upper bits in the access address are the same, while varying the lower address in the access address which is made up from the bits other than the predetermined upper bits.

By doing this, it becomes possible to implement the same functions as the page mode or the burst mode which are employed with a general-purpose DRAM or the like. Furthermore, in this case, the control circuit may successively output the read data or successively take in the write data according to the lower address supplied from the outside. By doing this, it is possible to perform input and output of data while randomly changing the lower address, as with the page mode. Furthermore, in this case, the control circuit may successively output the read data or successively take in the write data while varying the lower address according to a predetermined order based upon an initial value of the lower address supplied from the outside. By doing this, it becomes sufficient to supply only the start address for burst operation to the semiconductor memory device, and it is possible to simplify the structure of the controller or the like which is provided external to the semiconductor memory device.

With the semiconductor memory devices according to the above described first through fourth aspects, there may be further comprised: a refresh control circuit comprising circuitry within the access circuit and the control circuit which performs control of the refresh, and a refresh address generation circuit which generates a refresh address showing memory cells to be refreshed, and which updates the refresh address each time the refresh is performed; a voltage generation circuit which generates voltages supplied to parts within the device; and a mode switching circuit which switches to one of a first mode in which power source is supplied both to the refresh control circuit and to the voltage generation circuit, a second mode in which supply of power source to the refresh control circuit is stopped while power source is supplied to the voltage generation circuit, and a third mode in which supply of power source both to the refresh control circuit and to the voltage generation circuit is stopped, and which controls whether supply of power source is performed to the refresh control circuit and the voltage generation circuit according to the switched mode. Due to this, it is possible finely to control from outside whether it is necessary to keep the data in the standby state, the time period to return to the active state, the amount of consumption of current, and so on, in correspondence to the equipment to which the device is applied and its environment of use and the like. In other words since, in the first mode, power source is supplied to the circuits which are required for refresh, thereby, along with being able to keep the data in the memory cells, it is possible to make the time period until transition from the standby state to the active state to be of the minimum length among the three types of mode. Furthermore, in the second mode, it is possible to reduce the consumption of current lower than in the first mode by the amount which was required to be supplied to the refresh control circuit, also, in the event of transition to the active state from the standby state, and it is possible to use the semiconductor memory device immediately in the same manner as with the first mode, just by initializing the data of the memory cells when transition from the standby state to the active state is performed. Moreover, in the third mode, it is possible to make the current consumption the minimum among the three types of mode. In this case, the mode switching circuit may perform switching of mode by detecting that writing of predetermined data in each mode has been performed for a predetermined address. By doing this it becomes unnecessary to provide a dedicated signal from outside of the semiconductor memory device for switching of standby mode, and furthermore the provision of a pin upon the semiconductor memory device for this type of dedicated signal becomes unnecessary.

The semiconductor memory device according to the fifth aspect of the present invention comprises: a memory cell array comprising memory cells which require refresh; an access circuit which performs refresh of the memory cell array accompanying a write cycle for an access address, and performs refresh of the memory cell array spontaneously after a predetermined time period has elapsed from performing the refresh which accompanies the write cycle; and a control circuit which, after a memory cycle in which a write request and write data presented asynchronously for the access address is input, makes the access circuit performing late writing using the access address and the write data which is provided in the memory cycle.

And, with the semiconductor memory device according to any of the aspects of the present invention, it is possible to anticipate an increase of the speed of access, as compared with the case in which reading or writing is performed after having performed the refresh, since the refresh is performed after the reading or the writing has been performed. In addition to this, with the present invention, it becomes no longer necessary to divide the address into two portions to take it in according to a RAS/CAS timing signal as with a general-purpose DRAM, since it is acceptable to provide the access address all at once, and thus it is possible to simplify the circuit structure for generating the signal waveform which must be input to the semiconductor memory device. Furthermore, since the refresh is performed in a single memory cycle in accompaniment with access from the outside of the semiconductor memory device, if the access requests are present which are necessary for refreshing all the memory cells, then it is possible to continue maintaining the data of the memory cells without performing refresh control from the outside of the semiconductor memory device, and the operation is easy, just as with a general-purpose SRAM. Furthermore, if as with a DRAM a single transistor and a single capacitor are used as components for the memory cell, then, along with a great increase in capacity, it is possible to anticipate a reduction of chip size and a minimization of cost, since it is possible considerably to reduce the cell area in comparison with a general-purpose SRAM which requires six transistors per memory cell.

BEST MODE FOR CARRYING OUT THE INVENTION

Figure 1:
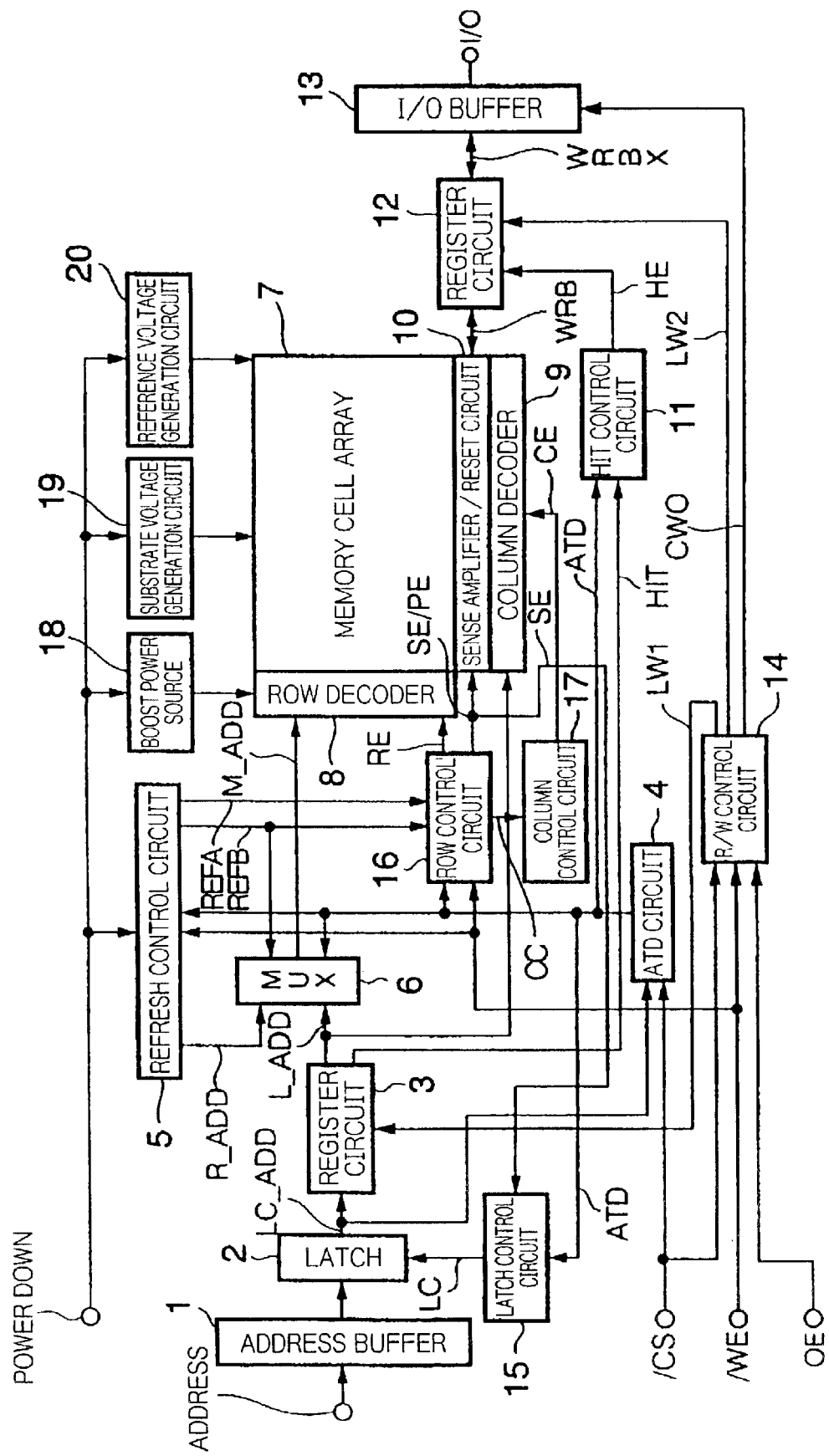
FIG. 1 is a block diagram showing the structure of a semiconductor memory device according to the first embodiment of the present invention.

In the following, embodiments of the present invention will be explained with reference to the drawings.

[The First Embodiment]

<Summary>

First, a summary explanation of this embodiment will be provided. As in the above-described first through third related arts, the address access time period $T_{AA}$ undesirably increases when, after performing refresh, reading or writing is performed in correspondence to an access request from the outside. Due to this fact, with this embodiment, if an access request from the outside has arrived, refresh is performed after the reading or the writing which corresponds to this access request. However, with this feature alone, inconveniences like those indicated with respect to the third related art and the fourth related art undesirably occur. Thus, with this embodiment, late writing is performed in order to write into the memory cells, and a shortening of the write time period and the memory cycle is anticipated.

In other words, in a memory cycle in which a write request has been supplied from the outside, only the operation of taking the write address and the write data which have been supplied into the interior of the semiconductor memory device is performed, and this write address and write data are kept internally until a next write request arrives. The actual write operation into the memory cell is not performed in said memory cycle, but it is performed in the memory cycle in which next a write request is input. In other words, the delaying of the write operation for a memory cell until a memory cycle in which a next write request arrives constitutes the late write operation.

Since with late writing the write address and the write data which were provided at the time of the immediately preceding write request are taken in, therefore the values of both of the write address and the write data are determined when the next write request is done and the writing to the memory cell is actually performed. Due to this, it is possible to start the write operation into the memory cell which corresponds to the directly preceding write request just by making the write enable signal valid, and it does not happen that an empty time period is created in the memory cycle because the write enable signal and/or the write data are not determined, as was the case with the above described related art.

To put it in another manner, when a write request is received from the outside, the operation of taking in the write address and the write data related to said write request, and the write operation to the memory cell which corresponds to the directly preceding write request and the following refresh operation, are performed in parallel. In this embodiment, the taking in of the write data, the writing to the memory cell, and the pre-charge of the bit line are not completed by being performed serially as in the related art, but rather it is possible to shorten the memory cycle by the time period in which parallel operation is performed. Furthermore, since the write data which is presented in accompaniment with the write request is used when the next write request is received, therefore it will be sufficient for the write data to be determined and to be taken in internally by the time the refresh operation has completed. Accordingly, it does not happen that the write time period becomes greater or less according to when the write data is determined, as in the related art, so that it is possible to make the write time period constant.

Thus, in this embodiment, as a specification for when the semiconductor memory device is seen from the exterior, the condition is imposed that, when a write request is performed, the write enable signal should be made valid during the address skew period. By the term "address skew period" here is meant from a basis time point to the time point when a time period equivalent to the skew possessed by the address has elapsed, with the time point at which any of the bits of the access address has first changed being taken as said basis time point (if the chip select signal has changed from the invalid state to the valid state, the treatment is the same, and the same in the following explanation). To put it in another way, the address skew period is equal to the period from when the access address starts to change until its value is determined for the entire address.

Normally, a CPU (central processing device) or the like which accesses the semiconductor memory device is designed so as to transmit each bit of the access address to the system bus at almost the same timing. However, in reality, the output timing of the access address at the output pins of the CPU differs slightly for each bit. In addition to this, the length of the wiring pattern upon the system bus which extends from the CPU to the semiconductor memory device and the way in which it is arranged is different for each bit of the address, and in practice it is an impossibility to make them exactly equal. Due to these facts, the times at which the respective bits of the address arrive at the input pins of the semiconductor memory device deviates for each bit, and this constitutes the skew.

The fact that the above described type of condition is imposed in this embodiment is due to the following type of reason. That is to say, in the specification of a general-purpose SRAM, the write enable signal and the write data are presented asynchronously with respect to the address change, and the fact that the access from the outside is a write request is first ascertained when the write enable signal has become valid. However it is not possible to predict in advance when the write enable signal and the write data will be determined, and besides, in order to obtain the read data as quickly as possible, it is considered to be desirable to start the read operation immediately from when the address skew period has elapsed and the address has been determined. Accordingly, during the interval from when the address changes to when the write enable signal or the write data becomes valid, it is necessary to perform operation by assuming that the access from the outside is a read request.

However, even if the access request from the outside is not actually reading but is writing, with a structure which uses a DRAM memory cell as in this embodiment, until the read operation which has already been started (which in this case becomes a dummy reading) is completed, it cannot be interrupted. That is to say, this is because, if transition to write operation is performed by interrupting the read operation without performing the rewrite operation again, then the data of the memory cells which are connected to the word line whose reading was partway performed is completely destroyed, since as has been described above a DRAM memory cell senses the data by destructive reading.

Here, the fact that writing has not been performed for all of the memory cells which have been read out does not mean that it is acceptable to interrupt the read operation. Moreover, if late writing is performed as with this embodiment, it is normal for the dummy read address (in other words, the write address which was presented in said memory cycle) and the late write address (in other words, the write address which was presented in the memory cycle of the directly preceding write request) not to agree with one another, and because of this point alone it is not possible to interrupt the read operation.

As described above, unless the write enable signal is input during the address skew period, then the start of the write operation comes to be delayed until the dummy read operation is completed. If the dummy reading and the writing and the refresh following these are performed within the period of a single memory cycle which is determined in advance, it is considered that probably no particular problem will occur. However, as long as the write enable signal becomes valid asynchronously, this type of condition is not always satisfied, it is not possible perfectly to eliminate the possibility of collision between the dummy reading and the write request from the outside, and of undesirable delay to the writing and the refresh.

Furthermore another problem is that, when a dummy read operation is generated, a single memory cycle is extended to [dummy read time period+write time period+refresh time period]. As with the above, if the write enable signal becomes valid at a timing later than the address skew period, the memory cycle becomes undesirably long. Accordingly, it is said to be desirable to specify that the write enable signal should be made valid within the address skew period.

<Structural Explanation>

FIG. 1 is a block diagram showing the structure of a semiconductor memory device according to this embodiment. In the same figure, the address "Address" is an access address which is supplied from the outside of the semiconductor memory device. The address "Address" includes a row address and a column address which correspond to the way in which a memory cell array which will be described hereinafter is arranged in rows and columns. An address buffer 1 buffers and outputs this address "Address".

A latch 2 outputs the address which is supplied from the address buffer 1 just as it is as an internal address LC_ADD while a latch control signal LC is at "L" level (in other words, during the time period from a falling edge of the latch control signal LC to its next rising edge). Furthermore, along with the latch 2 taking in the address which is supplied from the address buffer 1 at the rising edge of the latch control signal LC and maintaining it while the latch control signal LC is at "H" level, the maintained address is output as the internal address LC_ADD.

Next, a control signal LW1 which is supplied to the register circuit 3 and a control signal LW2 which will be described hereinafter are both signals for controlling late write operation. These control signals are both set to "H" level in the case of performing late writing, while if this is not the case then they are set to "L" level. The register circuit 3 internally stores a register (hereinafter termed the "address register") for keeping the access address of bit width the same as the address "Address".

And, if the control signal LW1 is at "L" level, then the register circuit 3 outputs the internal address LC_ADD which has been input as the internal address L_ADD just as it is. On the other hand, if the control signal LW1 is at "H" level, then the register circuit 3 outputs as the internal address L_ADD, not the internal address LC_ADD, but the address which is being kept in the address register. Furthermore, at the falling edge of the control signal LW1, the register circuit 3 takes the internal address LC_ADD for the next late writing to its internal register. Yet further, the register circuit 3 comprises a comparator which compares the internal address LC_ADD which has been input and the address which is kept by the address register together, and the comparator outputs a "H" level as a hit signal HIT if all the bits of these two agree, while if they disagree even by any single bit it outputs a "L" level.

As will be described below, this hit signal HIT is used in bypass operation for maintaining the data coherency for the semiconductor memory device as seen from the outside. With the late writing employed in this embodiment, the writing to the memory cell is actually performed in a memory cycle subsequent to the memory cycle in which the write request is input. In other words, in the memory cycle in which the write request is input, the write address and the write data are temporarily taken into an address register of the register circuit 3 and a data register of a register circuit 12 (to be described hereinafter). And next writing is performed to a memory cell array 7 (to be described hereinafter) based upon the address and the data which have been taken in the memory cycle in which the write request has been input.

Accordingly, if there is a read request for the address for which the write request has occurred until writing to the memory cell array 7 is being performed in reality, at this time point the data exists only in the register circuit 12 and has not yet been written into the memory cell array 7. Due to this, if reading from the memory cell array 7 is performed, the old data before the writing will come to be output to the exterior of the semiconductor memory device. To this end, in this type of case, the structure arranges for the output of the data to be performed from the register circuit 12, bypassing the memory cell array 7.

In order to detect the above type of situation, it is arranged to compare together the internal address LC_ADD and the address register within the register circuit 3, and to detect whether a read request has been input from outside for an address in the memory cell array 7 for which writing has not yet been performed. It should be understood that, although the register circuit 3 generates the hit signal HIT without distinguishing between reading and writing, nevertheless no particular problem occurs, since as will be described hereinafter the bypass operation only operates in the case of a read request.

Next, an ATD (Address Transition Detector; address change detector) circuit 4, if a chip select signal/CS is valid ("L" level), detects whether or not the internal address LC_ADD is changed. And if change is found in even one single bit of the internal address LC_ADD, the ATD circuit 4 generates a positive one shot pulse in the address transition detect signal ATD after a time period has elapsed which is equivalent to the address skew period from when this change has been detected.

In addition to this, in the case that the chip select signal/CS has become valid (transition "H" level→"L" level) as well, the ATD circuit 4 generates a positive one shot pulse in the address transition detect signal ATD, when a time period has elapsed equivalent to the address skew period from when the chip select signal/CS has changed. It should be understood that the chip select signal/CS is a selection signal which becomes valid when the semiconductor memory device shown in FIG. 1 is accessed. Furthermore, the symbol "/" prefixed to the head of the signal name means that this is a negative logic signal.

Here, to describe the chip select signal/CS in more detail, the chip select signal/CS is a signal for determining selection/non selection of the semiconductor memory device (chip), and, in particular, for a system which is made up from a plurality of semiconductor memory devices, it is a signal which is used for selecting the desired semiconductor memory device. Although in the explanation below the chip select signal is used as an activation signal which determines selection/non selection of the chip, the activation signal which can be used for the present invention is not one which is limited to the chip select signal; any type of signal will be acceptable, provided that it is a signal which has the same function. Due to this, the concept of using, for example, a chip enable signal instead of the chip select signal has been considered. However, among the so called chip enable signals, such as a chip enable signal for an existing pseudo-SRAM, there are ones which have an address latch timing control function in addition to the activation function of the chip. As described above, with an existing pseudo-SRAM, a chip enable signal for controlling the timing of address input is input each cycle like a clock signal, and due to this there arises a problem with increase of power consumption. By contrast to this, the semiconductor memory device of the present invention is distinguished, in one aspect, by the fact that it can operate even if a signal which becomes a trigger for internal operation like a clock signal is not input each cycle. Due to this fact, if with the present invention the chip enable signal is taken as the activation signal, a signal which has the activation function for the chip, and moreover does not have the function of address latch timing control comes to be supplied to the semiconductor memory device.

It should be understood that, internally to the ATD circuit 4, if each bit of the address changes, or the chip select signal/CS has become valid, corresponding pulses are generated, and a one shot pulse is generated by combining these pulses. Because of this there is no fear that a plurality of address transition detect signals may be generated as in the related art, even if skew is present in the address "Address". Due to this, it no longer happens that, so to speak, the data in the memory cell no longer is destroyed when writing for a plurality of memory cells is being performed or when reading is performed from a plurality of memory cells at the same time.

Furthermore, the address skew period also becomes long if the skew is great, and it is feared that the generation of the one shot pulse in the address transition detect signal ATD may be delayed, and the access time may become longer. However, in the specification of a general-purpose SRAM, the value given for the access time references the time point at which the address "Address" is determined. Due to this, it will be acceptable to guarantee the access time from the bit which has changed last among the bits of the address "Address", and no operational delay occurs even if access is commenced after the address skew period has elapsed.

Furthermore, according to the description of operation which will be provided hereinafter, the reading or writing for the address "Address" is commenced from when the one shot pulse of the address transition detect signal ATD has risen, and thereafter the refresh is commenced from when the one shot pulse has dropped. Due to this, the pulse width of the one shot pulse is set greater than or equal to the time period which is required for completion of the reading or the writing.

Furthermore, the length of the address skew period is made to agree with the maximum value of the skew which is present between each bit of the address "Address" and the chip select signal/CS; or it would be acceptable to ensure that it is set to a relatively large value greater than the maximum value of this skew, so as to allow some margin.

Here, since the skew originates due to reasons such as described above, the maximum value of the skew can be calculated in advance as an estimate and set based upon the overall characteristics of the system to which this semiconductor memory device is to be applied.

Accordingly it is possible to set the address skew period according to the system to which the semiconductor memory device is to be applied, by making the address skew period to be variable, or by making it to be possible to select an address skew period from among several values. Alternatively, it would also be acceptable to determine and set the address skew period to some certain fixed value, as a specification for the semiconductor memory device. In this case, it is necessary to perform design of the system to which the semiconductor memory device is to be fitted so as to keep the maximum value of the skew at the input pins of the semiconductor memory device within the above described fixed value.

Next, the refresh control circuit 5 internally contains an address counter (a refresh counter) and a refresh timer. By controlling the semiconductor memory device internal refresh by taking advantage of these and of the address transition detect signal ATD and a write enable signal/WE, the refresh control circuit 5 automatically generates a refresh address and a refresh timing within the semiconductor memory device, and implements the refresh in the same manner as self refresh for a general-purpose DRAM. Here, the address counter generates the refresh addresses R_ADD for refreshing the DRAM memory cells sequentially. It should be understood that the refresh address R_ADD has a bit width the same as the row address which is included in the address "Address".

Furthermore, the refresh timer measures the time period which has elapsed from when the last access request from externally to the semiconductor memory device has taken place, and initiates self refresh internally to the semiconductor memory device if this exceeds a predetermined refresh time period. For this, the refresh timer is made so as to be reset, and to resume time measurement, each time the address transition detect signal ATD becomes valid.

In addition to this, the refresh control circuit 5 generates refresh control signals REFA and REFB for controlling the refresh timing. It should be understood that the function and the timing of these refresh control signals will become clear from the explanation of the operation.

According to the levels of the address transition detect signal ATD and the refresh control signal REFB, a multiplexer 6 (MUX in the figure) selects a row address which is included in an internal address L_ADD if the address transition detect signal ATD is "H" level and moreover the refresh control signal REFB is at "H" level, and outputs it as an address M_ADD. On the other hand, if the address transition detect signal ATD is "L" level or the refresh control signal REFB is at "L" level, it selects a refresh address R_ADD and outputs it as the address M_ADD.

Next, the memory cell array 7 is a memory cell array just like a general-purpose DRAM, in which word lines run in the row direction and bit lines run in the column direction (or a pair of bit lines; and the same hereinafter), and it is structured with memory cells each made from one transistor and one capacitor, just like a DRAM, being disposed in rows and columns in positions at the intersections of the word lines and bit lines.

The row decoder 8 decodes the address M_ADD when the row enable signal RE is at "H" level, and activates the word line which is designated by this address M_ADD. It should be understood that, when the row enable signal RE is "L" level, the row decoder 8 does not activate any word line. The column decoder 9 decodes a column address which is included in the internal address L_ADD when the column enable signal CE is at "H" level, and generates a column select signal for selecting the bit line which is designated by this internal address L_ADD. It should be understood that, when the column enable signal CE is "L" level, the column decoder 9 does not generate any column select signal for any bit line.

The sense amplifier/reset circuit 10 is made up from sense amplifiers, column switches, and a pre-charge circuit which are omitted from the drawing. Among these, a column switch connects between a sense amplifier which is designated by the column select signal which is output by the column decoder 9 and a bus WRB. When the sense amplifier enable signal SE is "H" level, the sense amplifier senses and amplifies the electrical potential on the bit line connected to the memory cell which is specified by the address "Address", and outputs it to the bus WRB, or writes the write data supplied upon the bus WRB via the bit line to the memory cell. When a pre-charge enable signal PE is "H" level, the pre-charge circuit pre-charges the electrical potential of the bit line to a predetermined electrical potential (for example ½ of the power source electrical potential).

Next, the hit control circuit 11 and the register circuit 12 implement late write operation along with the above described register circuit 3. Among these, the hit control circuit 11 takes in the hit signal HIT upon the rising edge of the address transition detect signal ATD, and transmits this signal to the register circuit 12 as the hit enable signal HE. Since the value of the address "Address" is not determined within the address skew period, the hit control circuit 11 takes in the hit signal HIT when the address "Address" is determined. It should be understood that, although the hit enable signal HE is only used in the case of read operation, its control is performed by the register circuit 12, and the hit control circuit 11 generates the hit enable signal HE irrespective of whether or not the access request is writing or reading.

Next, the register circuit 12 internally stores a register (hereinafter termed the "data register", as previously mentioned) of bit width the same as that of the data which is transferred upon the bus WRB. And, upon triggering by the falling edge of the control signal LW2, the register circuit 12 takes into the data register the write data which is supplied upon the bus WRBX from externally via bus I/O and an I/O buffer 13 (to be described hereinafter). In other words, if a write request has occurred, it takes in the write data which has been provided in said memory cycle and temporarily stores it in the data register, and, in a memory cycle for which a next write request occurs, the write data which has been taken in and stored comes to be written into the memory cell array 7.

Furthermore, if the control signal LW2 is "H" level, the register circuit 12 outputs upon the bus WRB from the data register the write data which was presented upon the write request directly before. On the other hand, if the control signal LW2 is "L" level, the register circuit 12 performs different operation according to the level of the hit enable signal HE. That is to say, if the hit enable signal HE is at "L" level which indicates a miss-hit, then the register circuit 12 outputs upon the bus WRBX the data which was read out upon the bus WRB just as it is. By contrast, if the hit enable signal HE is at "H" level which indicates a hit, then the register circuit 12 transmits upon the bus WRBX from the data register the write data which has not yet been written in to the memory cell array 7. In this case, the data of the memory cell array 7 which is read out upon the bus WRB via the sense amplifier/reset circuit 10 is not used.

Depending on the level of a control signal CWO, if the control signal CWO is "H" level, the I/O (input/output) buffer 13 buffers the read data upon the bus WRBX with an output buffer, and outputs it to the exterior of the semiconductor memory device from the bus I/O. Furthermore, if the control signal CWO is "L" level, with the output buffer in floating state, the I/O buffer 13 buffers the write data which is supplied on the bus I/O from the exterior of the semiconductor memory device with the input buffer, and transmits it upon the bus WRBX. In other words, if the control signal CWO is "H" level it is reading, while if it is "L" level it is writing.

Next, a R/W (Read/Write) control circuit 14 generates the control signal CWO and the control signals LW1 and LW2, based upon the chip select signal/CS, the write enable signal/WE, and an output enable signal OE. It should be understood that the switching timings of these control signals will be made clear during the explanation of operation. In this connection although late writing is performed in the interior of the semiconductor memory device of this embodiment, in the specification as viewed from the exterior of the semiconductor memory device, the writing (input) starts at the falling edge of the write enable signal/WE, and the data is determined and the writing (input) is completed at the rising edge of the write enable signal/WE.

Next, a latch control circuit 15 generates the latch control signal LC described above which determines the latch timing of the address "Address", based upon the address transition detect signal ATD and the sense amplifier enable signal SE. That is, the latch control signal LC goes to "H" level during the period from the rising edge of the address transition detect signal ATD until the falling edge of the sense amplifier enable signal SE generated during refresh operation (in other words, when the address transition detect signal ATD is "L" level). Due to this, the latch 2 continues to keep the value of the internal address LC_ADD during the period until the latch control signal LC falls, even if the address "Address" changes after the rising edge of the address transition detect signal ATD.

The row control circuit 16 generates the row enable signal RE, the sense amplifier enable signal SE, a pre-charge enable signal PE, and a control signal CC based upon a refresh control signal REFA, a refresh control signal REFB, the address transition detect signal ATD, and the write enable signal/WE. Furthermore, the column control circuit 17 generates the column enable signal CE based upon this control signal CC.

To describe this in more detail, during the reading and the writing, upon trigger by the rising edge of a one shot pulse of the address transition detect signal ATD, the row control circuit 16 generates a positive one shot pulse in the row enable signal RE. Furthermore, if the refresh control signal REFA is "H" level, upon trigger by the falling edge of the one shot pulse of the address transition detect signal ATD, the row control circuit 16 generates a positive one shot pulse which is necessary for refresh operation in the row enable signal RE. Furthermore, the row control circuit 16 outputs as the row enable signal RE a positive one shot pulse which has been obtained by inverting a negative one shot pulse which is supplied in the refresh control signal REFB.

Furthermore, the row control circuit 16 generates a positive one shot pulse in the sense amplifier signal SE by delaying the row enable signal RE, and also generates a positive one shot pulse in the pre-charge enable signal PE upon trigger by the falling edge of the one shot pulse which is generated in the row enable signal RE. It should be understood that this sense amplifier enable signal SE and this pre-charge enable signal PE are generated irrespective of the state of normal writing and reading, and the state of refresh. In addition to this, the row control circuit 16 outputs the control signal CC by delaying the row enable signal RE.

Since this control signal CC is not generated in the case of refresh, the column enable signal CE which is generated from the control signal CC is also only generated in the case of normal writing and reading, and is not generated in the case of refresh. Next, the column control circuit 17 delays the control signal CC, and outputs it as the column enable signal CE. It should be understood that, since the width of the one shot pulse of the row enable signal RE determines the time periods over which each of the late writing, reading, and refresh are performed, a pulse width necessary and sufficient for these operations is set.

Moreover, the refresh control signal REFA is a signal for controlling whether or not refresh is performed along with access requests from exterior to the semiconductor memory device. In other words, if the same signal is "H" level, a one shot pulse in the row enable signal RE is generated upon the falling edge of the address transition detect signal ATD generated by said access request, and refresh is initiated. By contrast to this, if the same signal is "L" level, no one shot pulse is generated in the row enable signal RE, even if a one shot pulse is generated in the address transition detect signal ATD.

Here, in this embodiment, the explanation will assume the following realization aspects as a refresh operation as trigger for the generation of the address transition detect signal ATD. That is, in this embodiment, if the refresh operation which accompanies reading or writing is continuous, all of the memory cells are refreshed by continuously performing these refreshes in each of these memory cycles. And, when all the memory cells have been refreshed, the state is attained at which temporarily no refresh is generated. Thereafter, when the limit state (the cell hold limit) at which the data of the memory cells can be kept is approached, this is detected, and the device again transits to the state in which refresh is repeatedly performed over successive memory cycles.

As main causes for the falling edge of the refresh control signal REFA, there are the circumstance that one refresh cycle has been completed due to refresh accompanying an access request from the outside and it is not yet time for initiation of the refresh for the next cycle, or the circumstance that, because self refresh was initiated, until this was completed it has become no longer necessary to perform refreshes in accompaniment with access requests from the outside.

Here, to generate the refresh control signal REFA, an example of a structure have been considered in which a latch circuit is provided in the interior of the refresh control circuit 5 which holds the refresh control signal REFA, and setting and resetting of this latch circuit are controlled by the output signal of the refresh timer and the address transition detect signal ATD. In concrete terms, a timing a little before refresh operation becomes necessary (cell hold limit) is generated by the refresh timer, and, based upon its output signal, a set signal for the latch circuit in the refresh control circuit 5 is generated and the latch circuit is set, and "H" level is output in the refresh control signal REFA. It should be understood that the timing at which the set signal is generated to be determined by setting a maximum value of the cycle time as a standard. After this, the row control circuit 16 proceeds refresh operation for the memory cells in word line units, upon triggering by the address transition detect signal ATD or by the refresh control signal REFB which is generated based upon the refresh control signal REFA. And, when refresh operation for all of the memory cells has been performed, a reset signal for the latch circuit in the refresh control circuit 5 is generated and the latch circuit is reset, and "L" level is output as the refresh control signal REFA.

It should be noted that it would also be acceptable to perform resetting of the latch circuit to agree with the time at which the refresh operation is concluded in the refresh cycle which refreshes the last word line. Alternatively, it would also be acceptable to arrange for the row control circuit 16 to generate a refresh operation completion signal when the refresh operation has been completed, and to arrange to reset the latch circuit when the refresh control circuit 5 has received this refresh operation completion signal in the refresh cycle corresponding to the last word line.

However, in consideration of the circumstances of FIG. 4 which will be described hereinafter, if neither the address transition detect signal ATD is generated (refer to FIG. 5) nor the write enable signal/WE is input during the time period from the time of the rising edge of the refresh control signal REFA until when the refresh which is initially performed after this rising edge is completed, then the latch circuit is reset after this initial refresh has been completed.

On the other hand, the refresh control signal REFB is a signal for self refresh. By supplying a negative one shot pulse in the refresh control signal REFB, it is possible to generate a one shot pulse forcibly to the row enable signal RE and to initiate refresh.

Here, in generating the refresh control signal REFB, a structure or the like has been considered in which there are provided, internally to the refresh control circuit 5, a delay circuit which delays the refresh control signal REFA and a pulse generation circuit which generates a negative one shot pulse, and in which the timing at which the negative one shot pulse from the pulse generation circuit is generated is controlled by the refresh control signal REFA which has been delayed by the delay circuit and by the address transition detect signal ATD.

Normally, the refresh control signal REFB is at "H" level. If in this state the refresh control signal REFA rises and reaches "H" level, then the rising edge of this refresh control signal REFA is delayed for a predetermined time period by the delay circuit, and, when during this delay the address transition detect signal ATD has not been generated, the pulse generation circuit is activated by the rising edge of the refresh control signal REFA which has been delayed, and a negative one shot pulse in the refresh control signal REFB is output. The delay by the above described predetermined time period is for measuring until the limit time period which is required in the refresh of the memory cell(s) elapses, since the trigger which generates the address transition detect signal ATD is not supplied from the outside.

It should be understood that the present invention is not to be considered as being limited to the embodiment for refresh operation described above; for example, it would also be acceptable to arrange matters so as to refresh the memory cells for each word line at a constant period. In this case, although it is acceptable for the circuit structure for generating the refresh control signal REFB to be the same as the one described above, the circuit structure for generating the refresh control signal REFA becomes, for example, as follows.

First, the refresh timer generates a trigger signal for initiating the refresh at a fixed period. Next, in the same way as in the above described circumstances, a latch circuit is provided internally to the refresh control circuit 5, and, based upon the trigger signal output by the refresh timer, the latch circuit is set by the set signal which is generated at a timing slightly before the refresh operation becomes necessary, and the refresh control signal REFA is brought to "H" level. It should be understood that, in this case as well, the timing at which the latch circuit is set is determined by setting a maximum value of the cycle time as a standard.

After this, the refresh control circuit 5 resets the latch circuit by the reset signal which has been generated, and brings the refresh control signal REFA to "L" level, matching the timing at which the row control circuit 16 which has received the address transition detect signal ATD or the refresh control signal REFB completes the refresh operation for the memory cells. It should be understood that it would also be acceptable to perform the resetting of the latch circuit in this case at a timing delayed by a fixed time period from when the latch circuit was set. Alternatively, it would also be acceptable to arrange for the row control circuit 16 to generate a refresh operation completed signal when refresh operation was completed, and to reset the latch circuit when the refresh control circuit 5 received this refresh operation completion signal.

In this connection, in this embodiment, the refresh control signal REFA drops each memory cycle when the refresh operation is completed upon triggering by the address transition detect signal ATD, It should be understood that the directly previous writing does not exist in the case that the initial write request from when the semiconductor memory device is activated is supplied. Accordingly, in the memory cycle in which said write request has taken place, only the input of the write address and of the write data is performed, and late write to the memory cell array 7 is not performed. In order to implement this, a flag is provided internally to the row control circuit 16, and it is arranged to show with this flag whether or not the write enable signal/WE has even once become valid during the valid state of the chip select signal/CS.

In order to do this, the row control circuit 16 initializes the flag to OFF when the semiconductor memory device is activated, and sets the flag to ON when the initial write request has been performed. Furthermore, if a write request has occurred (the write enable signal/WE is "L" level and moreover the chip select signal/CS is" level), the row control circuit 16 generates a one shot pulse in the row enable signal RE only if the flag is ON. By doing this, the row control circuit 16 and the column control circuit 17 generate the control signal CC, the sense amplifier enable signal SE, the column enable signal CE, and the pre-charge enable signal PE which are necessary for the writing.

Next, a boost power source 18 is a power source which supplies a boost electrical potential which is applied to the word lines in the memory cell array 7 to the row decoder 8. Furthermore, a substrate voltage generation circuit 19 is a circuit which generates a substrate voltage which is applied to the well or the substrate upon which the memory cells of the memory cell array 7 are formed. Yet further, a reference voltage generation circuit 20 generates a reference voltage (for example ½ of the power source electrical potential=½ Vcc) which is used by the memory cell array 7, the sense amplifier, the pre-charge circuit, and the equalize circuit within the sense amplifier/reset circuit 10. The uses of this reference voltage are mainly of the following three types (1~3, but at the present the method of use 3 in which no dummy cells are provided is the most widespread.

① A reference voltage (½ Vcc) which is applied to the opposing electrodes of the capacitors which make up the memory cells.

② If dummy cells are provided, a reference electrical potential when the sense amplifier determines from the electrical potential which has been read out from a memory cell upon one bit line of a pair of bit lines and from the electrical potential (½ Vcc) which has been read out upon the other bit line from a dummy cell, which of "0" or "1" the keep data of the memory cell is.

③ If dummy cells are not provided, a reference voltage which is used as an pre-charge and equalizing voltage for the pair of bit lines. In this case, the read voltage from a memory cell appears on one of the bit lines, while the other of the bit lines is at the pre-charge voltage (½ Vcc) directly before the start of sensing operation.

Here, a power down control signal PowerDown is supplied to the refresh control circuit 5, the boost power source 18, the substrate voltage generation circuit 19, and the reference voltage generation circuit 20. This power down control signal PowerDown is a signal for specifying from the exterior of the semiconductor memory device the mode when going into the power down state (the standby state). Each of the refresh control circuit 5, the boost power source 18, the substrate voltage generation circuit 19, and the reference voltage generation circuit 20, as will be described hereinafter, is arranged to control the power source supply for itself along with the power down control signal PowerDown.

Since in this embodiment the memory cells themselves are the same as in a DRAM, it is not possible simply to stop the power source supply to each of the circuit sections within the semiconductor memory device in the standby state as with an SRAM. Even in the standby state, in order to maintain the data in the memory cells, it is necessary to continue supplying the power source to the circuits which are required for refresh operation. In other words, with the semiconductor memory device of this embodiment, in relation to the standby state, it is not possible to pursue compatibility with an SRAM. However, in this embodiment, along with the provision of several modes for the standby state so that it is possible to obtain as much compatibility with an SRAM as possible, a mode of a type which does not exist in conventional semiconductor memory devices is also provided.

That is, in this embodiment, three types of standby mode are provided according to which ones among the refresh control circuit 5, the boost power source 18, the substrate voltage generation circuit 19, and the reference voltage generation circuit 20 are to be operated. In this specification, for convenience, these standby modes will be termed standby modes 1 to 3. The standby mode 1 is a mode in which the power source is supplied to all the four types of circuit; the standby mode 2 is a mode in which the power source supply to the refresh control circuit 5 among the four circuits, only, is stopped, with the power source being supplied to the other three types of circuit; and the standby mode 3 is a mode in which the power source supply to all the four types of circuit is stopped.

Thus, due to the above type of fact, for the power down control signal PowerDown, for example, it will be acceptable to provide a first power source supply line for supplying power source to the refresh control circuit 5, and with a second power source supply line for supplying power source to the boost power source 18, to the substrate voltage generation circuit 19, and to the reference voltage generation circuit 20.

Next, to explain each of the standby modes in further detail, the standby mode 1 is a power source supply mode the same as for a normal DRAM, and among the three types of standby mode it is the one in which the current consumption is the greatest. However, in this case, the power source is supplied to all the circuits which are required for refreshing the memory cells. Due to this, the data of the memory cells which was present directly before transition to the standby state is maintained, and the time period for transiting the semiconductor memory device from the standby state to the active state is the shortest among the three types of standby mode. It should be understood that, in setting the standby mode 1, it is acceptable to supply the power source to both the first power source supply line and also the second power source supply line. On the other hand, since in the standby mode 2 the power source is not supplied to the circuits which are necessary for the refresh process, therefore it is not possible to maintain the data of the memory cells in the standby state, but in comparison with the standby mode 1 it is possible to reduce the current consumption by this amount. That is to say, this mode attempts to divert thinking away from the established concept of data retention in the standby state, and, if the device transits from the standby state to the active state, a state is attained in which writing is to be performed for the entire memory cell array. Accordingly, the standby mode 2 and the standby mode 3 which will next be described are modes which are adapted to the case in which the semiconductor memory device is to be used as a buffer. It should be understood that, for setting the standby mode 2, it is arranged not to supply the power source upon the first power source supply line, and thus to terminate the supply of power source to the refresh control circuit 5.

Finally, since in the standby mode 3 it is necessary to start up the boost voltage, the substrate voltage, and the reference voltage, the time period for transiting from the standby state to the active state is the longest among the three types of standby mode, but to this extent it is possible to reduce the current consumption in standby mode to the minimum. It should be understood that, in the case of any of the standby modes 1 to 3, for the circuits other than the above described four types, it is acceptable to supply the power source only to those circuits which are required.

For example, if only refresh is to be performed, then, since the address buffer 1, the latch 2, the register circuit 3 (however, except for the address register), the ATD circuit 4, the column decoder 9, the hit control circuit 11, the register circuit 12 (however, except for the data register), the I/O buffer 13, the R/W control circuit 14, the latch control circuit 15, the column control circuit 17 and the like are not used, it will be no problem if the supply of the power source to them is stopped. It should be understood that, for setting the standby mode 3, it is arranged not to supply the power source to either the first power source supply line or the second power source supply line, and to stop supply of the power source to all of the refresh control circuit 5, the boost power source 18, the substrate voltage generation circuit 19, and the reference voltage generation circuit 20.

By providing standby modes like the above, it becomes possible to be able to control very finely from the exterior of the semiconductor memory device whether or not the data is preserved in the standby state, the time period to return to the active state, the current consumption and so on, according to the equipment to which the semiconductor memory device is to be applied and according to its environment of use and the like. It should be understood that it would also be acceptable to omit the power down control signal "PowerDown", since it does not perform an absolutely necessary function, and by doing so it becomes possible to maintain complete compatibility with the I/O pins of a general-purpose SRAM.

<Explanation of Operation>

Next, the operation of the semiconductor memory device according to the above described structure will be explained while referring to the timing chart shown in FIG. 2. As described above, during the initial write operation after the semiconductor memory device has been activated, its operation is exceptional and is different from that during the second and subsequent write operations. Thus, below, it will be supposed that at least the first write operation has been performed, and the explanation will focus upon the operation in the case of the second and subsequent write operations.

Figure 2:
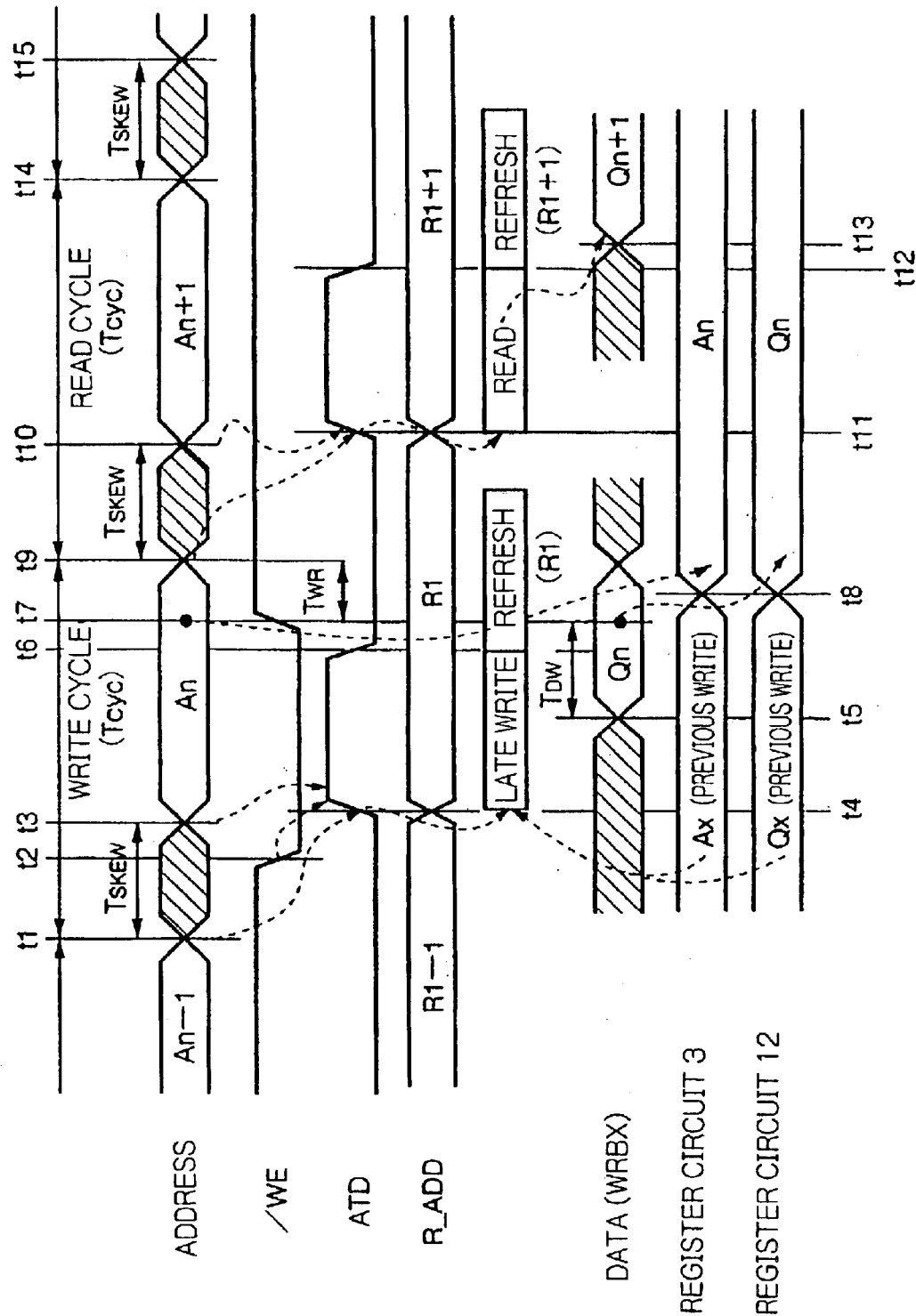
FIG. 2 is a timing chart showing, for the same embodiment, the operation in the case that, when writing (late writing) or reading, the refreshes which follow each of these are carried out in a single memory cycle.

In detail, as a precondition, it will be supposed that a write request for the data item "Qx" into the address "Ax" has taken place in a memory cycle earlier than shown in FIG. 2. Due to this, along with the address "Ax" being taken into the address register within the register circuit 3 in said memory cycle, the data item "Qx" is taken into the data register within the register circuit 12. It should be understood that the operation when taking the address "Ax" and the data item "Qx" into the register circuits 3 and 12 respectively, as will be described hereinafter, is exactly the same as the operation when taking an address "An" and a data item "Qn" into the register circuits 3 and 12 respectively.

And the operational timing is shown in FIG. 2 for the case that writing to the address "An" and reading from the address "An+1" is performed. It should be understood that the value of the refresh address R_ADD is supposed to be in "R1-1" before the writing. Furthermore, in FIG. 2, the address "An-1" is the address supplied in the immediately preceding memory cycle. If a write request was performed in the immediately preceding memory cycle, then the address "An" is equal to the address "Ax", while, if not, at least a single read request took place between the immediately preceding write request and the write request for the address "An".

As another precondition, it is supposed that both of the refresh control signals REFA and REFB are at "H" level. In other words, it is supposed that refresh is performed within the semiconductor memory device in accompaniment with a read and a write request from the exterior thereof, and furthermore it is supposed that the condition in which self refresh is initiated internally has not yet been arrived at. Moreover, it is supposed that the chip select signal/CS is fixed to the "L" level, so that the chip shown in FIG. 1 is selected.

(Write Operation)

First, at time t1, the address "Address" starts to change from its value "An-1" up till now to "An". At this time, as will become clear from the following explanation, the latch control signal LC is at "L" level, and moreover the control signal LW1 is at "L" level. Due to this, the address "Address" is buffered by the address buffer 1, and is passed through the latch 2 and becomes the internal address LC_ADD, and furthermore the internal address LC_ADD passes through the register circuit 3 and becomes the internal address L_ADD.

And the ATD circuit 4 comes to detect from the change of the internal address LC_ADD that the address "Address" has started to change. It should be understood that the determination of the value of the address "Address" is not limited to this time point in the same way as in the case of a general-purpose SRAM, since from this time point the device enters upon the address skew period (equivalent to the time period $T_{SKEW}$ shown in FIG. 2). Due to this, the address "Address" is not taken into the latch 2 at time t1, but rather it is arranged that the time period $T_{SKEW}$ elapses, and when the value of the address "Address" is determined as "An", the address "Address" is kept in the latch 2.

After this, in the address skew period, a negative pulse is input to the write enable signal/WE at, for example, time t2. In response to the fact that the write enable signal/WE has dropped, the R/W control circuit 14 puts the control signal CW0 to the "L" level, raises both of the control signals LW1 and LW2 to the "H" level. As a result, the I/O buffer 13 comes to transmit the write data upon the bus I/O to the bus WRBX. The value of the write data is not always determined at this time point. Furthermore, the register circuit 3 outputs the address "Ax" which is being kept in the address register as the internal address L_ADD, the register circuit 12 outputs upon the bus WRB the data "Qx" which is being kept in the data register.

Next, when the device reaches time t3, the value of the address "Address" is determined as being "An". Furthermore, since at the same time t3 the time period $T_{SKEW}$ has elapsed from the time point (the time t1) at which the address "Address" (=the internal address LC_ADD) started to change. Therefore, when the device reaches the subsequent time t4, the ATD circuit 4 generates a positive one shot pulse in the address transition detect signal ATD. In response to the fact that the address transition detect signal ATD has risen, the refresh control circuit 5 increases the value of the refresh address R_ADD by unity and updates its value into "R1" for the refresh operation which is performed after writing.

And late write operation is started upon the rising edge of the address transition detect signal ATD. In other words, the multiplexer 6 receives the rising edge of the address transition detect signal ATD and comes to select the side of the internal address L_ADD. At this time, the register circuit 3 is outputting the address "Ax" which is being kept in the address register as the internal address L_ADD, and the multiplexer 6 outputs this value to the row decoder 8 as the address M_ADD. Furthermore in the same manner, by the address transition detect signal ATD having risen, the row control circuit 16 generates a positive one shot pulse in the row enable signal RE. Due to this, the row decoder 8 activates the word line which corresponds to the address "Ax" (in the following, the word line of the object of writing is sometimes termed the "write word line").

Next, the row control circuit 16 generates a positive one shot pulse in the sense amplifier enable signal SE corresponding to the one shot pulse of the row enable signal RE, and it also generates a positive one shot pulse in the control signal CC and outputs it to the column control circuit 17. Due to this, the column control circuit 17 generates a positive one shot pulse in the column enable signal CE. When by doing this the column enable signal CE goes to "H" level, the column decoder 9 decodes the column address which is included in the internal address L_ADD (i.e., the address "Ax"), and generates a positive one shot pulse in the column select signal corresponding to this column address.

As a result, among the sense amplifiers in the sense amplifier/reset circuit 10, the sense amplifier which corresponds to the above described column address is selected and is connected with the bus WRB. As a result of the above, from the time t4, writing of the data "Qx" commences via the sense amplifier in the sense amplifier/reset circuit 10 to the memory cell which corresponds to the address "Ax". After this, when the device reaches the time t5, the data "Qn" which is the write data corresponding to the address "An" comes to be supplied, and said data is carried upon the bus I/O and is transmitted via the I/O buffer 13 upon the bus WRBX. Of course, since at this time the bus WRBX is not connected to the bus WRB, at this time point the data "Qn" has no relationship with the writing to the memory cell array 7.

After this, the row control circuit 16 drops the one shot pulse of the row enable signal RE in order to stop the write operation. The row decoder 8 receives this, and deactivates the write word line which corresponds to the address "Ax". Next, the row control circuit 16 drops the sense amplifier enable signal SE and terminates the write operation via the sense amplifier in the sense amplifier/reset circuit 10. Subsequently, the row control circuit 16 drops the control signal CC, and the column control circuit 17 receives this falling edge and drops the column enable signal CE.

As a result, the column decoder 9 invalidates the column select signal, and disconnects the connection between the sense amplifier in the sense amplifier/reset circuit 10 which was selected and the bus WRB. Next, the row control circuit 16 raises the pre-charge enable signal PE, and, due to this, the pre-charge circuit in the sense amplifier/reset circuit 10 pre-charges the bit line in preparation for the next access. Subsequently, the row control circuit 16 drops the pre-charge enable signal PE after the time period which is required for the pre-charge operation has elapsed, and terminates the pre-charge operation of the bit line by the pre-charge circuit within the sense amplifier/reset circuit 10.

(Refresh Operation Accompanying Write In)

Next, when the device arrives at time t6 and the address transition detect signal ATD drops, the refresh operation commences. In other words, the multiplexer 6 comes to select the refresh address R_ADD side due to the address transition detect signal ATD going to "L" level, and outputs "R1" as the address M_ADD. Furthermore, the row control circuit 16 receives the falling edge of the address transition detect signal ATD and generates a positive one shot pulse in the row enable signal RE. Due to this, the row decoder 8 activates the word line which corresponds to the value "R1" of the address M_ADD (in the following, the word line which is the object of the refresh process will sometimes be termed the "refresh word line").

As a result, in the memory cell array 7, the keep data items of the memory cells which are connected to the refresh word line come to appear as electrical potentials upon the bit lines. Thereafter, when the row control circuit 16 generates a positive one shot pulse in the sense amplifier enable signal SE, the sense amplifiers in the sense amplifier/reset circuit 10 are activated, and the memory cells which are connected to the refresh word line start to be refreshed. It should be understood that, since the refresh itself is exactly the same as that performed by a DRAM and is a known technical matter, herein it will not be explained in detail.

When the write enable signal/WE rises while the refresh is being performed in this manner at, for instance, time t7, the R/W control circuit 14 drops both the control signals LW1 and LW2. The register circuit 3 receives the falling edge of this control signal LW1 and, at time t8, takes the value "An" of the internal address LC_ADD into the address register. Furthermore, the register circuit 12 receives the falling edge of the control signal LW2, and at the same time t8 takes in the data "Qn" on the bus WRBX into the data register. The address "An" and the data "Qn" which have been taken into these registers come to be used in late write operation in the memory cycle in which a next write request has been performed.

Thereafter, when the device reaches time t9, the memory cycle for writing terminates and the device transits to the memory cycle for reading. It should be noted that at this time point it is the state in which the refresh operation which accompanied late writing continues to be performed. On the other hand, when the required time period for the refresh operation has elapsed from the commencement of refresh (the time t6), the row control circuit 16 drops the row enable signal RE in order to terminate the refresh operation. Due to this, the row decoder 8 deactivates the refresh word line. Next, the row control circuit 16 drops the sense amplifier enable signal SE, and the sense amplifier within the sense amplifier/reset circuit 10 whose refresh has been finished is deactivated.

At this time, the latch control circuit 15 receives the fact that the sense amplifier enable signal SE has dropped and drops the latch control signal LC. It should be understood that no one shot pulse is generated in the column enable signal CE although a one shot pulse is generated in the row enable signal RE, since as will be understood from the explanation above it is not necessary to output the data in the memory cells to the exterior of the semiconductor memory device during the refresh process; in this feature, the present case differs from the case of writing which was explained previously. Accordingly, the column decoder 9 leaves the column select signal in the deactivated state as well.

When the refresh operation has been completed by doing the above, the row control circuit 16 generates a one shot pulse in the pre-charge enable signal PE in the same manner as when the writing terminated, and pre-charges the bit line. And the operation up to this is performed, at the latest, up to the time t10 (in other words, when the time period $T_{SKEW}$ has elapsed from the time point at which the read cycle following the write cycle commences). It should be understood that the fact that no problem arises even if the refresh operation extends until the end of the address skew period of the next memory cycle, is due to the following reason.

Namely, in this embodiment, by not generating the one shot pulse in the address transition detect signal ATD while the address "Address" is not determined, control is exercised so that the writing and reading operations do not start until the address skew period is finished. Furthermore, corresponding to this control, it is arranged for the internal address L_ADD which is used in the write address and read address within the address skew period to keep its value in the directly preceding memory cycle.

It should be understood that the times t1 to t9 in FIG. 2 (in actual operation, the times t3 to t10) are one memory cycle, and in FIG. 2 the cycle time is shown as "Tcyc". Furthermore, the period of the times t7 to t9 is equivalent to the recovery time period $T_{WR}$ which was previously described. However since, in this embodiment, the pre-charge operation after the late writing is completed before the refresh operation, it is not necessary to ensure the recovery time period $T_{WR}$. For example, it would be acceptable to arrange for the write enable signal/WE to rise at the time t9, and in such a case the recovery time period $T_{WR}$ would become zero.

(Read Out Operation)

Next, the memory cycle for reading that starts from the time t9 will be explained. First at the time t9 the value of the address "Address" starts to change from "An". Since in this case as well the address skew period lasts until the time t10, the address "Address" is not taken into the latch 2 until the address is determined as "An+1". Furthermore, if a read request is made, the write enable signal/WE does not drop during the address skew period, but instead the output enable signal OE becomes valid.

Due to this, the R/W control circuit 14 prepares for the reading from the memory cell by bringing the control signal CWO to "H" level, it also keeps both of the control signals LW1 and LW2 at "L" level just as they are. Because of this, the I/O buffer 13 comes to transmit the data upon the bus WRBX to the bus I/O. It must be said that at this time point it is still the address skew period, the hit control signal HE is just the same as in the directly preceding memory cycle, and it is not determined whether the data upon the data WRB is read out upon the bus WRBX, or whether the kept data of the data register is read out upon the bus WRBX.

Next, when the device reaches the time t10 at which the address skew period finishes, the values of the address "Address" and of the internal address LC_ADD are determined as "An+1". Since at this time the control signal LW1 is "L" level, the value of the internal address LC_ADD is output just as it is as the internal address L_ADD. Furthermore the register circuit 3 outputs "L" level as the hit signal HIT, since the value "An+1" of the internal address LC_ADD does not agree with the address "An" which is being kept in the address register.

Next, at the time t11, the ATD circuit 4 generates a positive one shot pulse in the address transition detect signal ATD, and due to this, read operation starts. And the refresh control circuit 5 updates the value of the refresh address R_ADD from "R1" to "R1+1". Furthermore, the hit control circuit 11 takes in the hit signal HIT at the same time t11 and outputs "L" level as the hit enable signal HE. Because of this, the register circuit 12 comes to connect together the bus WRB and the bus WRBX, and it becomes possible for the sense result due to the sense amplifier within the sense amplifier/reset circuit 10 to be output to the exterior of the semiconductor memory device via the I/O buffer 13 and the bus I/O.

Next, the multiplexer 6 selects the internal address L_ADD side and outputs the address "An+1" to the row decoder 8 as the address M_ADD. At the same time, the row control circuit 16 generates a positive one shot pulse in the row enable signal RE, and the row decoder 8 activates the word line which corresponds to the address "An+1" (in the following, the word line which is the object of reading is sometimes termed the "read word line"). As a result, the kept data values of the memory cells which are connected to the read word line are read out as electrical potentials upon the bit lines. Next, the row control circuit 16 generates positive one shot pulses in each of the sense amplifier enable signal SE and the control signal CC.

When this is done, the column control circuit 17 generates a positive one shot pulse in the column enable signal CE, the column decoder 9 activates the column select signal which corresponds to the column address within the address "An+1", and the sense amplifier which corresponds to this column select signal is connected to the bus WRB. This sense amplifier senses the data of the memory cells which are connected to the read word line and amplifies it to the levels of "0"/"1". As a result, when the device reaches the time t13, the data "Qn+1" which is being stored in the address "An+1" comes to appear upon the bus WRB, and is read out to the outside from the bus I/O via the register circuit 12, the bus WRBX, and the I/O buffer 13.

After this, in order to complete the read operation, the row control circuit 16 drops the row enable signal RE. When this is done, in the same way as in the case of writing, the read word line which corresponds to the address "An+1" is deactivated, the sense amplifier enable signal SE goes to "L" level, and the sense amplifier in the sense amplifier/reset circuit 10 completes sense operation. Furthermore, by the column control circuit 17 bringing the column enable signal CE to "L" level, the sense amplifier and the bus WRB are disconnected from one another. Subsequently, the bit line is pre-charged by the row control circuit 16 generating a one shot pulse in the pre-charge enable signal PE.

(Refresh Operation Accompanying Read Out)

On the other hand, at the time t12 the address transition detect signal ATD drops, and the refresh operation accompanying reading starts. In this case, the operation which is performed for the times t12 to t15 is the same as the refresh which accompanies writing, with the only point of difference being that the refresh address R_ADD is not "R1", but that "R1+1" is used. And when the device reaches the time t14 during the refresh operation, the memory cycle for reading terminates and the device transits to the following new memory cycle, and the refresh operation finishes until the address skew period is completed in this new memory cycle. It should be understood that the period between the times t9 to t14 (the actual operation is the period between the times t10 to t15) is again a single memory cycle, and the cycle time is "Tcyc".

Since with this embodiment as above the write enable signal/WE which accompanies the write request is dropping within the address skew period, therefore which of writing and reading the access is, is determined when the address has been determined. Moreover, since late writing is being performed in this embodiment, the write address and the write data are already determined before any address skew period. Since the above arrangements are implemented, it is possible to commence the write operation or the read operation when it is determined which of writing or reading the access request may be. Furthermore, with this embodiment in which the arrangements are as described above, it is not necessary to ensure a recovery time period $T_{WR}$ as in the related art.

Accordingly, the time period required for writing or reading is at a minimum, and the length of a single memory cycle (between the times t3 to t10 or the times t10 to t15) can be kept to the shortest. Furthermore, since the refresh is performed after performing writing or reading, it is possible to increase the speed of access (the address access time period $T_{AA}$ in the case of reading) by the time period which becomes necessary for performing the refresh, by comparison to the case in which the reading or the writing is performed after the refresh as in the first related art or the second related art.

<If Bypass Is To Be Performed>

In FIG. 2, if the read address is not "An+1" but is "An", the write data "Qn" for the address "An" is not as yet reflected in the memory cell array 7. Due to this, bypass operation is performed as will now be explained. To this purpose, in the following, the points of difference versus the operation described above will be explained. In this case, when the device reaches the time t10 shown in FIG. 2, the value of the address "Address" is determined as "An", and this value "An" is output to the internal address LC_ADD as well.

Since the address register in the register circuit 3 is keeping "An" at this time, the register circuit 3 comes to output "H" level as the hit signal HIT. After this, when the device reaches the time t11 and the address transition detect signal ATD rises, the hit control circuit 11 takes in the hit signal HIT, and outputs "H" as the hit enable signal HE. And, since this case is that of read operation, the R/W control circuit 14 outputs "L" level as the control signal LW2. Accordingly, the register circuit 12 comes to output upon the bus WRBX the data "Qn" which is being kept in the data register.

After this, according to when the read address is "An+1", the data from the memory cell array 7 which is being stored in the address "An" is read out, and when the device reaches the time t13 said data is read out upon the bus WRB. However, because this data is the old data before the writing, it is not used as the read data but is discarded. Instead, the data "Qn" which is being output upon the bus WRBX is output to the exterior of the semiconductor memory device through the I/O buffer 13 and the bus I/O.

Moreover, it has been considered to reduce current consumption by not initiating the read operation, since it is not necessary to reading from the memory cell array 7 in the case of performing bypass operation. For this, the hit enable signal HE is also supplied to the row control circuit 16. If the hit enable signal HE is "H" level at the rising edge timing of the address transition detect signal ATD and if the reading request is input, then the row control circuit 16 and the column control circuit 17 are controlled so as not to generate the row enable signal RE and the signals which are generated in time sequence from it (the sense amplifier enable signal SE, the control signal CC, the column enable signal CE, the column select signal, and the pre-charge enable signal PE).

<Write In and Read Out Not Accompanied By Refresh>

In FIG. 2, it was assumed that refresh is always performed in accompaniment with access from the outside. However it will be acceptable if one refresh cycle (meaning one refresh each for all of the word lines) is accomplished within a predetermined time period of several ms to around several tens of ms, depending upon the structure and the capacity of the memory cell array. For this, it is not absolutely necessary to perform refresh whenever the address "Address" changes; it will be acceptable to perform refresh once in, for example, several µs.

That is, it will be acceptable to arrange to perform refresh intermittently, only one time for each of a predetermined number memory cycles. Or, even in the case that refresh is performed continuously as shown in FIG. 2, if one refresh cycle has been performed, it is not necessary to perform refresh until starting the next refresh cycle. In this manner, if for the time being it has become unnecessary to perform refresh, it will be acceptable temporarily to stop the refresh by dropping the refresh control signal REFA. If this is done excessive refresh ceases to be performed, so that it is possible to reduce the power consumption.

Figure 3:
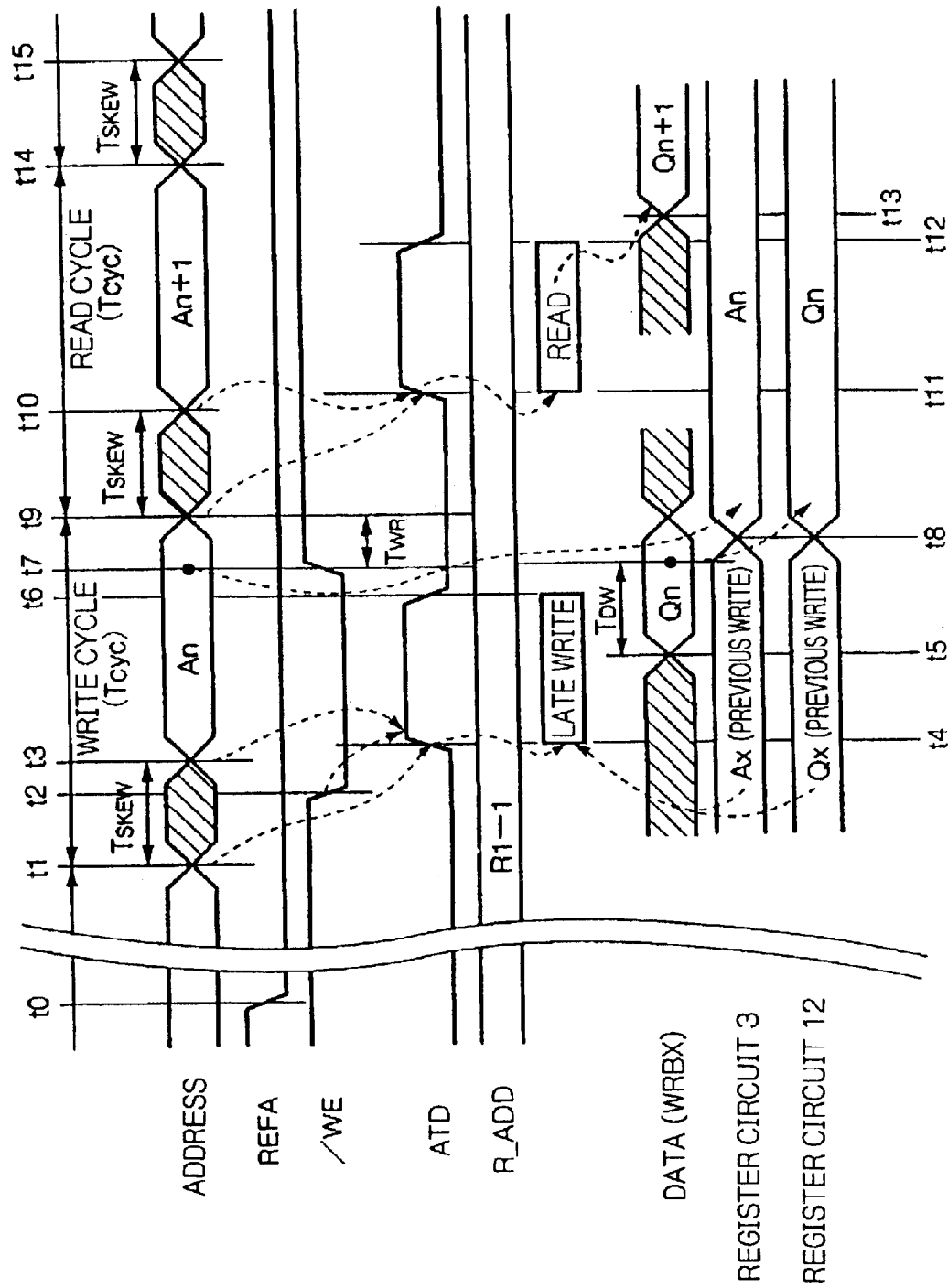
FIG. 3 is a timing chart showing, for the same embodiment, the operation in the case that only writing (late writing) or reading is carried out, without performing any refresh.

FIG. 3 shows an operational timing chart for the case in which, by controlling the refresh timer within the refresh control circuit 5, it is arranged temporarily not to perform refresh. As described above, in the case of FIG. 2, the refresh control signal PEFA was left at "H" level just as it was. By contrast to this, in the case of FIG. 3, since one refresh cycle was completed by the refresh which was performed during the previous memory cycle, the refresh control circuit 5 drops the refresh control signal REFA at the time t0. In other words, in FIG. 3, there is shown the timing of switching shifting from the state in which the refresh operation is performed continuously in each memory cycle upon trigger by the generation of the address transition detect signal ATD, to the state in which the refresh operation in this manner is not performed. It should be noted that, since at this time the refresh control signal REFB remains just as it is at "H" level in the same way as it did in FIG. 2, it is not particularly shown in FIG. 3.

Herein, the operation over the times t1 to t6 is exactly the same as in the case of FIG. 2. And, although the address transition detect signal ATD drops when the device reaches the time t6, since at this time the refresh control signal REFA becomes "L" level, the row control circuit 16 does not generate the row enable signal RE and the sense amplifier enable signal SE and the pre-charge enable signal PE which correspond thereto, so that refresh ceases to be performed. Furthermore, since the address counter within the refresh control circuit 5 stops count operation when the refresh control signal REFA goes to "L" level, the value of the refresh address R_ADD comes to remain just as it is at "R1–1".

And the above procedure is performed in exactly the same manner in the case of reading as well (the times t9 to t15). Accordingly, even if at the time t12 the address transition detect signal ATD drops, the refresh ceases to be performed, and the value of the refresh address R_ADD also continues to remain at "R1–1" just as it is. It should be understood that, if the next refresh cycle is started at a subsequent time point, then operation like that shown in FIG. 2 comes to be performed again, since the refresh control circuit 5 returns the refresh control signal REFA to "H" level. The refresh counter is not reset even when the refresh operation has been resumed by doing this, and incrementing operation is performed for the value which is being kept in the refresh counter up till this moment. In other words, the refresh counter is not reset even if for example the self refresh operation is interrupted midway through the refresh cycle (that is, the cycle which refreshes all the word lines), and, when the next refresh operation (whichever of refresh accompanying reading or writing, or self refresh, it may be) is resumed, the value remaining in the refresh counter is incremented.

<Self Refresh>

Next, the operation when self refresh is performed by the refresh timer due to there having been no access request from outside the semiconductor memory device over a predetermined refresh time period will be explained. As has been explained above, in this embodiment, when there has been an address change accompanying an access request from outside, it is arranged to perform refresh after the writing or reading which corresponds to said access request has been performed.

However, since it is considered that over a long time period no access request from the outside may be generated, it is not possible to continue keeping the data of the memory cell array 7 only by the refreshes which accompany access requests. Thus, with this embodiment, a refresh timer in the refresh control circuit 5 is utilized, and it is arranged to initiate self refresh when the above described refresh time period has elapsed from when the final access request from the outside has occurred.

Figure 4:
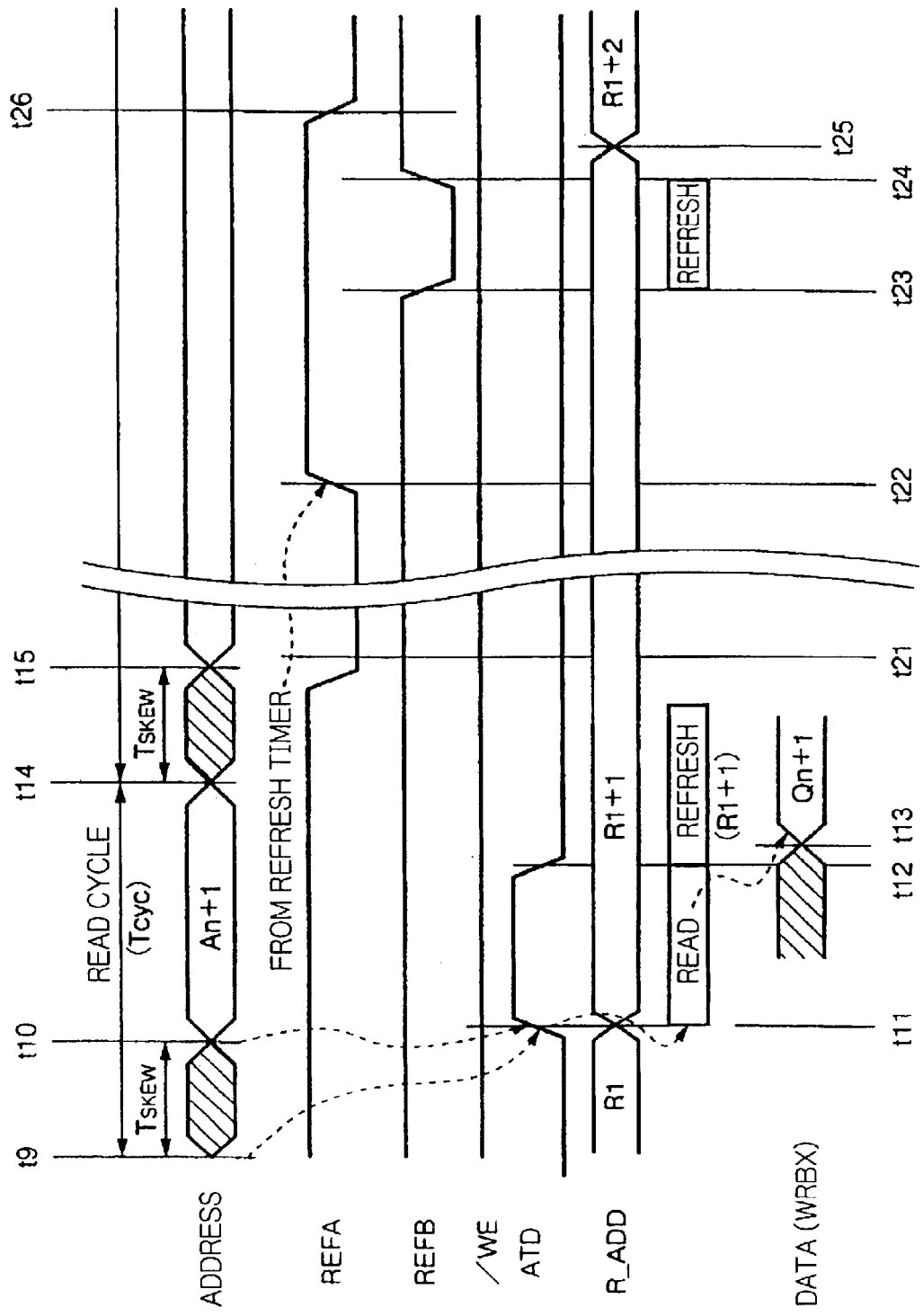
FIG. 4 is a timing chart showing, for the same embodiment, the operation in the case that self refresh is initiated by a refresh timer.

FIG. 4 shows the operational timing at this time. The times t9 to t15 in this figure are exactly the same operations as shown in FIG. 2 for reading due to a read request from the outside and for the refresh which accompanies it. Moreover, at the time point that a one shot pulse in the address transition detect signal ATD is generated, it is arranged for the refresh control circuit 5 to reset the refresh timer at the time t11 and to perform timing of the refresh time period from the beginning. And, if it is assumed that finally one refresh cycle is completed after the refresh from the time t12, the refresh control signal REFA is dropped at the time t21 the same as in the case of FIG. 3.

Thereafter, when the time comes for the refresh of the next cycle to be started, at the time t22 the refresh control circuit 5 raises the refresh control signal REFA. Due to this, although the device transits to a state in which refresh is possible when an access request has arrived from the outside, when independently of this situation the state in which there is no access request continues, upon trigger by the rising edge of a signal which has been delayed from the refresh control signal REFA by the above described delay circuit, the refresh control circuit 5 initiates the above described pulse generation circuit, and at the time t23 generates a negative one shot pulse in the refresh control signal REFB. Due to this, the row control circuit 16 generates a one shot pulse in the row enable signal RE, and performs the refresh. At this time, the multiplexer 6 comes to select the side of the refresh address R_ADD since the refresh control signal REFB is at "L" level, and outputs "R1+1" as the address M_ADD. It should be understood that the refresh operation which is performed at this time is exactly the same as the operation which was performed in FIG. 2.

After this, the refresh control circuit 5 completes the refresh operation by raising the refresh control signal REFB at the time t24. At this time, it is arranged for the multiplexer 6 to receive the rising edge of the refresh control signal REFB and to select the side of the internal address L_ADD. Furthermore, the refresh control circuit 5 updates the refresh address R_ADD to "R1+2" at the time t25. It should be understood that, since in this case the address transition detect signal ATD is not generated from when the refresh control signal REFA is raised at the time t22, the device does not transit to the state in which the refresh operation along with address change is continually performed. Accordingly, the refresh control circuit 5 drops the refresh control signal REFA at the time t26, and puts the device into the state in which, from this time point onward, refresh operation is controlled by the refresh timer.

Figure 5:
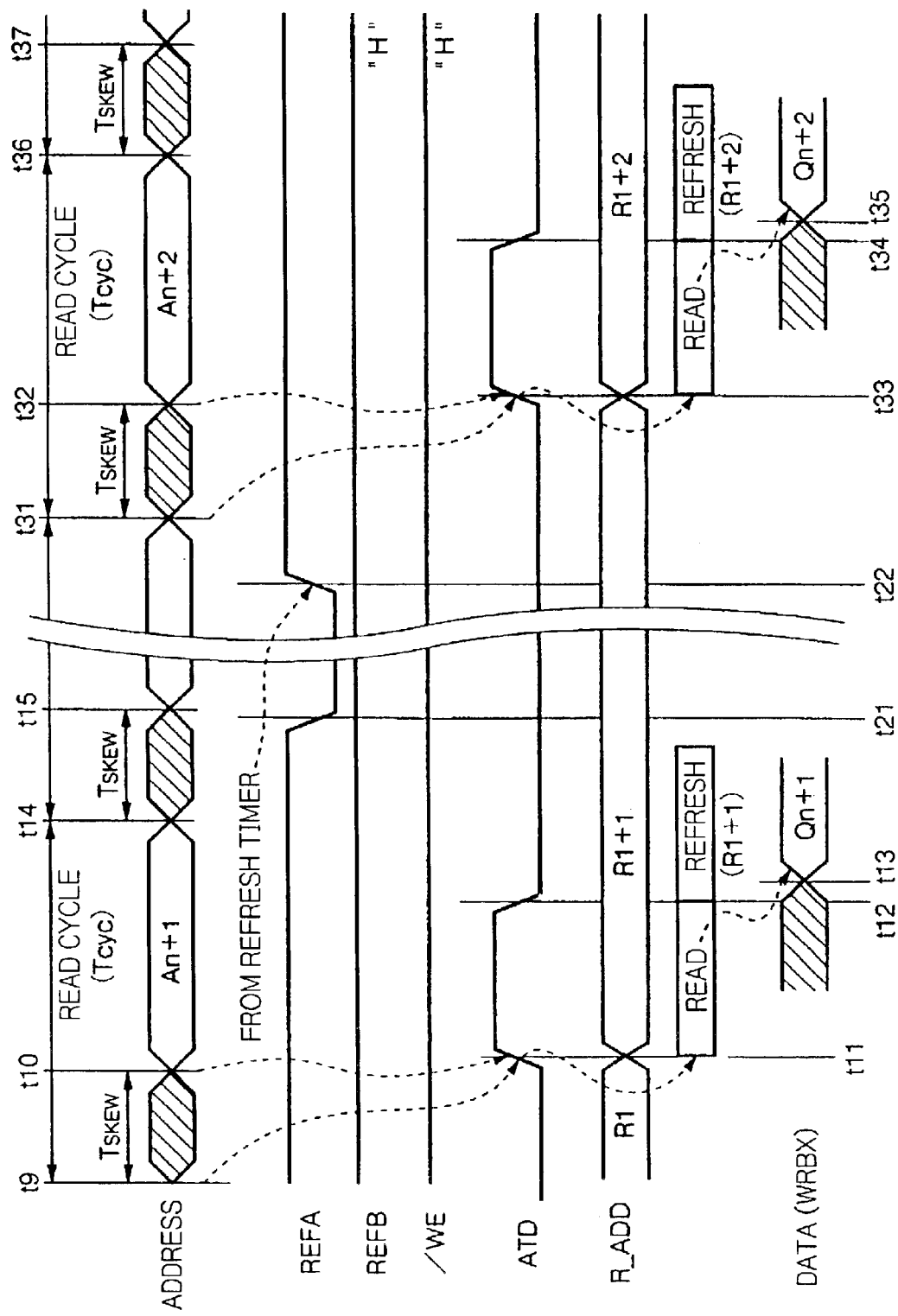
FIG. 5 is a timing chart showing, for the same embodiment, the operation when reading by the read request from externally directly before self refresh is initiated by the refresh timer and the refresh which accompanies it are carried out.

Here, if an access request arrives from the outside of the semiconductor memory device while the refresh timer is timing the refresh time period, its processing proceeds as in the timing chart shown in FIG. 5. That is to say, when at the time t31 the address "Address" starts to change and by the arrival of the time t32 its value is determined as "An+2", then at the time t33 the ATD circuit 4 generates a one shot pulse in the address transition detect signal ATD. When this is done, the refresh control circuit 5 does not drop the refresh control signal REFB as during FIG. 4, but maintains it at "H" level just as it is. Due to this, from the time t33 and onward, in the same way as over the times t11 to t15, the reading from the address "An+2" and the refresh related to the address "R1+2" are performed. As a result, the data "Qn+2" which is being stored in the address "An+2" comes to be output upon the bus WRBX at the time t35. It should be understood that in FIG. 5 it is assumed that the refresh control signal REFA is raised at the time t22 which is close to the timing of the cell hold limit, and the address conversion detection signal ATD is sequentially generated in the subsequently continuing memory cycles, so that the refresh control signal REFA is maintained just as it is at "H" level, since the refresh is to be performed continuously.

<Variant Embodiments>

(1) With the explanation described above, late writing was performed in the memory cycle in which the next write request was done. The reason that this is done is that the memory cycle in which the next write request is available is one in which it is possible to perform the late writing securely. Now, it will be supposed that the late writing is performed by taking advantage of the empty time period until the next write request. In this case, even if a read request occurs while the late writing is being performed, it is necessary to delay the start of the read operation until the late writing has been completed. Accordingly there is an undesirable delay in obtaining the read data, in comparison with the case in which the read operation was started immediately after the address skew period had elapsed.

Thus, if there is a period in which it is possible to guarantee that no read request will be input during that time period which is required for the late writing, it would also be acceptable to perform the late writing within that period. Accordingly, the timing at which the late writing is performed is not necessarily restricted to the time point at which the next write request takes place. For this period, the cases are considered of the chip select signal/CS (or a signal which is equivalent to the chip enable signal of a general-purpose SRAM) being invalid, or the chip itself being put in the non selected state (or the deactivated state). For this, it is sufficient to stipulate in the specification of the semiconductor memory device that, if the chip select signal/CS or the chip enable signal has temporarily become invalid, these signals should become valid after leaving at least the time period which is required for the late writing.

(2) In the above explanation, it was arranged to perform refresh only a single time along with the writing or the reading. However, in this embodiment, refresh is performed after writing or reading is performed. For this, if a single memory cycle is set to be long as compared with the cases which have been explained up till now, it will be sufficient to arrange for the refresh to be performed a plurality of times within the scope occupied by a single memory cycle. By doing this, it becomes unnecessary to restrict the upper limit value of the write pulse time period $T_{WP}$ or the upper limit value of the cycle time Tcyc as with a conventional SRAM. The reason for this will be explained in detail hereinafter.

(3) Furthermore it would also be acceptable to arrange, if as described above the chip has gone into the non selected state and there is no access request from the outside, for refresh to be performed from once to a plurality of times, thus taking advantage of this empty time period. Furthermore it would be acceptable, as described in the above described variant embodiment (1), if the late writing is performed at the time point that the chip goes into the non selected state, to perform refresh together with the late writing. At this time, it would also be acceptable to arrange for the refresh to be performed a plurality of times, as described in the above described variant embodiment (2).

(4) In the above explanation, the condition that the write enable signal/WE drops within the address skew period was satisfied. However, this condition is not essential. For example, even if the write enable signal/WE has become valid later than the address skew period, there is no necessity to satisfy the condition described above stringently, if the time period thereafter which is required for the late write operation and the refresh operation is short. In this type of case, it will be sufficient to arrange for the value of the time period $T_{SKEW}$ to be set greater than the maximum value of the skew, and for the address skew period to be stretched out until the timing of dropping of the write enable signal/WE.

(5) In the above explanation, the control signals LW1 and LW2 were driven at the same timing during the late write control. Accordingly, it would also be acceptable for both of these control signals to be combined. However, it would be acceptable, for example, for the taking in of the write address into the address register to be done at any time, provided that this is done within the period from when the address skew period has elapsed until the write enable signal/WE has risen. Accordingly, it would also be acceptable to establish the timing of raising the control signal LW1 after, for example, the address skew period has elapsed, and to take in the write address into the address register in synchrony with this rising edge.

<Concerning the Write Pulse Time Period $T_{WP}$ and the Cycle Time Tcyc>

Generally, in the case of an SRAM for which refresh is not required, no restriction is imposed upon the timing specification for the upper limit values of the write pulse time period $T_{WP}$ and the cycle time Tcyc. Here, the write pulse time period $T_{WP}$ defines the period when writing of data is performed in which the write enable signal/WE goes to "L" level, and in this period the word line is selected and the data is written into the memory cells. Furthermore, the cycle time Tcyc defines the period in which the address must be specified when performing reading or writing of data.

With a normal SRAM for which refresh is not required, in its timing specification, only lower limit values are specified for the write pulse time period $T_{WP}$ and the cycle time Tcyc, while upper limit values for them are not particularly specified. Accordingly the user of the SRAM is able to set the write pulse time period $T_{WP}$ and the cycle time Tcyc at will, provided that these lower limit values are satisfied. By contrast to this, with a pseudo-SRAM according to this embodiment which maintains the data with memory cells which are the same as those in a DRAM, upper limit values of the write pulse time period $T_{WP}$ and the cycle time Tcyc become necessary due to constraints upon the refresh, if late writing is not performed.

In other words, with this embodiment, if the same write scheme is employed as with a conventional pseudo-SRAM, the period in which the word line is in the selected state comes to be specified by the write pulse time period $T_{WP}$. And during the period specified by this write pulse time period $T_{WP}$, due to the necessity of avoiding competition of data upon the bit lines, the selection of other word lines is completely prohibited, and refresh is also prohibited. Accordingly, when the write pulse time period $T_{WP}$ is extended without limit, the period in which refresh cannot be performed also becomes long, and thus an upper limit value upon the write pulse time period $T_{WP}$ becomes necessary, since otherwise the data which is kept in the memory cells becomes lost.

Furthermore although, in this embodiment, a refresh is performed in accompaniment with the reading or the writing when the address changes over, when the cycle time Tcyc becomes long, the period until the address changes over also becomes long, and the interval of the refresh also becomes long. Accordingly, when the cycle time Tcyc becomes long without any limit, the time period in which no refresh is performed also becomes long, so that it is necessary to impose an upper limit value upon the cycle time T, since otherwise the data which is kept in the memory cells would become lost. However as described above, according to the late write scheme according to this embodiment, upper limit values for the write pulse time period $T_{WP}$ and the cycle time Tcyc are not required, so that it is possible to relax constraints upon the timing specification.

In the following, the reason why upper limit values upon the write pulse time period $T_{WP}$ and the cycle time Tcyc become unnecessary will be explained in detail.

Figure 6:
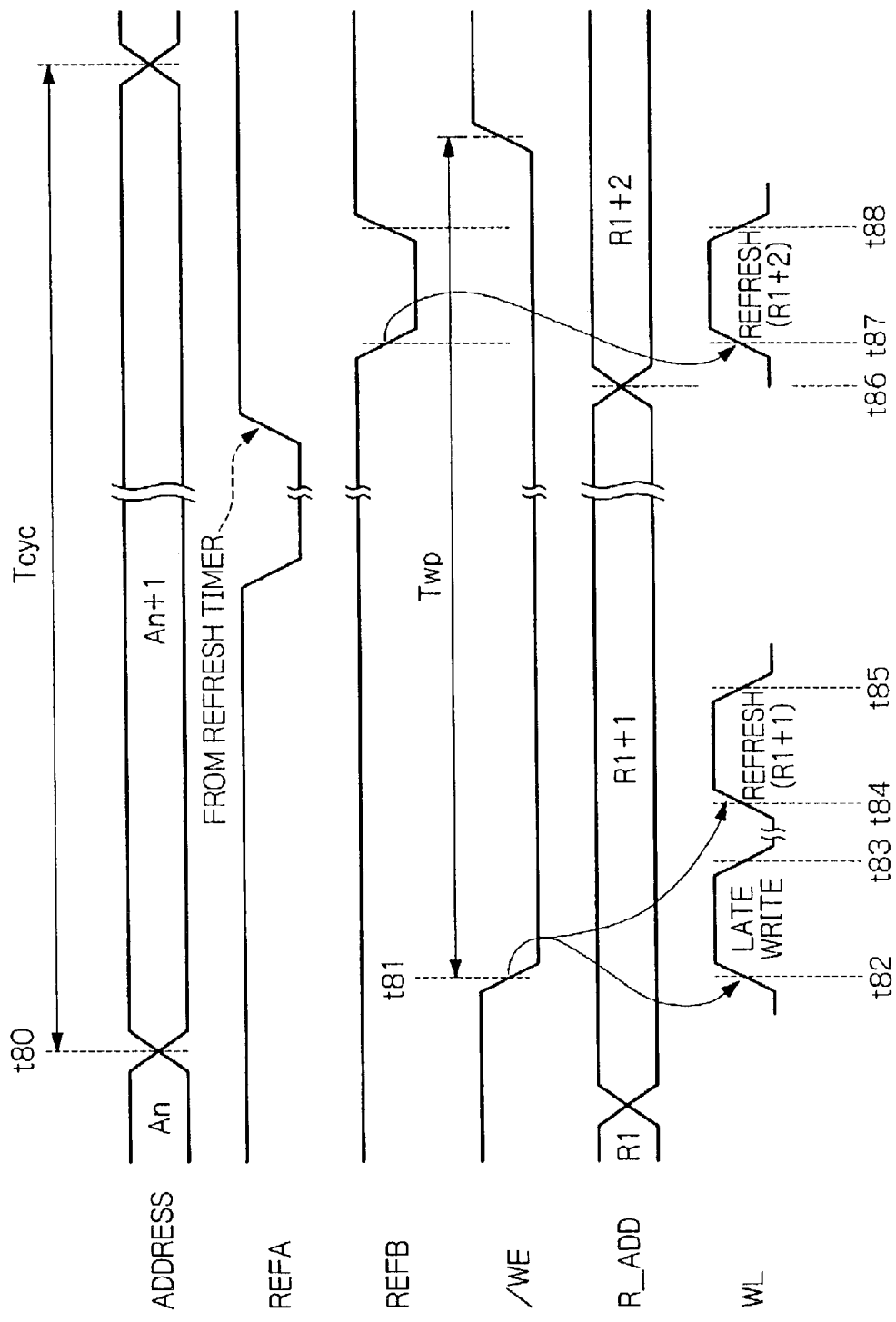
FIG. 6 is a timing chart, for the same embodiment, for explanation of why no upper limit value is required for a write pulse time period $T_{WP}$.

First, the reason why an upper limit value upon the write pulse time period $T_{WP}$ becomes unnecessary will be explained with reference to the timing chart shown in FIG. 6. At the time t80 the address "Address" changes over to "An+1", and, when at the time t81 the write enable signal/WE changes to "L" level, late writing and refresh are performed in sequence. That is, from the time t82 to the time t83 the word line WL is selected, and late writing is performed. Moreover, in the write cycle for the access address An+1, the word line in the memory cell array which is designated by this access address An+1 is temporarily selected and late writing is performed.

And, in accompaniment with this late writing (writing), the word line designated by the refresh address "R1+1" is temporarily selected from the time t84 to the time t85, and refresh is performed for this refresh address. When this refresh is completed, the refresh timer is started and measurement of time commences. This time measurement makes sure of an elapse time period from when the final refresh is performed, and it is done in order to obtain the timing which is required for self refresh.

Here, the case is considered in which the write pulse time period $T_{WP}$ is set to be long, and the write enable signal/WE is maintained at "L" level over a long period. In this case, the refresh control signal REFB is generated when at the time t87 the value of the above described refresh timer reaches the value which gives the timing necessary for the refresh, and refresh is performed at the time t88. In other words, a refresh for the memory cell array is spontaneously performed after a predetermined time period has elapsed from when the refresh which accompanies the above described writing was performed. In this example refresh is performed for the refresh address "R1+2" at the time t87, since the refresh address R_ADD is changed over to "R1+2" at the time t86 which is before the time t87. It should be understood that the refresh address is adjusted with the timing for self refresh, thus being incremented at a suitable period.

In this manner, by arranging to employ a late write scheme, the word line is only selected temporarily in order to write the data, and other periods within the write cycle become periods in which writing of data is not performed. Accordingly it is possible to make spontaneous refresh (self refresh) function validly even in a period which is limited by the write pulse time period $T_{WP}$, so that it becomes possible to preserve the data in the memory cells even if the write pulse time period $T_{WP}$ becomes long without any limit. Thus, as with a normal SRAM, it becomes unnecessary to impose any upper limit upon the write pulse time period $T_{WP}$, so that it is possible to relax constraints upon the timing specification.

Next, the reason why an upper limit value upon the cycle time Tcyc becomes unnecessary will be explained with reference to the timing chart shown in FIG. 7.

When at the time t90 the address "Address" is changed over to "An+1", then the word line WL is temporarily selected from the time t92 to the time t93, and normal reading is performed. That is to say, in the read cycle for the access address An+1, the word line in the memory cell array which is designated by this access address An+1 is temporarily selected and reading is performed. In accompaniment with this reading, from the time t94 to the time t95, the word line designated by the refresh address "R1+1" is selected and refresh is performed. When this refresh is completed, the refresh timer is started in order to obtain the timing at which self refresh must be performed.

Here the case is considered in which the cycle time Tcyc is set long, and the read cycle has been continued over a long period. In this case, when at the time t97 the value of the above described refresh timer reaches the value which provides the timing at which refresh must be performed, the refresh control signal REFB is generated in the same manner as in the above described case of the write pulse $T_{WP}$, and refresh is performed for the refresh address "R1+2" at the time t98. In other words, refresh of the memory cell array is spontaneously performed after a predetermined time period has elapsed from when the refresh accompanying the above described read cycle was performed.

Figure 7:
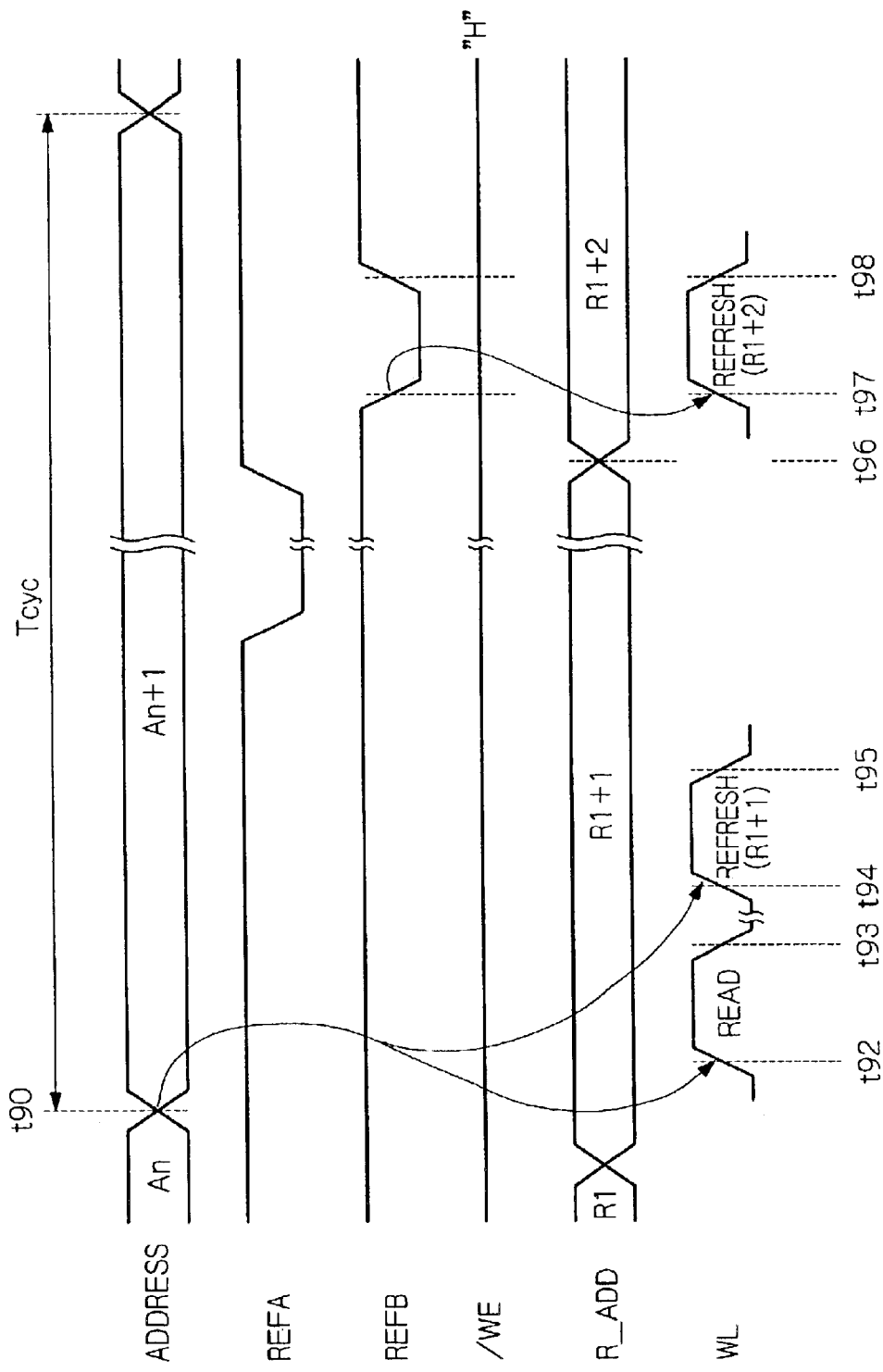
FIG. 7 is a timing chart, for the same embodiment, for explanation of why no upper limit value is required for a cycle time Tcyc.

Although the case of performing reading was explained in the example shown in FIG. 7, self refresh is also performed at a suitable timing in the case of performing late writing if the cycle time Tcyc gets long, in the same manner. Accordingly it becomes possible to keep the data in the memory cells even if the cycle time Tcyc gets long without limit, and thus, as with a normal SRAM, it becomes unnecessary to impose any upper limit upon the cycle time Tcyc, so that it is possible to relax constraints upon the timing specification.

[The Second Embodiment]

With the first embodiment, the late writing and the refresh, or the reading and the refresh, were performed within a single memory cycle (cycle time Tcyc). On the other hand, in this embodiment, an effort is made to make the cycle time shorter than that in the first embodiment and to increase the speed, by performing access twice (late writing or reading) and refresh once in, for example, two successive memory cycles.

Figure 8:
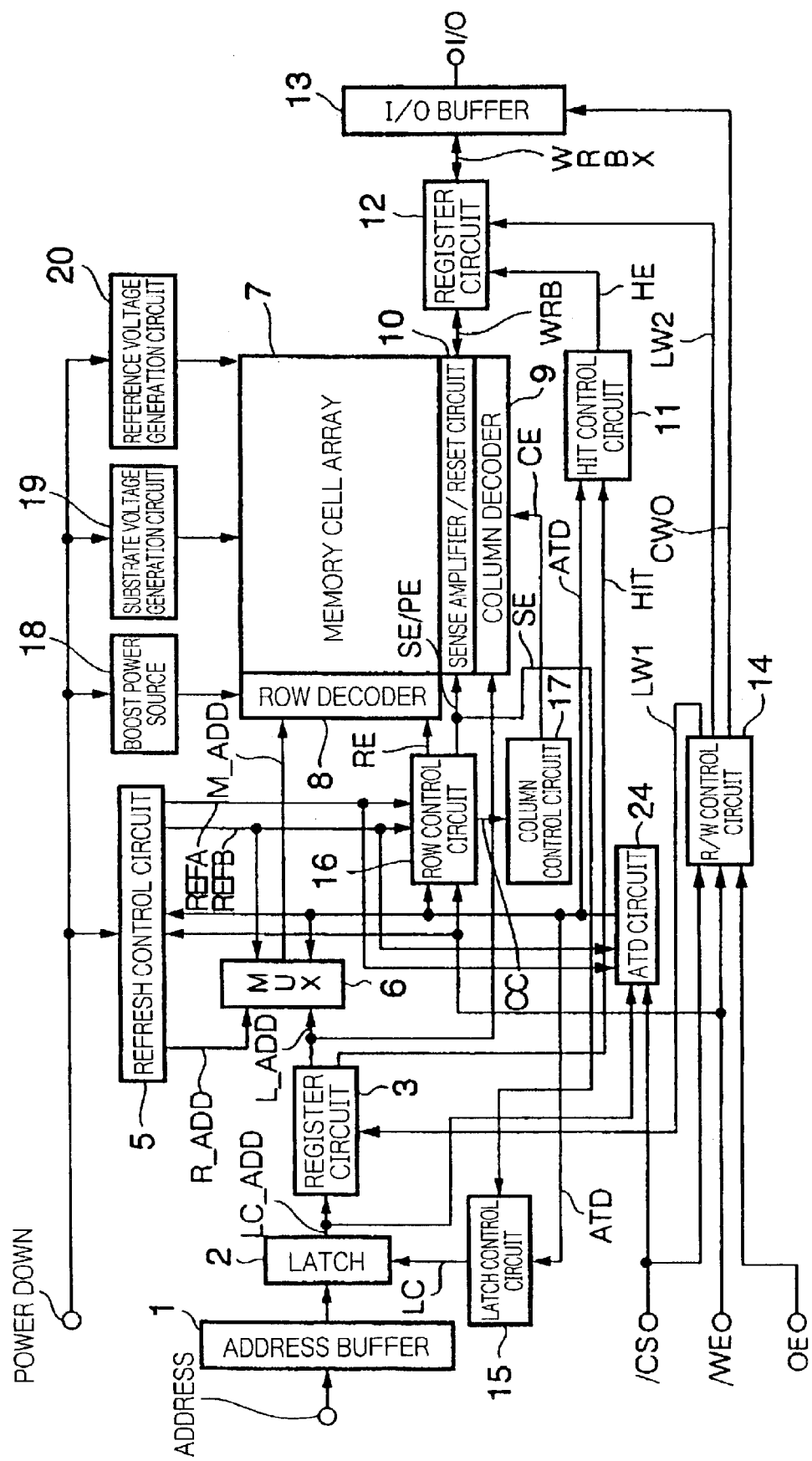
FIG. 8 is a block diagram showing the structure of a semiconductor memory device according to the second embodiment of the present invention.

FIG. 8 is a block diagram showing the structure of the semiconductor memory device of this embodiment, and herein, to structural elements which are the same as in FIG. 1, the same reference symbols are affixed. The points of difference from FIG. 1 are that instead of the ATD circuit 4 an ATD circuit 24 is provided, and that the refresh control signals REFA and REFB are further input to this ATD circuit 24. As will be described below, in this embodiment, the timing at which the address transition detect signal ATD is generated differs somewhat from the first embodiment.

That is to say, in the first embodiment, when the address skew period had elapsed from when the address "Address" had started to change, the ATD circuit 4 generated a positive one shot pulse in the address transition detect signal ATD. By contrast to this, in this embodiment, the refresh is not completed within the memory cycle in which the refresh is performed, since the cycle time is made shorter. Thus, in the memory cycle which follows after this memory cycle, the commencement of the read cycle or the late write operation is delayed until the refresh which was started in the directly preceding memory cycle is completed.

For this, it is arranged for the ATD circuit 24 to be able to detect the fact that refresh has been performed based upon the refresh control signals REFA and REFB. And, if it has been detected that refresh has been performed in the directly preceding memory cycle, the ATD circuit 24 delays the generation of the one shot pulse by the amount that the start of reading or of late writing the subsequent memory cycle is to be delayed. It should be understood that, if no refresh in the directly preceding memory cycle has been detected, the ATD circuit 24 generates the one shot pulse from when the address skew period has elapsed, just as in the first embodiment.

Figure 9:
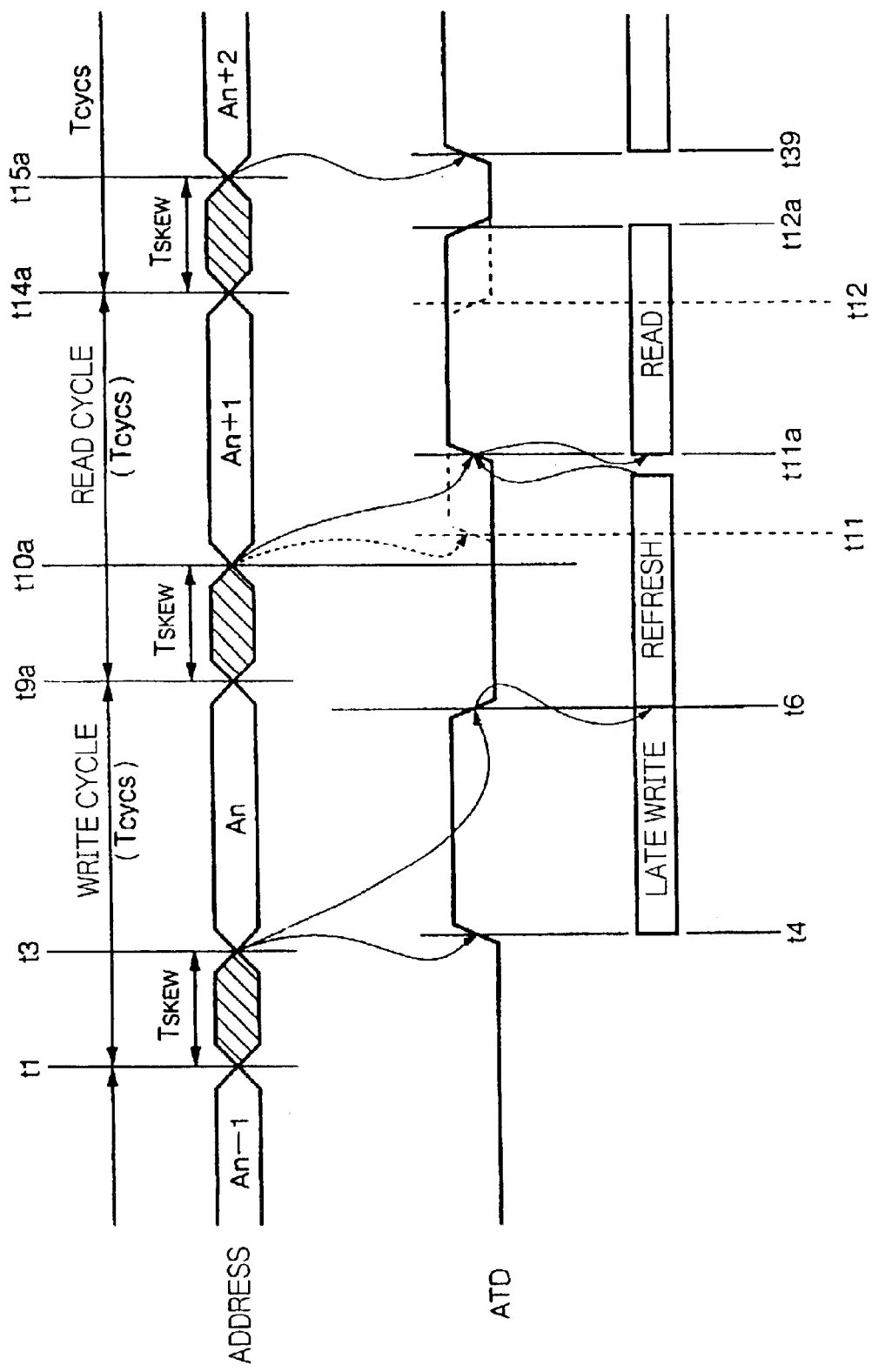
FIG. 9 is a timing chart showing the operation of the semiconductor memory device according to the same embodiment.

FIG. 9 is a timing chart showing the operation of the semiconductor memory device according to this embodiment. Since this figure is based upon the operational timing of FIG. 2 which refers to the first embodiment, to times which are the same as ones in FIG. 2 the same reference numeral are appended. In this embodiment, each of the time periods required for reading, late writing, and refresh corresponds to those in FIG. 2. On the other hand, in this embodiment, refresh is not performed each cycle as in FIG. 2; refresh is performed only a single time in a plurality of memory cycles (in the example shown in FIG. 9, two memory cycles). Furthermore, in this embodiment, the cycle time (Tcycs in FIG. 9) is set to be shorter than the cycle time Tcyc which was shown in FIG. 2 (in other words, Tcycs<Tcyc). Due to this, in this embodiment, the reading and the refresh or the late writing and the refresh come to be no longer confined within a single memory cycle.

First, the operation over the times t1 through t6 is exactly the same as the operation in FIG. 2, and late writing is performed after the address skew period. Next the change of the address "Address" starts at a time t9a which is earlier than the time t9 of FIG. 2, and the address skew period is completed and the address "Address" is determined as "An+1" at a time t10a which is earlier than the time t10 of FIG. 2. However, in this embodiment, at this time the refresh which follows the late writing is still being performed, since the cycle time has become shorter than in the case of FIG. 2.

Thus, the ATD circuit 24 delays the timing at which the one shot pulse in the address transition detect signal ATD is generated until the time point at which the refresh is completed, rather than it being at the time t11 as in FIG. 2 (refer to the broken line in the figure). By doing this, the start of the next read operation is delayed, and it is possible to avoid competition between the refresh and the reading. When subsequently the time t11a at which the refresh is completed is reached, the ATD circuit 24 generates a positive one shot pulse in the address transition detect signal ATD, and the read operation for the address "An+1" starts. It should be understood that refresh is not performed after reading in this memory cycle.

After this, the address "Address" starts to change at a time t14a which is earlier than the time t14 shown in FIG. 2, and the one shot pulse drops at a time t12a which is later than the time t12 of FIG. 2. Next, the address skew period is completed at a time t15a which is earlier than the time t5 of FIG. 2. Since at this time point the refresh of the directly preceding memory cycle has not been performed, the ATD circuit 24 generates a one shot pulse in the address transition detect signal ATD and starts access to the address "An+2" at a time t39 which is directly after the time t15a.

As described above, in this embodiment, by only performing the refresh once in the two memory cycles which correspond to the times t1 through t14a (the actual operation is over the times t3 through t15a), it becomes possible to anticipate shortening of the cycle time and increase in the speed, as compared with the first embodiment. It should be understood that, when comparing the address access time periods $T_{AA}$ for the address "An" and for the address "An+1", although the address access time period $T_{AA}$ for the address "An+1" becomes larger by the amount by which the generation of the one shot pulse has been delayed (the times t11 through t11a), if the shortening of the cycle time is given priority over the shortening of the address access time period $T_{AA}$, this embodiment is more suitable than the first embodiment.

Moreover it should be understood that, although in the above described explanation, the case in which the reading was delayed was explained, if the situation is one of late writing rather than of reading, exactly the same things happen.

Furthermore, although in FIG. 9 the reading of the address "An+1" is completed by the time t15a at which the address skew period is completed, the case is also considered in which this read operation becomes later than the time t15a. In such a case, until the read operation for the address "An+1" is completed, it will be acceptable to delay the start of the access (the late writing or reading) by delaying the timing of generation of the address transition detect signal ATD even in a memory cycle later than the address "An+2". Accordingly, in this case, a single refresh comes to be performed in three or more memory cycles.

[The Third Embodiment]

With the above described first embodiment and second embodiment, the aim was to shorten the memory cycle by performing late writing. By contrast, in this embodiment, in addition to the conditions which were imposed with the first embodiment etc., the following type of conditions are imposed. By doing this, late writing is not performed as with the first embodiment etc., but the benefits of shortening the memory cycle and so on are obtained, in the same way as with the first embodiment etc., while performing the actual writing to the memory cell in the memory cycle in which a write request took place.

That is to say, with the first embodiment etc., the case was considered in which the write data was delayed until later than the falling edge of the write enable signal/WE and was determined after the address skew period. On the other hand, with this embodiment, the specification of the semiconductor memory device is established so that the write enable signal/WE and also the write data as well are determined within the address skew period. By doing this, it becomes possible to supply the write data to the memory cells immediately after the address skew period, in the same way as in the case that late writing is performed, so that the necessity for performing late writing is unambiguously eliminated.

Figure 10:
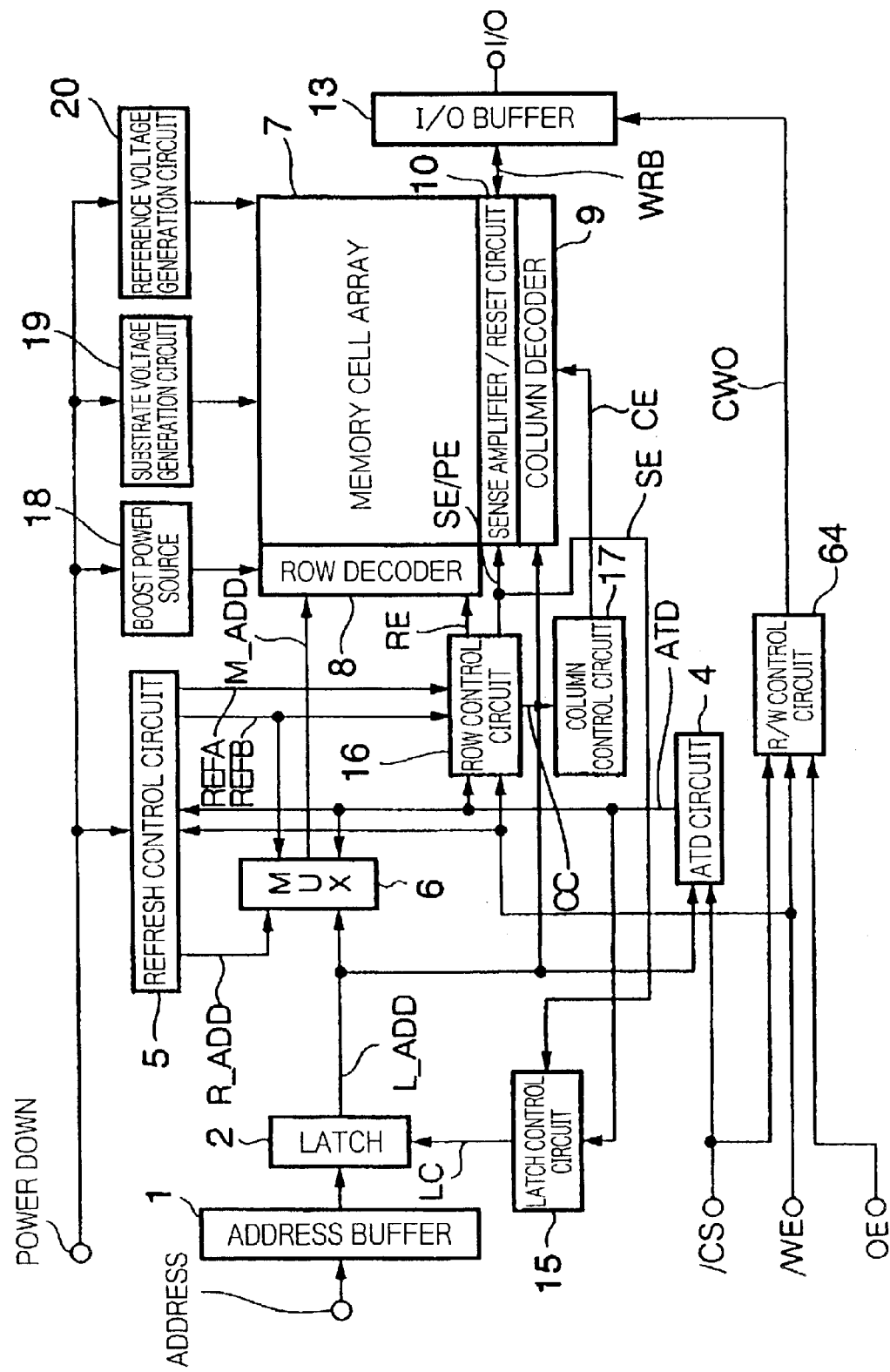
FIG. 10 is a block diagram showing the structure of a semiconductor memory device according to the third embodiment of the present invention.

FIG. 10 is a block diagram showing the structure of the semiconductor memory device of this embodiment, and herein, to structural elements which are the same as in FIG. 1, the same reference symbols are affixed. The points of difference from FIG. 1 are that the register circuit 3, the hit control circuit 11, and the register circuit 12 have become unnecessary. Due to this, the output of the latch 2 is supplied to the ATD circuit 4, the multiplexer 6, and the column decoder 9 as the internal address L_ADD. Furthermore, the R/W control circuit 64 is structured almost identically to the R/W control circuit 14 which was shown in FIG. 1, except that it differs from the R/W control circuit 14 in the point that no logic is provided for generating the control signals LW1 and LW2. Another point of difference is that the sense amplifier/reset circuit 10 and the I/O buffer 13 are connected together directly by the bus WRB.

Figure 11:
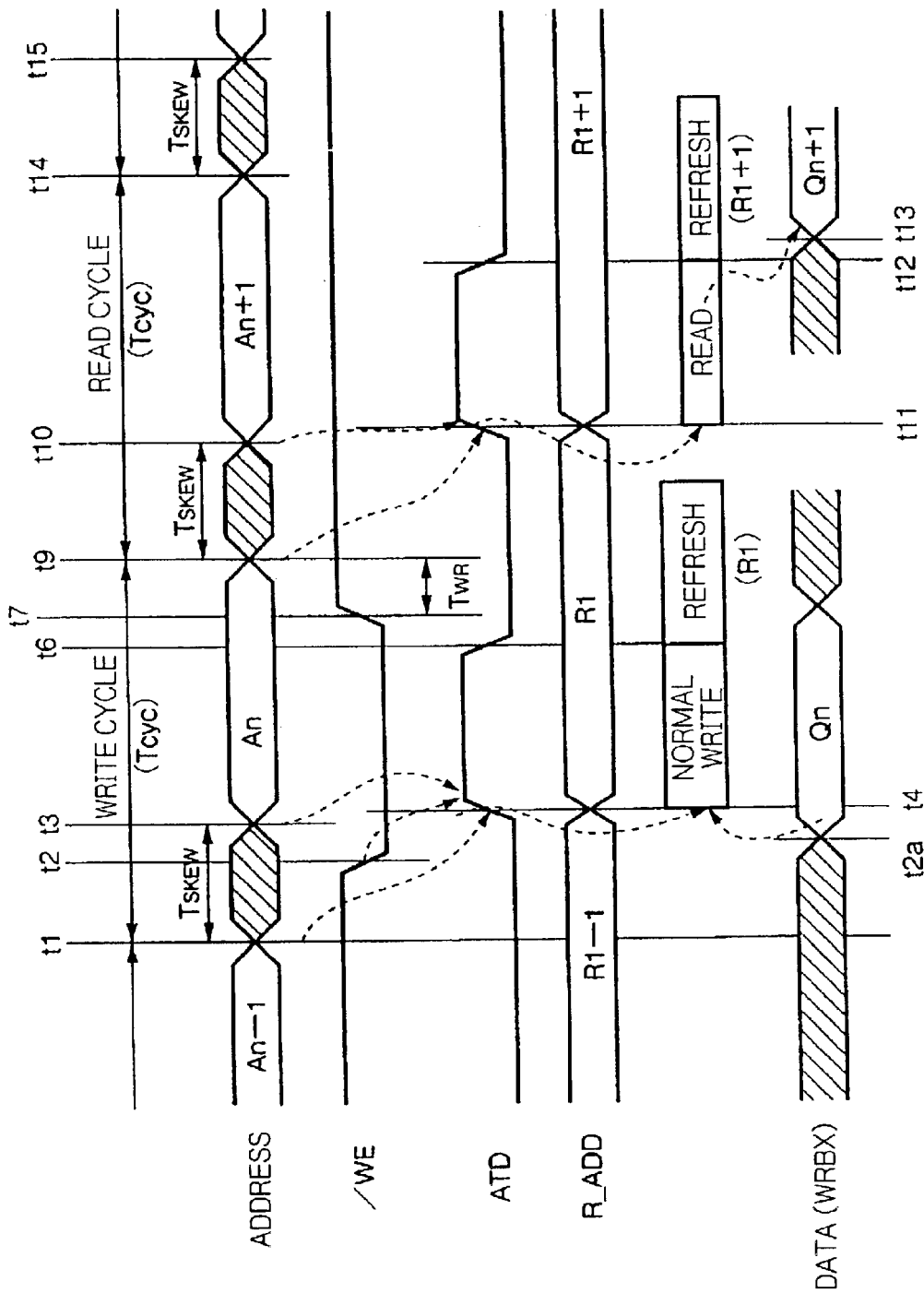
FIG. 11 is a timing chart showing, for the same embodiment, the operation in the case that, when writing (normal writing) or reading, the refreshes which follow each of these are carried out in a single memory cycle.

Next, the operation of the semiconductor memory device which is structured as described above will be explained with reference to the timing chart of FIG. 11. Since the operational timing shown by way of example in FIG. 11 takes the operational timing shown in FIG. 2 as a basis, herein only the points in which it differs from the operation of FIG. 2 will be explained. It should be understood that, without being limited to FIG. 2, this embodiment can be applied in all of the cases which were explained with regard to the first embodiment. Furthermore, in this embodiment, the data "Qn" which is to be written into the address "An" is provided at the time t2a for example, within the address skew period. Here, with this embodiment as well, the control signal CWO goes to "L" level at the time point (the time t2) that the write enable signal/WE drops, in the same way as with the first embodiment.

Thus, the write data "Qn" which is supplied upon the bus I/O is transmitted to the bus WRB via the I/O buffer 13. Furthermore, since in this embodiment the output of the latch 2 is supplied to the multiplexer 6 just as it is as the internal address L_ADD, thus the value "An" of the address "Address" which has been determined at the time t3 is supplied to the row decoder 8 as the address M_ADD. Accordingly it becomes possible, from when the address transition detect signal ATD rises at the time t4, to write the data "Qn" for the address "An" according to normal write operation (normal writing; in the drawing, "Normal Write").

In the above manner, according to this embodiment, along with the register circuit 3, the register circuit 11, and the hit control circuit 12 being unnecessary as in the first embodiment, since it is not necessary to generate the control signals LW1 and LW2 by the R/W control circuit 64, it is possible to scale down and simplify the circuit structure. It should be noted that, in the above described explanation, it has been presumed that the write data is determined from when the write enable signal/WE drops. However it would also be acceptable to determine the write data within the address skew period, and the timings of the falling edge of the write enable signal/WE and of the determination of the write data may be as desired, provided that they fall within the address skew period. Furthermore, since in this embodiment it is not necessary for the write address and the write data to be taken in at the rising edge of the write enable signal/WE (the time t7), therefore it will be acceptable, provided that the write address "An" and the write data "Qn" are guaranteed to be available within the time period which is required for normal writing.

[The Fourth Embodiment]

Figure 12:
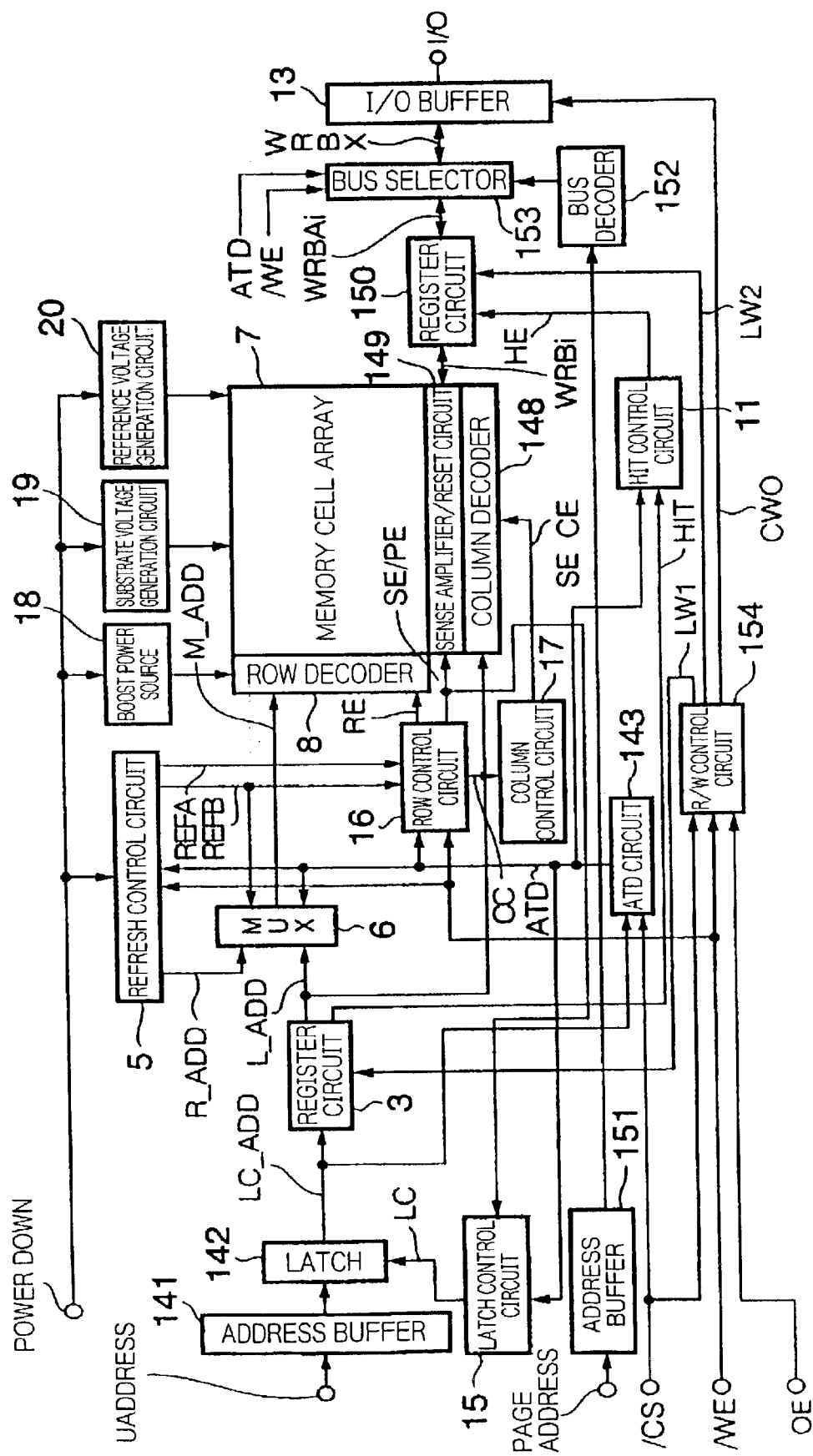
FIG. 12 is a block diagram showing the structure of a semiconductor memory device according to the fourth embodiment of the present invention.

This embodiment is one in which the same function as the page mode which is employed in a general-purpose DRAM or the like is implemented. FIG. 12 is a block diagram showing the structure of the semiconductor memory device of this embodiment, and herein, to structural elements and signal designations which are the same as in FIG. 1, the same reference symbols are affixed. With this embodiment, by dividing the address "Address" which was explained in the first embodiment into an upper bits side address "UAddress" and a lower bits side address "PageAddress", it is made possible to input and output data for which the bits in the address "UAddress" are the same continuously, by only changing the address "PageAddress".

For example, since in this embodiment the address "PageAddress" is taken as being of two bit width, it is possible to access data of four consecutive addresses continuously by making the address "PageAddress" to be variable within the range "00" B through "11" B (here "B" denotes a binary number). It should be noted that the width of the address "PageAddress" is not limited to being two bits; any number of bits within the range two bits through the number of bits of the column address included in the address "Address" would be acceptable. Furthermore, in this embodiment, along with making it possible to select four bits of data by the address "PageAddress", instead of the bus WRB which was shown in FIG. 1, four buses WRB1 (where i takes a value from 0 through 3) are provided. Due to this, it is arranged that, when the value of the address "PageAddress" is "00"B through "11"B, the bit data of the memory cells which are designated by these addresses are respectively input and output through the buses WRB0 through WRB3.

Next, the address buffer 141, the latch 142, the ATD circuit 143, the column decoder 148, and the sense amplifier/reset circuit 149 are structured the same as the address buffer 1, the latch 2, the ATD circuit 4, the column decoder 9, and the sense amplifier reset/circuit 10 which were shown in FIG. 1. Since in this embodiment the address "UAddress" is used instead of the address "Address" as in the first embodiment, the structure of these circuits is somewhat different, insofar as there are differences in the bit widths of these addresses. Moreover, the sense amplifier/reset circuit 149 is further somewhat different.

That is, in this embodiment, the four bits of data for each of the column addresses included in the internal address L_ADD have come to be input and output upon the buses WRB0 through WRB3 respectively. Due to this, the sense amplifier/reset circuit 149 selects neighboring four bit lines within the memory cell array 7 at the same time, according to the column select signal which is output from the decoder 148, and respectively connects together the four sense amplifiers which are connected to these bit lines and the buses WRB0 through WRB3. It should be noted that, since the address "PageAddress" is not input to the ATD circuit 143, if access is performed to the address "PageAddress" which is changing continuously, no one shot pulse is generated in the address transition detect signal ATD.

In addition to this, the register circuit 150 has the same structure as the register circuit 12 which was shown in FIG. 1, but with the bus width of the bus WRB being widened and corresponding to the buses WRB0 through WRB3, and with the data width which is taken in and handled at the same time by the register circuit 150 being made to be four times that of the register circuit 12. Next, an address buffer 151 has the same structure as the address buffer 1, except for the point of difference that the bit width of the address is different, and that buffers the address "PageAddress". Furthermore, a bus decoder 152 decodes two bits worth of page address which is output from the address buffer 151, and outputs four bus select signals.

Next, a bus selector 153 is connected to the register circuit 150 via buses WRBAi which have the same widths as the buses WRBi, and it connects one or another from among the buses WRBA0 through WRBA3 with the bus WRBX, according to the bus select signals which are output from the bus decoder 152. Furthermore the bus selector 153 internally contains latch circuits which respectively correspond to the buses WRBA0 through WRBA3, for reading from the memory cell array 7. Since these latch circuits sequentially output the data upon the buses WRBAi to the exterior in parallel with refresh operation, they are arranged to take in the data which has been read out upon the buses WRBA0 through WRBA3 simultaneously upon the falling edge of the address transition detect signal ATD.

Due to this, the ATD circuit 143 determines the one shot pulse width of the address transition detect signal ATD so that this address transition detect signal ATD drops from when the read operation is completed and the data upon the buses WRBA0 through WRBA3 is accurately reading. On the other hand, in the case of a write operation, upon trigger by the rising edge of the write enable signal/WE, along with the bus selector 153 transmitting the write data upon the bus WRBX to any one from among the buses WRBA0 through WRBA3 which has been designated by the above described bus selection signal, it also latches said write data to the internal latch circuit which corresponds to any one from among the buses WRBA0 through WRBA3.

Next, although the R/W control circuit 154 is structured almost the same as the R/W control circuit 14 which was shown in FIG. 1, the timing for generation of the control signals LW1 and LW2 is somewhat different. That is to say, in the first embodiment, the R/W control circuit 14 dropped both of the control signals LW1 and LW2 each time the write enable signal/WE rose. On the other hand, with the R/W control circuit 154 of this embodiment, upon trigger by the fourth rising edge of the write enable signal/WE (in other words, at the timing of completion of one page of writing), the control signals LW1 and LW2 are both dropped after the rising edge of the write enable signal/WE, with a certain delay.

Next, the operation of the semiconductor memory device which employs the above described structure will be explained. First, the page read operation will be explained with reference to the timing chart of FIG. 13. The operation in this figure is based upon the operation of FIG. 2 which has been explained with reference to the first embodiment, and is the (miss-hit) case in which the data is reading, not from the data register in the register circuit 150, but rather from the memory cell array 7.

Figure 13:
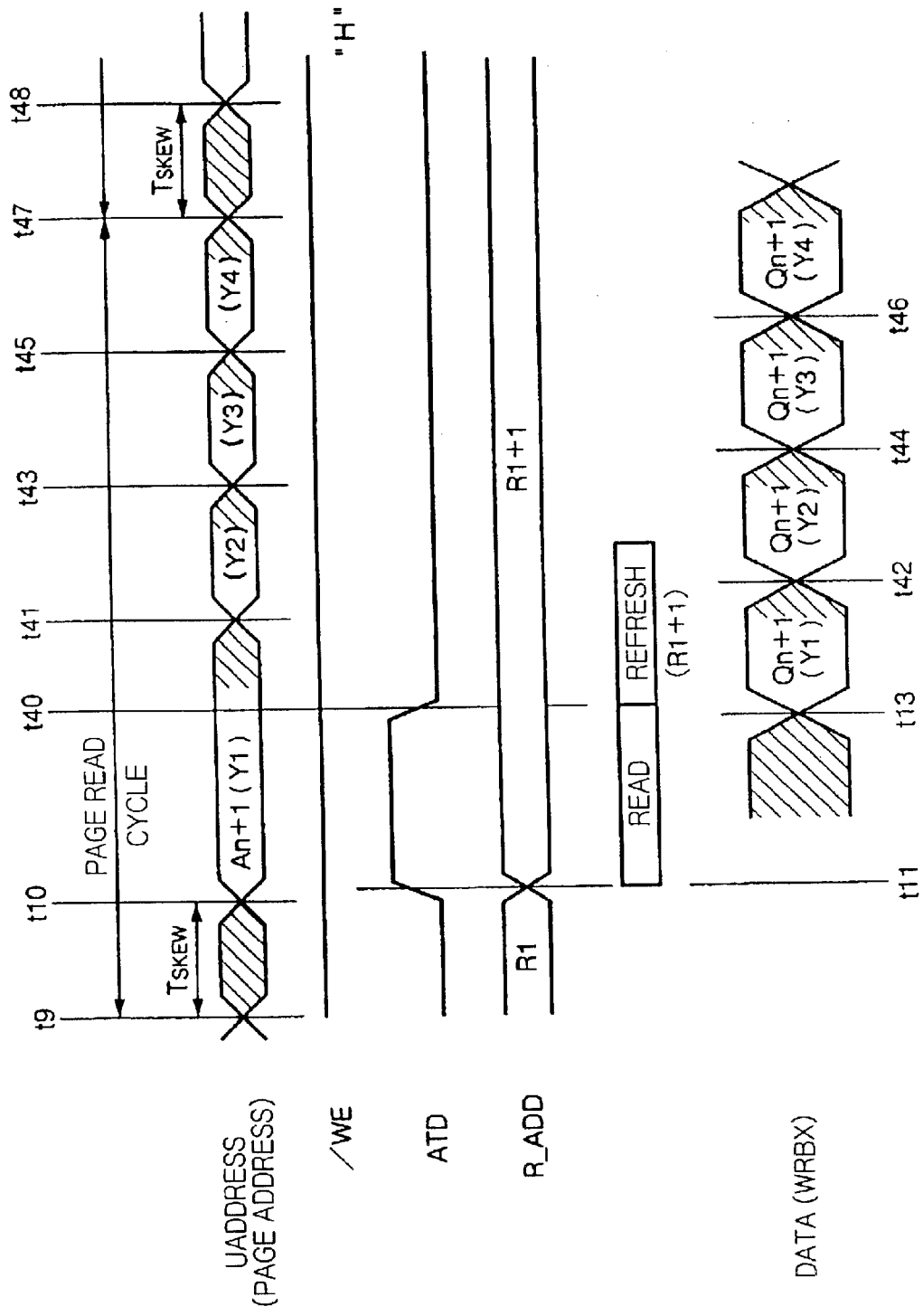
FIG. 13 is a timing chart showing, for the same embodiment, the operation in the case when page reading and the refresh following it are carried out.

In the following, principally the points of difference from the operation of FIG. 2 will be explained. It should be understood that this embodiment is not limited to the case of FIG. 2; the explanation for the first embodiment can be applied in the same way in the case of the others as well. Here, "Y1" through "Y4" shown in FIG. 13 are any values from "00"B through "11"B, and here, in order to distinguish from the burst operation which will be described hereinafter, it will be assumed that the values "Y1" through "Y4" are respectively "11"B, "10"B, "01"B, and "00"B.

First at the time t10, just as in FIG. 2, "An+1" is supplied as the address "UAddress". However, at this time, the address "PageAddress" is now "Y1". Due to this, at the time t11 the address transition detect signal ATD rises, and the operation commences for reading the four memory cells which are designated by the address An+1 (in other words, whose lower addresses are "00"B through "11"B) upon the buses WRB0 through WRB3, respectively.

Here the hit enable signal is "L" level since this is a miss-hit, and the control signal LW2 is also at "L" level since this is reading, and the register circuit 150 connects through between the buses WRBi and the buses WBAi. Furthermore, since at this time the value of the address "PageAddress" is "11"B, the bus decoder 152 decodes the value "11"B of the address "PageAddress" "Y1" which it has received via the address buffer 151. As a result, the bus selector 153 selects the bus WRBA3 and connects it with the bus WRBX.

When thereafter the device reaches the time t13, the four bits of data which starts from the address "An+1" is read out upon the buses WRB0 through WRB3, and is output upon the buses WRBA0 through WRBA3 via the register circuit 150. Furthermore, the value Qn+1(Y1) of the address An+1 (Y1) which was read out upon the bus WRBA3 is output upon the bus WRBX, and is then output to the exterior via the I/O buffer 13 and the bus I/O. When by doing this the reading has been completed, the ATD circuit 143 drops the address transition detect signal ATD at the time t40. By doing this, the bus selector 153 takes the four bits of data which is read out upon the buses WRBA0 through WRBA3 into the internal latch circuit. Furthermore at this time, in the same way as in the case of FIG. 2, the refresh operation is initiated and refresh for the address "R1+1" is performed.

By appropriately continuing to change the address "PageAddress" while this refresh operation is being performed, it is possible to sequentially read out the data in the memory cells designated by the same address UAddress (="An+1"). In other words, when at the time t41 "Y2" (="10"B) is supplied as the address "PageAddress", the bus selector 153 selects the data which is being kept by the internal latch circuit corresponding to the bus WRBA2, and outputs it upon the bus WRBX. By doing this, when the device reaches the time t42, the data "Qn+1 (Y2)" which is being stored in the address of the lower address "10"B is output to the outside from the bus I/O.

Proceeding in the same manner henceforward, when at the time t43 "Y3" (="01"B) is supplied as the address "PageAddress", the data which is being kept by the latch circuit corresponding to the bus WRBA1 is output upon the bus WRBAX, and at the time t44 the data "Qn+1 (Y3)" which is being stored in the address of the lower address "01"B is output to the outside from the bus I/O. Furthermore, when at the time t45 "Y4" (="00"B) is supplied as the address "PageAddress", the data which is being kept by the latch circuit corresponding to the bus WRBA0 is output upon the bus WRBX, and at the time t46 the data "Qn+1 (Y4)" which is being stored in the address of the lower address "00"B is output to the outside from the bus I/O.

Although the above is the operation in the case of a miss-hit, the bypass operation which is performed in the case of a hit is almost the same. However, in this case, when at the time t11 the address transition detect signal ATD rises, the hit enable signal HE goes to "H" level. Furthermore, since at this time the control signal LW2 is "L" level, the register circuit 150 outputs the data "Qn+1 (Y1 through Y4)" which is being kept in the data register simultaneously upon the buses WRBA3 through WRBA0. And the operation thereafter is exactly the same as in the case of a miss-hit, with the data "Qn+1 (Y1 through Y4)" output upon the buses WRBA3 through WRBA0 continuing to be sequentially output to the outside.

Since in this manner, with this embodiment, the entire reading of four data items is completed by the time t13, as compared with the initial address "Y1" (the times t10 through t41), it is possible to change the second and subsequent addresses "Y2" through "Y4" (the times t41 through t43, the times t43 through t45, and the times t45 through t47) at high speed. Due to this, as compared with the address access time period for the initial data (the times t10 through t13), it is also possible to shorten the second and subsequent address access time periods (the times t41 through t42, the times t43 through t44, and the times t45 through t46).

And, with the page read operation of this embodiment, at the time point that the data of the memory cells comes to be output upon the bus WRBi, the read operation from the memory cell array 7 is completed and the device transits to the refresh operation. Due to this, it is possible to complete the refresh for the memory cell array 7 while the page reading is being performed to the exterior of the semiconductor memory device. Accordingly it becomes possible to shorten the cycle time to the extent that, when seen from the exterior, the refresh period is not seen to be completed.

Next, the page write operation will be explained with reference to the timing chart of FIG. 14. Since the operation of this figure is also based upon the operation of FIG. 2 which was explained for the first embodiment, in the following principally the points of difference will be explained. Here, it will be assumed as a precondition that, in the memory cycle before the one shown in FIG. 14, a write request has occurred for the data "Qx (Y1 through Y4)" in the four addresses whose address "UAddress" is "Ax". Due to this, it will be assumed that the address "Ax" is being kept in the address register within the register circuit 3, and that the data "Qx (Y1 through Y4)" is being kept in the data register within the register circuit 150.

First, the operation up to the times t1 through t4 is the same as in FIG. 2. However, in this embodiment, when at the time t2 the write enable signal/WE drops, the register circuit 150 transmits the data items "Qx (Y1 through Y4) which is being kept in its data register simultaneously to the buses WRB3 through WRB0 respectively. And when the device reaches the time t4 and the late write operation commences, the data items "Qx (Y1 through Y4)" are written in to the four addresses starting from the address "Ax", respectively.

When thereafter the device reaches the time t5, the write data "Qn (Y1)" is supplied upon the bus I/O corresponding to the address "An (Y1)" (Y1="11"B). Since at this time point the control signal CWO is "L" level, the I/O buffer 13 outputs the data upon the bus I/O just as it is upon the bus WRBX. Next, the write enable signal/WE rises at the time t7, but, in this embodiment, input into the address register and into the data register is not performed at this time point. And at the time t51 the bus selector 153 latches the data "Qn (Y1)" to the internal latch circuit which corresponds to the bus WRBA3 designated by the bus selection signal from the bus decoder 152, and also transmits this write data upon the bus WRBA3.

Thereafter the write data is sequentially supplied, along with appropriately continuing to change just the address "PageAddress". In other words, at the time t52 the address "PageAddress" changes to "Y2" (="10"B), and when the time t53 arrives the write data "Qn (Y2)" for the address "An (Y2)" is transmitted via the bus I/O upon the bus WRBX. And at the time t54 the write enable signal/WE drops. However, since in this case the address "UAddress" is not changing, no one shot pulse is generated in the address transition detect signal ATD, and neither late writing nor refresh is performed.

When at the subsequent time t55 the write enable signal/ WE rises, the bus selector 153 latches the data "Qn (Y2)" to the internal latch circuit which corresponds to the bus WRBA2 at the time t56, and also transmits this write data upon the bus WRBA2. In the same manner subsequently, at the time t57 the address "PageAddress" changes to "Y3" (="01"B), and at the time t58 the write data "Qn (Y3)" for the address "An (Y3)" is transmitted upon the bus WRBX, and at the time t59 the write enable signal/WE drops.

Next, when at the time t60 the write enable signal/WE rises, the bus selector 153 latches the data "Qn (Y3)" to the latch circuit which corresponds to the bus WRBA1 at the time t61, and also transmits this data upon the bus WRBA1. Next, at the time t62 the address "PageAddress" changes to "Y4" (="00"B), and at the time t63 the write data "Qn (Y4)" for the address "An (Y4)" is output upon the bus WRBX, and at the time t64 the write enable signal/WE drops.

Next the rising edge of the write enable signal/WE takes place at the time t65, and the bus selector 153 latches the data "Qn (Y4)" to the latch circuit which corresponds to the bus WRBA0 at the time t66, and also transmits this data upon the bus WRBA0. Next, in response to the fact that the write enable signal/WE has risen at the time t65, and the R/W control circuit 154 drops the control signals LW1 and LW2 together. As a result the register circuit 3 takes in the value "An" of the address LC_ADD into the address register, and the register circuit 150 takes in the data "Qn (Y1through Y4)" upon the buses WRBA3 through WRBA0 into the internal data register. Due to this, the address and the data which are used for late writing when the next write request occurs are prepared. With the above, a single page write operation is completed.

As described above, in the case of page writing as well, it is possible to change the second and subsequent address (the times t52 through t57, t57 through t62, and t62 through t65) at high speed, as compared with the initial address (the times t3 through t52). Furthermore, the second and subsequent write time periods (the times t54 through t55, t59 through t60, and t64 through t67) also become shorter, as compared with the write time period for the initial data (the times t2 through t7). And, with the page write operation of this embodiment, if each page is made up of four data items (the page address is two bits), then the data Qx (Y1 through Y4) is stored in the data registers in the register circuit 150 corresponding to the buses WRB3 through WRB0, and it is possible to write all of these four data items to the memory cell array 7 all together collectively.

Furthermore, since this collective writing is late writing, the write operation is completed at an early timing within the memory cycle in which the actually page writing is performed, and it is possible to shift to refresh operation at almost the same timing as in the case of page reading. Due to this, it is possible to complete the refresh operation during the supply of data for the page writing from externally, so that the refresh period becomes completely invisible when seen from externally, just as in the case of reading, which is beneficial for reduction of the cycle time.

It should be understood that, in the above explanation, the keep period for the address "PageAddress" (Y1) the first time is taken as being long as compared with the second and subsequent addresses "PageAddress" (Y2 through Y4), and corresponding to this, for the widths of the write pulses as well, the first one is taken as being wider. However, late writing is performed in this embodiment, and at the timing shown in FIG. 14 the address "PageAddress" and the write enable signal/WE are only used for taking in the write data. Accordingly, it would also be acceptable to reduce the keep period and the write pulse for the address "PageAddress" the first time, so as to take them as being the same as the keep period and the write pulse the second and subsequent times. Furthermore, it would also be acceptable to shorten the keep period and the write pulse to narrower widths than those shown in the drawing for the address "PageAddress" the second and subsequent times.

Figure 15:
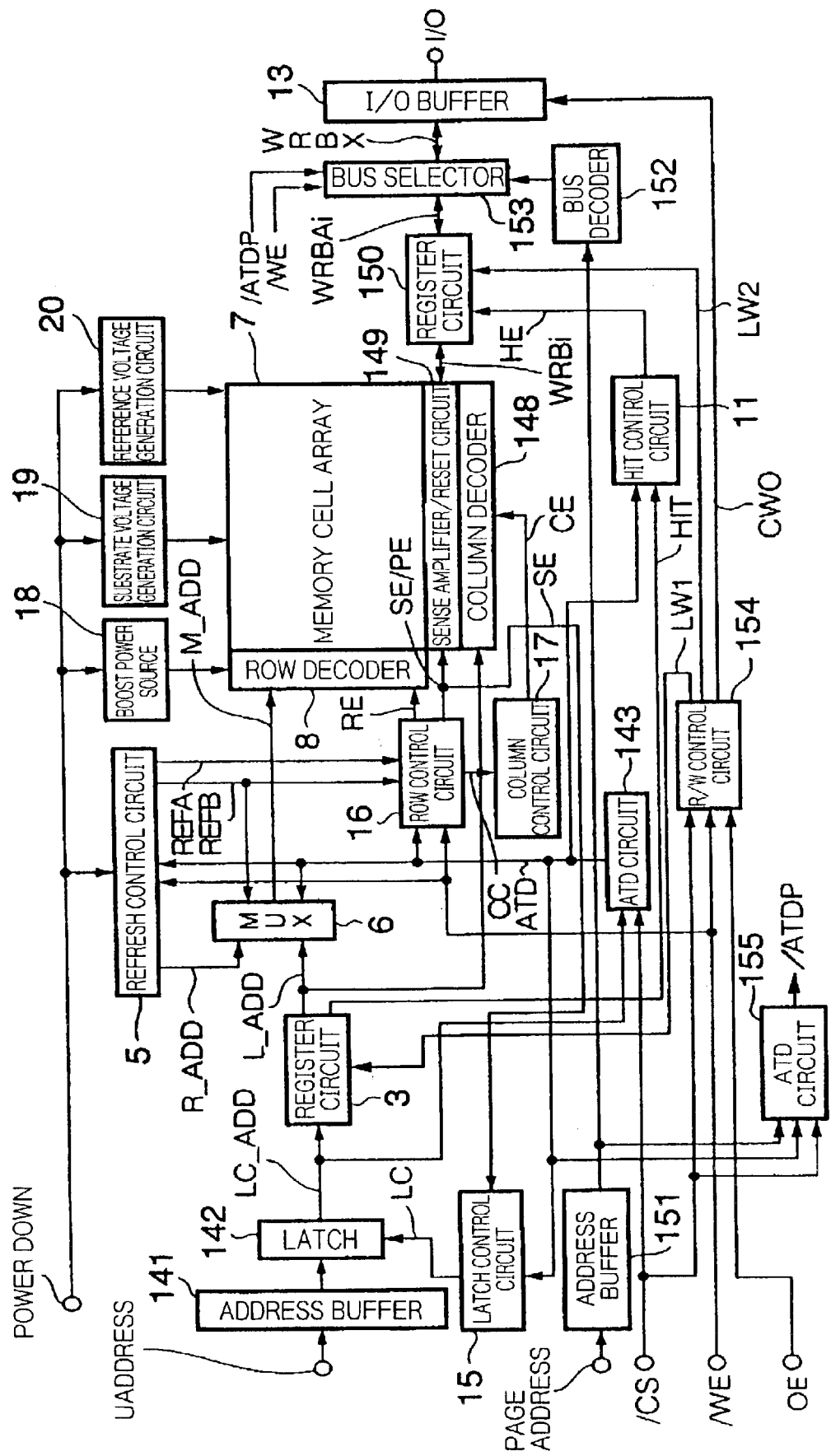
FIG. 15 is a block diagram showing another example of the structure of a semiconductor memory device according to the fourth embodiment of the present invention, and relates to the case that, when page reading is performed, the read data is taken in at a timing at which an address "PageAddress" has initially been changed.

Furthermore, in the above explanation, in the operation of page reading shown in FIG. 13, the data upon the buses WRBAi was taken into the latch circuit within the bus selector 153 upon the falling edge of the address transition detect signal ATD. However, instead of this, it would also be acceptable to detect the timing that, at the time t41, the address "PageAddress" changed from "Y1" to "Y2", and to take the data into the latch circuit within the bus selector 153. FIG. 15 is a block diagram showing the structure of the semiconductor memory device according to this type of variant embodiment, and therein, to structural elements which are the same as in FIG. 12, the same reference symbols are affixed.

The point of difference with FIG. 12 is that, separately from the ATD circuit 143, a dedicated ATD circuit 155 is provided for detecting change of the address "PageAddress". This ATD circuit 155 generates a negative one shot pulse in an address transition detect signal/ATDP when it detects change of the address "PageAddress". At this time, after the address "UAddress" has changed, it is necessary to generate a one shot pulse just at the timing that the address "PageAddress" has initially changed.

For this, after the ATD circuit 155 has detected the rising edge of the address transition detect signal ATD, it generates a one shot pulse in the address transition detect signal/ATDP only when the address PageAddress has changed. And subsequently the ATD circuit 155 is arranged not to generate any one shot pulse in the address transition detect signal/ATDP, even if the address "PageAddress" changes, until the address transition detect signal ATD rises again. In addition to this, the address transition detect signal/ATDP is supplied to the bus selector 153, instead of the address transition detect signal ATD. And the bus selector 153 is arranged to detect the falling edge of the negative one shot pulse which is generated in the address transition detect signal/ATDP, and to take in the read data upon the buses WRBAi into the internal latch circuit.

Figure 14:
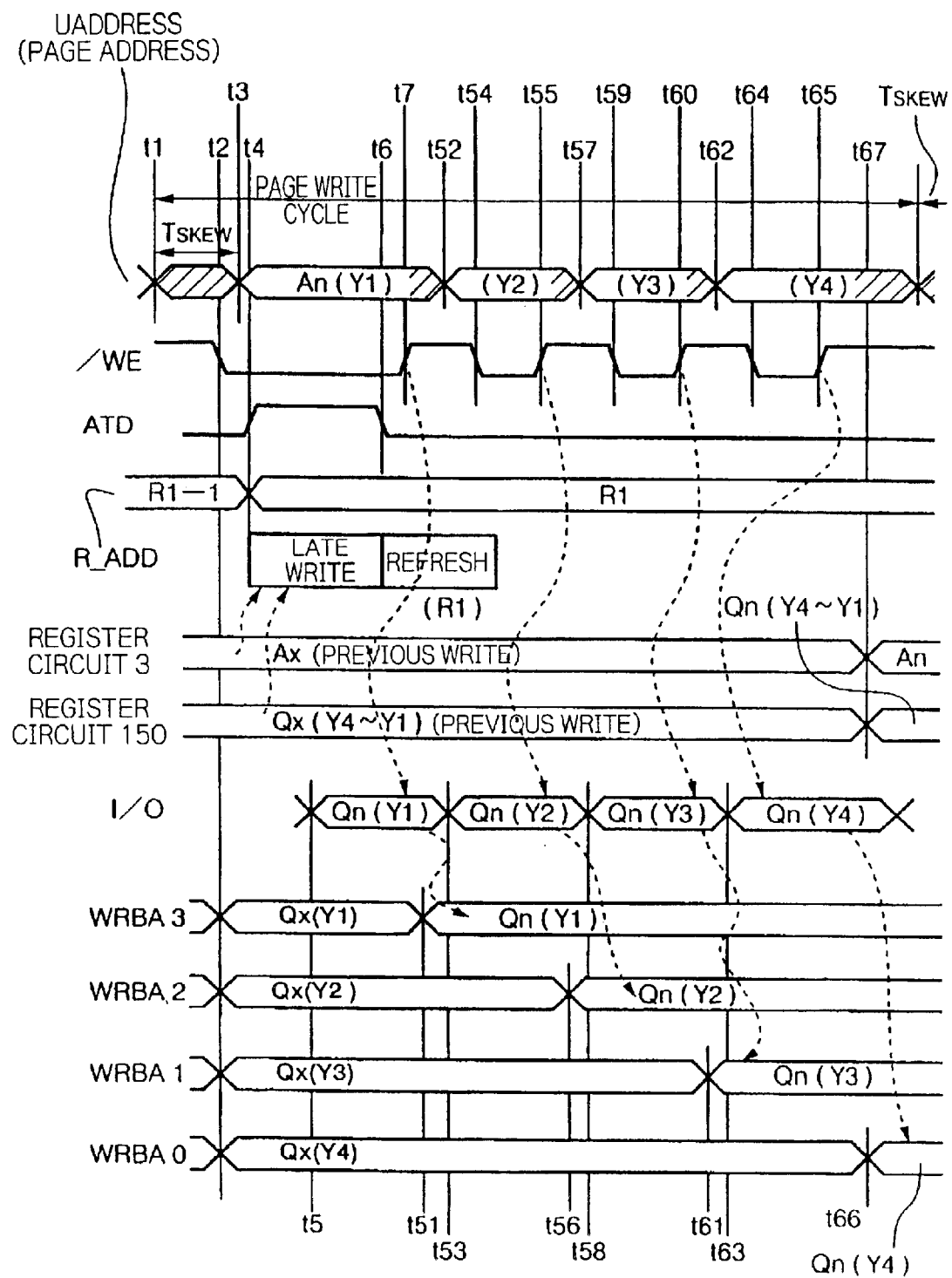
FIG. 14 is a timing chart showing, for the same embodiment, the operation in the case when page writing and the refresh following it are carried out.

Furthermore, according to the above description of FIGS. 13 and 14, it was arranged to perform the refresh just once. However, in FIG. 13 for example, when the refresh which started from the time t40 is completed, during the time period until the time t48 (the complete timing of the address skew period of the next memory cycle), no access is made to the memory cell array 7. Accordingly, it would also be acceptable to perform the refresh a plurality of times, by taking advantage of this empty time period which exists in FIGS. 13 and 14.

[The Fifth Embodiment]

This embodiment is one for performing burst operation, in addition to the functional constraints in page mode operation which have been explained for the fourth embodiment. Burst mode is the same as page mode, in the point that reading or writing are performed at high speed by changing the lower address among the address "Address". However, the methods of supplying the address in burst mode and in page mode are different. That is to say, in page mode operation, since it is specified that all the lower addresses are directly input from the outside, therefore it is possible to designate the sequence of the lower addresses randomly from the outside.

For example, although in the fourth embodiment the address "PageAddress" was supplied in the order "11"B through "00"B, it would also be acceptable for this to be, for example, in the order "10"B, "01"B, "00"B, "11"B or the like. By contrast to this, in the burst mode, the information for the lower addresses which is provided from the outside is only the lower address which is used at the start of burst operation. In other words, in the burst mode, corresponding to the trigger for starting burst operation, the lower addresses other than the one supplied at the start are sequentially generated internally, with the sequence for generation of these lower addresses being determined in advance.

Here, a linear method and an interleaved method and the like are representative of the sequence in which the lower addresses are to be generated. The former of these is a method in which the address is steadily increased by "1" at a time. For example, if the lower address is two bits, the lower addresses proceed to be sequentially generated in, for example, the following manner, corresponding to the value of the start address:

| (Start Address) | (Lower Addresses) |
| --- | --- |
| "00"B: | "00"B → "01"B → "10"B → "11"B |
| "01"B: | "01"B → "10"B → "11"B → "00"B |
| "10"B: | "10"B → "11"B → "00"B → "01"B |
| "11"B: | "11"B → "00"B → "01"B → "10"B |

On the other hand, the latter method is one which is applied in the case of interleaved operation of the semiconductor memory device, and the lower addresses proceed to be sequentially generated in, for example, the following manner, corresponding to the value of the start address:

| (START ADDRESS) | (LESS SIGNIFICANT ADDRESSES) |
| --- | --- |
| "00"B: | "00"B → "01"B → "10"B → "11"B |
| "01"B: | "01"B → "00"B → "11"B → "10"B |
| "10"B: | "10"B → "11"B → "00"B → "01"B |
| "11"B: | "11"B → "10"B → "01"B → "00"B |

Figure 16:
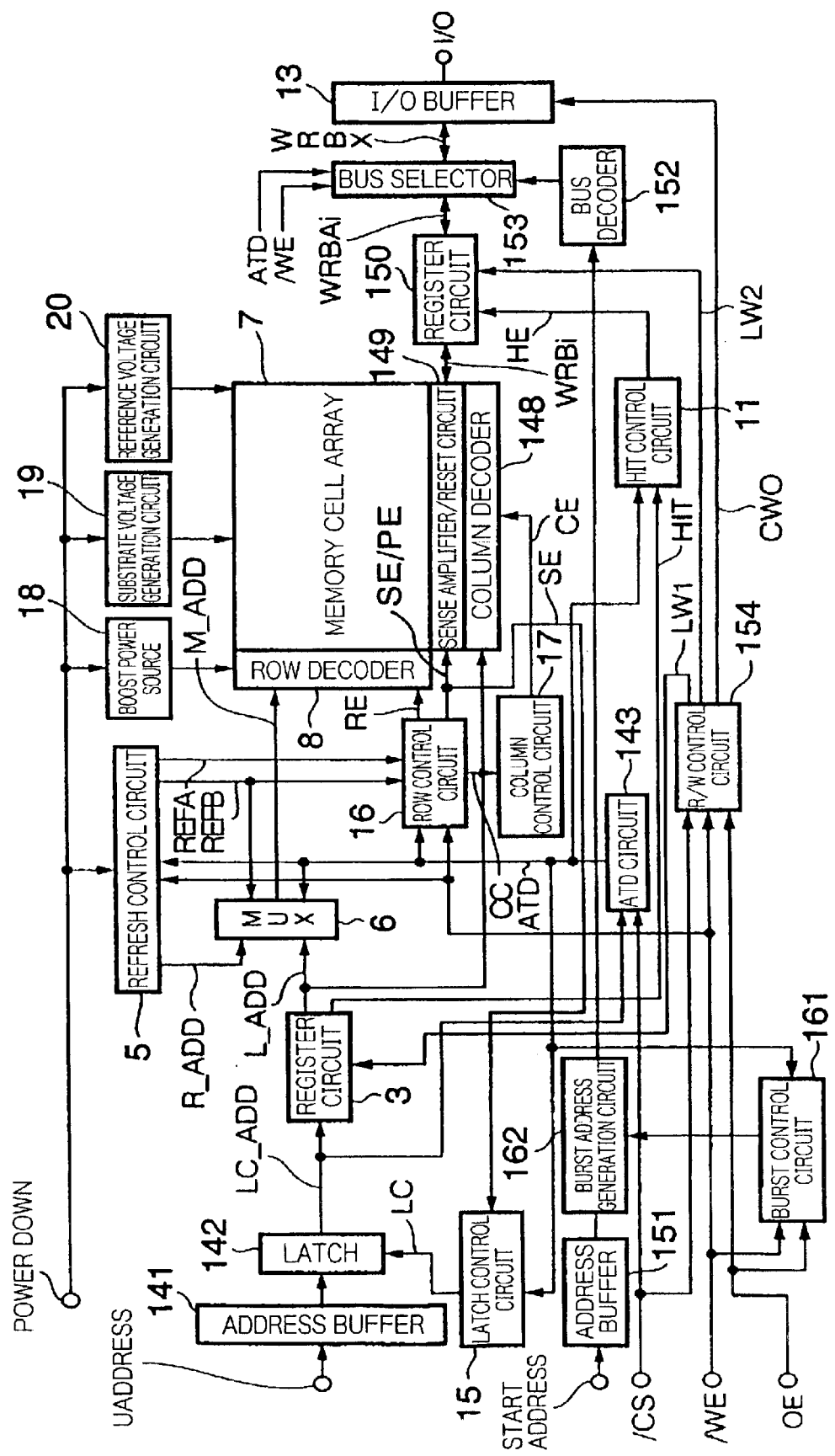
FIG. 16 is a block diagram showing the structure of a semiconductor memory device according to the fifth embodiment of the present invention.

Next, FIG. 16 is a block diagram showing the structure of the semiconductor memory device of this embodiment, and herein, to structural elements which are the same as in FIG. 12 (the fourth embodiment), the same reference symbols are affixed. In FIG. 16, a burst control circuit 161 and a burst address generation circuit 162 have been added to the structure of FIG. 12. Furthermore, since the lower address of the address "Address" designates the start address of burst operation, this is termed "StartAddress", instead of "PageAddress" as shown in FIG. 12.

The burst control circuit 161 outputs four trigger signals from the rising edge of the address transition detect signal ATD, upon trigger by the output enable signal OE (in the case of reading) or by the write enable signal/WE (in the case of writing). It should be understood that the timing of generation of these trigger signals will be described in detail along with the explanation of operation given hereinafter. Next, when the initial one from among the four trigger signals has been presented, the burst address generation circuit 162, while treating the address which is output from the address buffer 151 as the start address, continues to generate a lower address according to the above described linear method or interleaved method, each time a trigger signal is presented thereafter.

Figure 17:
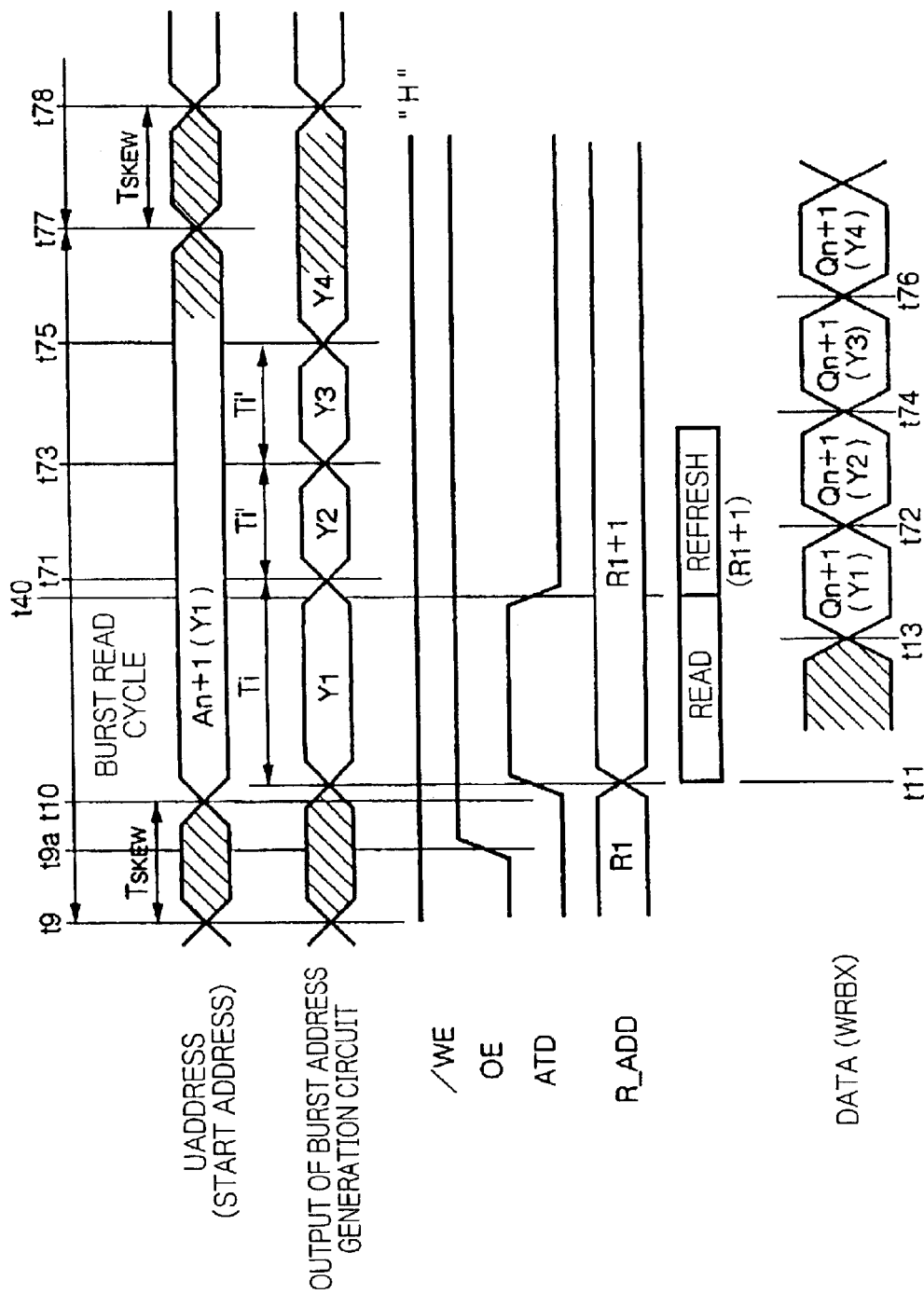
FIG. 17 is a timing chart showing, for the same embodiment, the operation in the case that burst reading and the refresh following it are carried out.

Next, the operation of the semiconductor memory device according to the above described structure will be explained. Although initially the burst read operation will be explained with reference to FIG. 17, since this operation is based upon the operation for page reading of the fourth embodiment, here the points of difference from FIG. 13 will be explained. First, when the output enable signal OE becomes valid at the time t9a within the address skew period, the burst control circuit 161 goes into a state in which it is capable of outputting trigger signals. Thereafter, when the device reaches the time t10, along with "An+1" being supplied as the address "UAddress", "Y1" is supplied as the address "StartAddress".

And when the device reaches the time t11 and the address transition detect signal ATD rises, the burst control circuit 161 outputs a trigger signal to the burst address generation circuit 162. Due to this, along with the burst address generation circuit 162 taking the address "Y1" which is being output from the address buffer 151 internally, it outputs this to the bus decoder 152. When this is done, four addresses of reading is started for the address "An+1", just as in the fourth embodiment, and when the device reaches the time t13, the data "Qn+1 (Y1)" among the data which has appeared upon the buses WRB0 through WRB3 is output upon the bus WRBX.

Thereafter, at the time t40 the address transition detect signal ATD drops and the device transits to the refresh operation. Next, when a time period Ti elapses from the time t11 and the device reaches the time t71, the burst control circuit 161 outputs the second trigger signal, and the burst address generation circuit 162 changes its output to "Y2". It should be understood that the time period Ti is set to be later than the time t13 at which the reading from the memory cell array 7 is completed. Furthermore, "Y1" may be for example "01"B, and moreover if the interleave method is being employed, "Y2" will be "00"B. And when the bus select signal which is output from the bus decoder 152 changes, the bus selector 153 comes to output the data "Qn+1 (Y2)" upon the bus WRBX at the time t72.

Here, since in this embodiment the lower address continues to change at a timing which is determined in advance internally to the semiconductor memory device, the lower address changes to "Y2" at a timing (in this case the time t71, which is earlier than the time t41) which is different from the case of FIG. 13 in which the page address is supplied from the outside (the time t41). And the same happens subsequently: when the burst control circuit 161 outputs the third and fourth trigger signals at, respectively, the time t73 after a time period Ti' from the time t71, and at the time t75 after the time period Ti' from this time t73, the burst address generation circuit 162 changes its own output through "Y3" and "Y4" respectively, and corresponding to this the data "Qn+1 (Y3)" and "Qn+1 (Y4)" are output upon the bus WRBX at the respective times t74 and t76.

Here, in this embodiment as well, the complete reading of the four data items is finished by the time t13. Due to this, if as shown in the figure the time period Ti' is set to be shorter than the above described time period Ti (for example "½" of the time period Ti), in the same way as in the page mode, it is possible to shorten the address access time periods to the second and subsequent items of data (the times t71 through t72, the times t73 through t74, and the times t75 through t76) as well, by comparison with the address access time period for the initial data item (the times t10 through t13).

Figure 18:
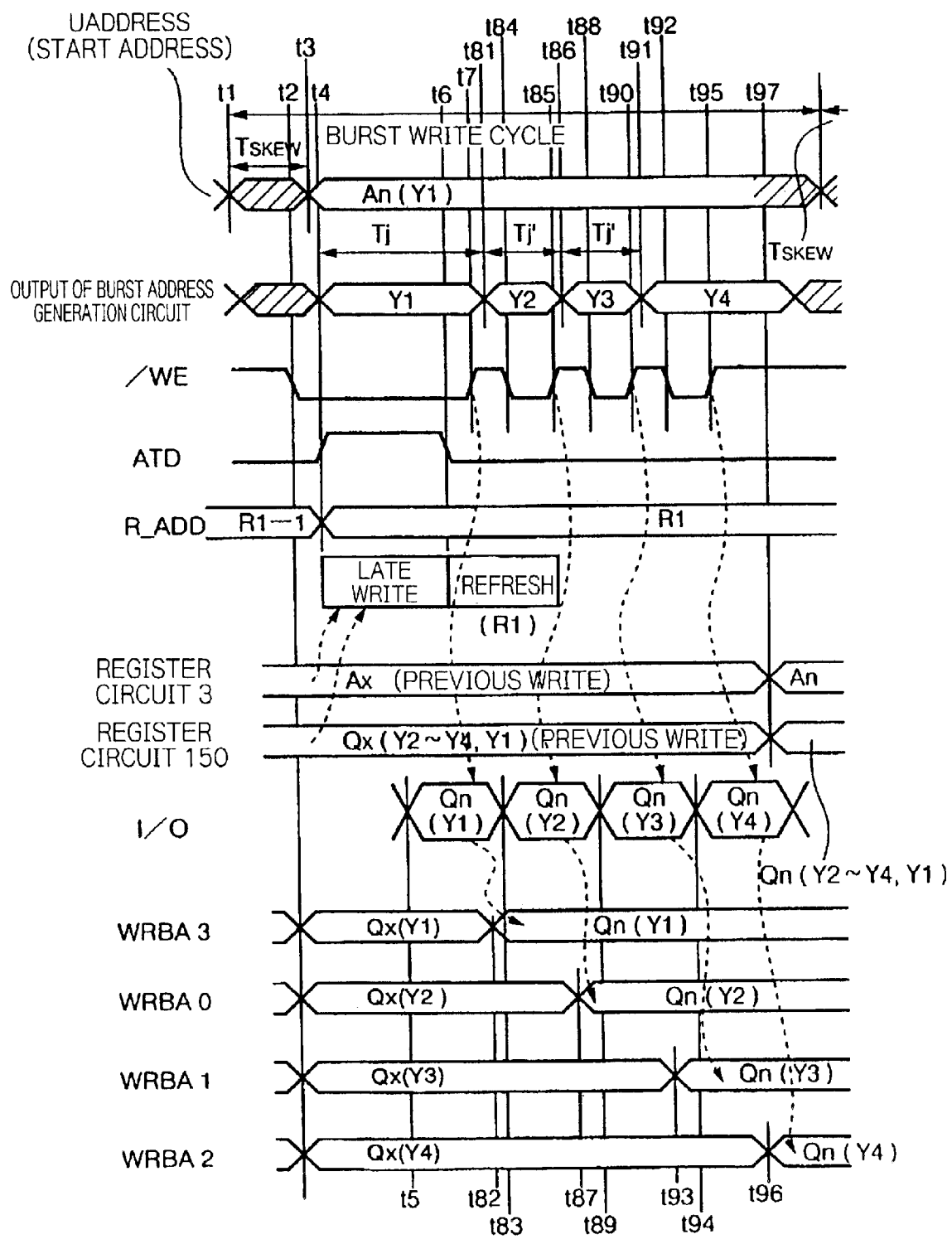
FIG. 18 is a timing chart showing, for the same embodiment, the operation in the case that burst writing and the refresh following it are carried out.

Now the operation of burst writing will be explained with reference to FIG. 18. Since this case as well is based upon the page write operation, principally the points of difference from FIG. 14 will be explained. Moreover, here it will be assumed that the linear method is employed, and that the address Y1 is "11"B (accordingly, the addresses Y2 through Y4 are "00"B through "10"B). First when at the time t2 in the address skew period, in the same way as in FIG. 14, the write enable signal/WE becomes valid, the burst control circuit 161 goes into the state in which it can output trigger signals. Thereafter, when the device reaches the time t3, along with "An" being supplied as the address "UAddress", "Y1" is supplied as the address "StartAddress".

And, since the burst control circuit 161 outputs a trigger signal when the device reaches the time t4 and the address transition detect signal ATD rises, the burst address generation circuit 162 takes in the address "Y1" which is output from the address buffer 151 and outputs it to the bus decoder 152. Due to this, the data items "Qx (Y2 through Y4, Y1)" are simultaneously late written to the four addresses which correspond to the address "Ax", in the same manner as with the fourth embodiment. Thereafter at the time t5 the write data "Qn (Y1)" is supplied on the bus I/O corresponding to the address An (Y1), and at the time t6 the address transition detect signal ATD drops and the device shifts to refresh operation.

Next, when a time period Tj elapses from the time t4 and the device reaches the time t81, since the burst control circuit 161 outputs the second trigger signal, the burst address generation circuit 162 changes its output to "Y2". And when the device reaches the time t82, in response to the fact that the write enable signal/WE has risen at the time t7, along with the bus selector 153 latching the data "Qn (Y1) to the internal latch circuit corresponding to the bus WRBA3, also transmits this data upon the bus WRBA3.

Next, when the device reaches the time t83, in response to the fact that the lower address has changed to "Y2", the data "Qn (Y2)" comes to be supplied upon the bus I/O. Furthermore when the device reaches the time t87, in response to the fact that the write enable signal/WE has risen at the time t85, (since in this case the address "Y2" is "00"B) along with the bus selector 153 latching the data "Qn (Y2) to the internal latch circuit which corresponds to the bus WRBA0, also transmits this data upon the bus WRBA0.

Thereafter the same thing happens: when the burst control circuit 161 outputs the third and the fourth trigger signals respectively at the time t86 after a time period Tj' from the time t81, and at the time t91 after the time period tj' from this time t86, the burst address generation circuit 162 changes its own output to, respectively, "Y3" and "Y4", and so as to correspond to this, the data "Qn (Y3)" and "Qn (Y4)" are output upon the bus WRBX at, respectively, the times t89 and t94. Furthermore, in response to the fact that the write enable signal/WE rises at the times t90 and t95, the bus selector 153, at the respective times t93 and t96, (since in this case the addresses "Y3" and "Y4" are respectively "01"B and "10"B) along with latching the data items "Qn (Y3)" and "Qn (Y4)" to the latch circuits which correspond to the buses WRBA1 and WRBA2, also transmits them to the buses WRBA1 and WRBA2.

It should be understood that in this embodiment as well, in the same way as during the page mode, it would also be acceptable to reduce the width of the keep period (the time period Tj) and the write pulse for the first lower address, like the keep period (tj') and the write pulse for the second and subsequent lower addresses. Furthermore, it would also be acceptable further to shorten the second and subsequent keep period (tj') and write pulse shorter than the widths shown in FIG. 18.

As described above, in this embodiment, when performing continuous access, it is sufficient to provide only the starting address ("StartAddress") as the lower address, so that control of the semiconductor memory device from the exterior becomes simpler, in comparison with the page mode. Furthermore, although with a conventional semiconductor memory device which performs burst operation a synchronous clock signal is used as a trigger for the start of operation, when operation is performed according to a clock signal as described above, the power consumption is undesirably increased. By contrast to this, with this embodiment, the output enable signal OE or the write enable signal/WE is used as the trigger for the start of burst operation, so that no clock signal is used as a trigger. Due to this, it is possible to reduce the power consumption according to this embodiment, which is accordingly suitable for application to an instrument which utilizes low power consumption, such as a portable telephone or the like.

[The Sixth Embodiment]

In each of the above described embodiments, it was arranged for the standby mode to be switched over based upon a power down control signal "PowerDown" which is supplied from the exterior of the semiconductor memory device. By contrast to this, in this embodiment, the standby mode switching is performed in the same way as in each of the embodiments described above by writing the data for commanding mode switching to a specific address within the memory cell array 7 which is determined in advance. In other words, in this embodiment, the "0" address (the lowest address) in the memory cell array 7 is used as a data storage region dedicated to mode switching. Furthermore, in this embodiment, it is arranged that the data for setting the standby mode 2 is "F0"h (herein, "h" means a hexadecimal number), while the data for setting the standby mode 3 is "0F"h. Accordingly, in this embodiment, the bus width of the buses WRB and WRBX is eight bits.

Figure 19:
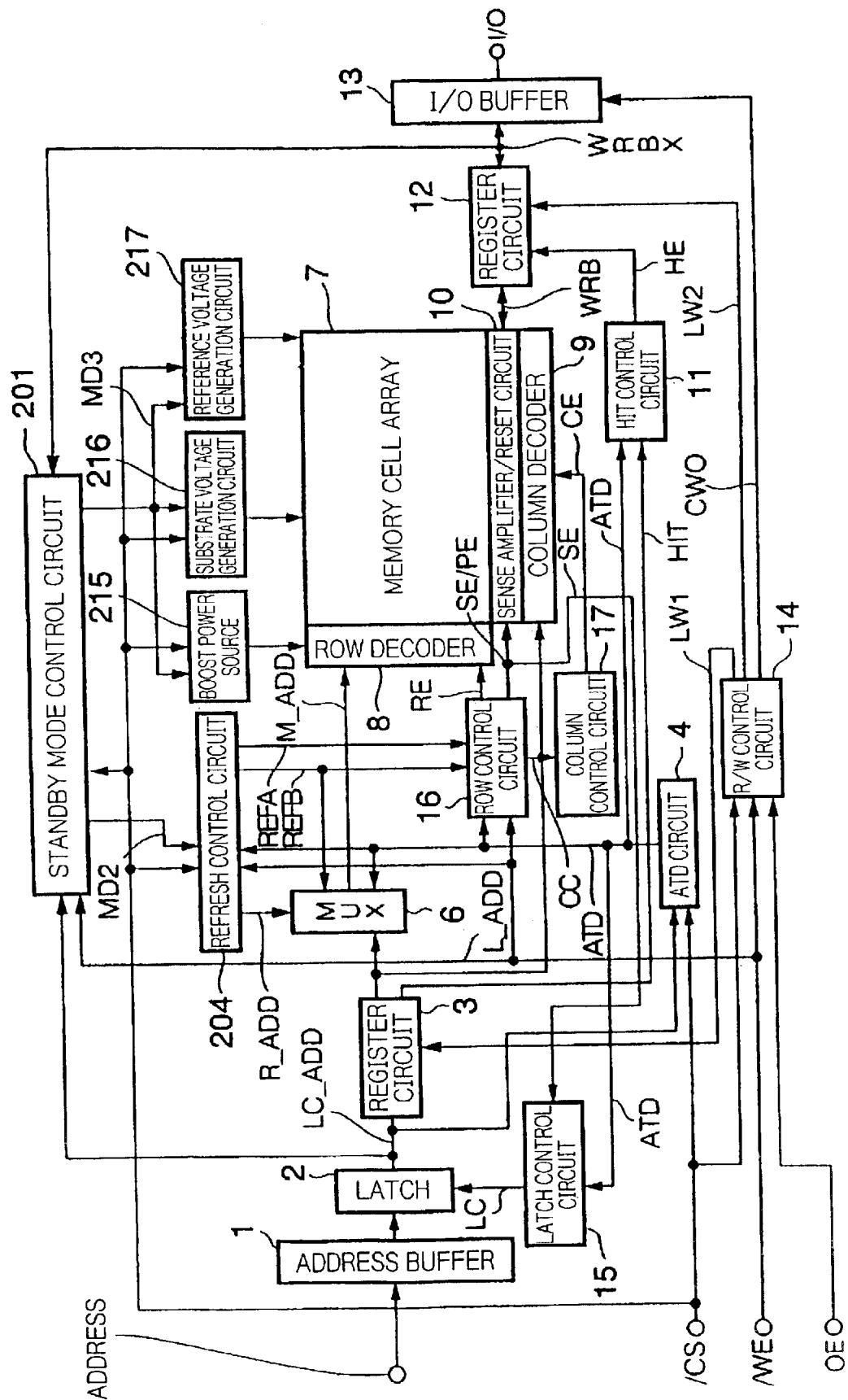
FIG. 19 is a block diagram showing the structure of a semiconductor memory device according to the sixth embodiment of the present invention.

FIG. 19 is a block diagram showing the structure of the semiconductor memory device of this embodiment, and herein, to structural elements and to signal designations which are the same as in FIG. 1, the same reference symbols are affixed. As points in which FIG. 19 differs from FIG. 1, there are: that no pin for inputting the power down control signal "PowerDown" is present; that a standby mode control circuit 201 is newly added; and that portions of the structure of a refresh control circuit 204, a boost power source 215, a substrate voltage generation circuit 216, and a reference voltage generation circuit 217 differ from the refresh control circuit 5, the boost power source 18, the substrate voltage generation circuit 19, and the reference voltage generation circuit 20, respectively. Accordingly, these portions will be explained in greater detail while referring to FIGS. 20 through 24. It should be understood that in FIGS. 20 through 24, to structural elements and signal designations which are the same as in FIGS. 1 and 19, the same reference symbols are affixed.

First, in FIG. 19, the standby mode control circuit 201 generates mode set signals MD2 and MD3, based upon the internal address LC_ADD, the chip select signal/CS, the write enable signal/WE, and the write data upon the bus WRBX. Among these, the mode set signal MD2 is a signal which goes to "H" level when the standby mode 2 is set, and it is supplied to the refresh control circuit 204. On the other hand, the mode set signal MD3 is a signal which goes to "H" level when the standby mode 2 or the standby mode 3 is set, and it is supplied to the boost power source 215, to the substrate voltage generation circuit 216, and to the reference voltage generation circuit 217. It should be understood that when both of the mode signals MD2 and MD3 are "L" level, this indicates the standby mode 1.

Figure 20:
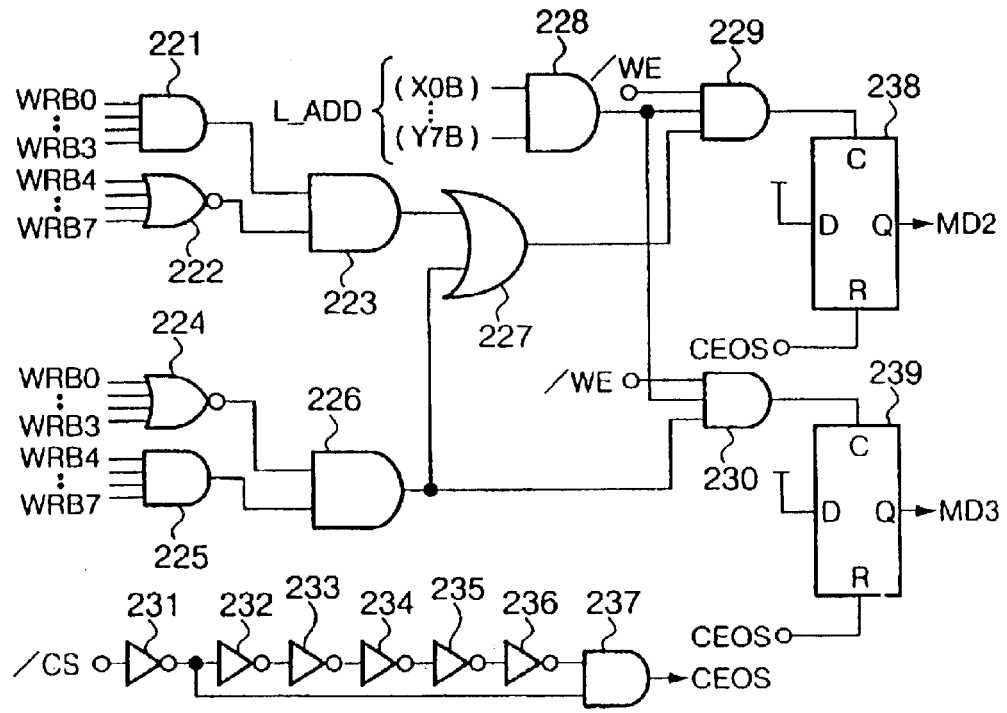
FIG. 20 is a circuit diagram showing the detailed structure of a standby mode control circuit according to the same embodiment.

Here, FIG. 20 is a circuit diagram showing the detailed structure of the standby mode control circuit 201. In this figure, the data WRB0 through WRB3 and WRB4 through WRB7 are bits 0 through 3 and bits 4 through 7 of the write data which is supplied upon the bus WRBX from the exterior of the semiconductor memory device. And a circuit built up from an AND gate 221, a NOR gate 222, and an AND gate 223 outputs "H" level only when the write data is "F0"h. In the same manner, a circuit built up from a NOR gate 224, an AND gate 225, and an AND gate 226 outputs "H" level only when the write data is "0F"h. Furthermore, by forming the logical sum of the outputs of the AND gates 233 and 226, an OR gate 227 outputs "H" level when either of "F0"h or "0F"h is input as the write data.

Next, the addresses X0B through Y7B are address values in which the bits which make up the internal address LC_ADD have been inverted. For example, the address X0B is a value inverted from bit 0 of the row address, while the address Y7B is a value inverted from bit 7 of the column address. Accordingly, the AND gate 228 outputs "H" level only when it has detected that all the bits of the internal address LC_ADD are "0"B (in other words, the address "0"). And the AND gate 229 outputs the write enable signal/WE as a clock signal just as it is, only when the data "F0"h or "0F"h is written in to the address "0". Furthermore, the AND gate 230 outputs the write enable signal/WE as a clock signal just as it is, only when the data "0F"h is written in to the address "0".

Next, a circuit which is made up from inverters 231 through 236 and an AND gate 237 generates a one shot pulse in a signal CEOS upon detecting the falling edge of the chip select signal/CS. Next, when the output of the AND gate 229 rises and the clock signal is input at its C terminal, a latch 238 outputs from its Q terminal as the mode select signal MD2 the level "H", which corresponds to the power source electrical potential which has been supplied to its D terminal. Furthermore, when a one shot pulse has been generated in the signal CEOS which is supplied to its R terminal, the latch 228 resets itself and outputs "L" level in the mode select signal MD2. The latch 239 is also of the same structure, and outputs "H" level to the mode set signal MD3 when the output of the AND gate 230 has risen, while it outputs "L" level to the mode set signal MD3 when a one shot pulse has been generated in the signal CEOS.

In the above manner, when setting the standby mode 2, the output of the AND gate 229 rises in synchrony with the rising edge of the write enable signal/WE and the D type latch 238 is set, and the mode select signal MD2 goes to "H"

level. Furthermore, when setting the standby mode 3, both of the outputs of the AND gates 229 and 230 rise in synchrony with the rising edge of the write enable signal/WE and the latches 238 and 239 are both set, and both the mode set signal MD2 and the mode set signal MD3 go to "H" level.

Figure 21:
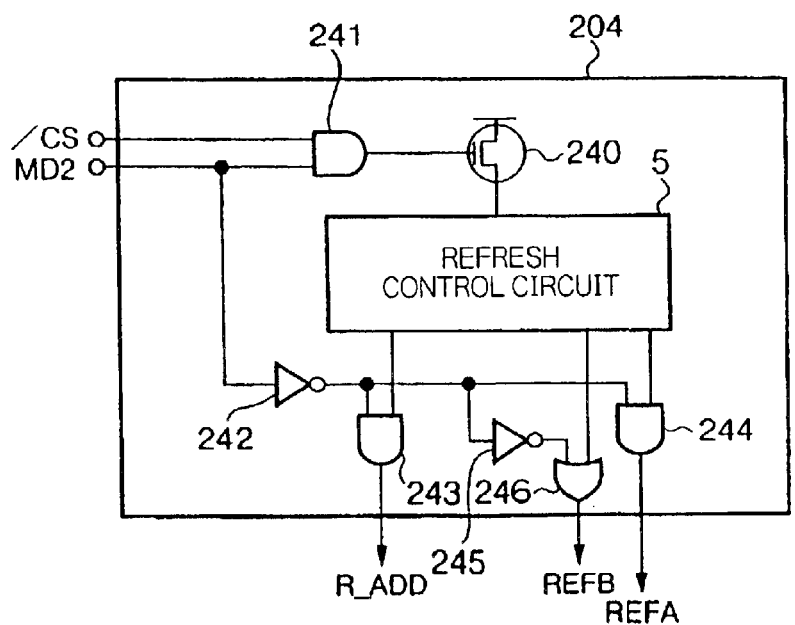
FIG. 21 is a circuit diagram showing the detailed structure of a refresh control circuit according to the same embodiment.

Next, the refresh control circuit 204 shown in FIG. 19 generates the refresh address R_ADD and the refresh control signals REFA and REFB using the chip select signal/CS and the mode set signal MD2 instead of the power down control signal "PowerDown". Here, FIG. 21 is a circuit diagram which shows the detailed structure of the refresh control circuit 204. In this figure, the gate terminal, the source terminal, and the drain terminal of the P channel transistor 240 are respectively connected to the output of an AND gate 241, to power source electrical potential, and to the power source supply pin of the refresh control circuit 5. Due to this, if the output of the AND gate 241 is "L" level the transistor 240 is ON, and power source is supplied to the refresh control circuit 5, while if the same output is "H" level the transistor 240 is cut off, and the supply of power source is stopped.

The AND gate 241 cuts off the transistor 240 when the semiconductor memory device is in the non selected state (the chip select signal/CS is "H" level) and moreover the device is in the standby mode 2 or the standby mode 3 (the mode set signal MD2 is at "H" level). Next, an inverter 242 is for generating a signal which is inverted from the mode set signal MD2, and its output goes to "H" level during the standby mode 1. In the standby mode 1, on the one hand, an AND gate 243 outputs the refresh address R_ADD which is generated by the refresh control circuit 5 just as it is, while in the standby mode 2 or the standby mode 3 it fixes that address at "0".

In the standby mode 1, on the one hand, an AND gate 244 outputs the refresh control signal REFA which is generated by the refresh control circuit 5 just as it is, while in the standby mode 2 or the standby mode 3 it fixes that signal at "L" level. Furthermore, an inverter 245 inverts the output of the inverter 242, so that it outputs "L" level in the standby mode 1. In the standby mode 1, on the one hand, an OR gate 246 outputs the refresh control signal REFB which is generated by the refresh control circuit 5 just as it is, while in the standby mode 2 or the standby mode 3 it fixes that signal at "H" level.

Figure 22:
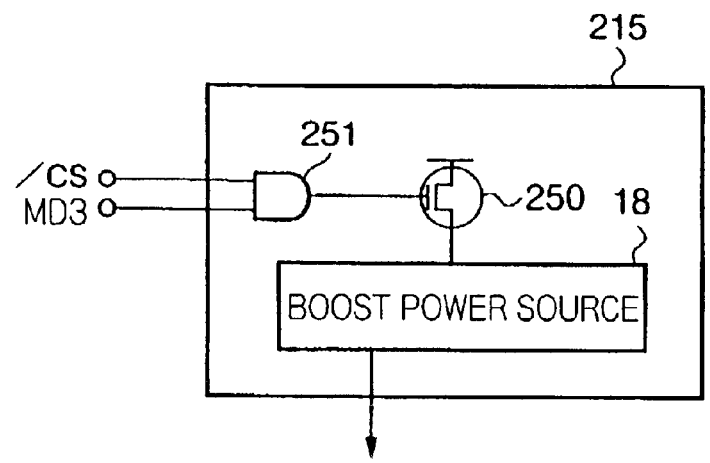
FIG. 22 is a circuit diagram showing the detailed structure of a boost power source according to the same embodiment.
Figure 23:
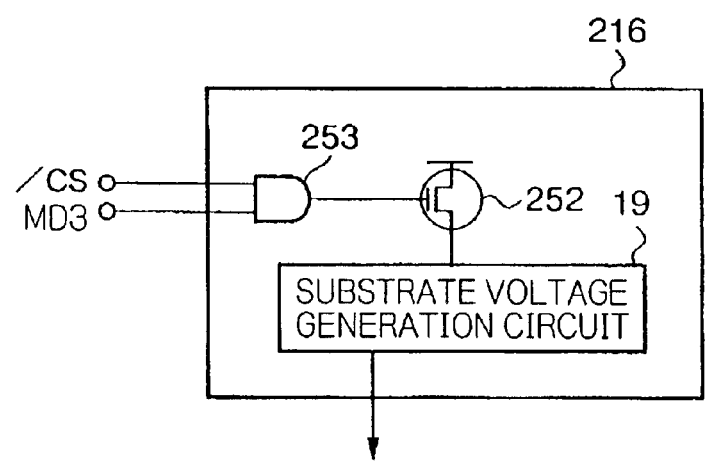
FIG. 23 is a circuit diagram showing the detailed structure of a substrate voltage generation circuit according to the same embodiment.
Figure 24:
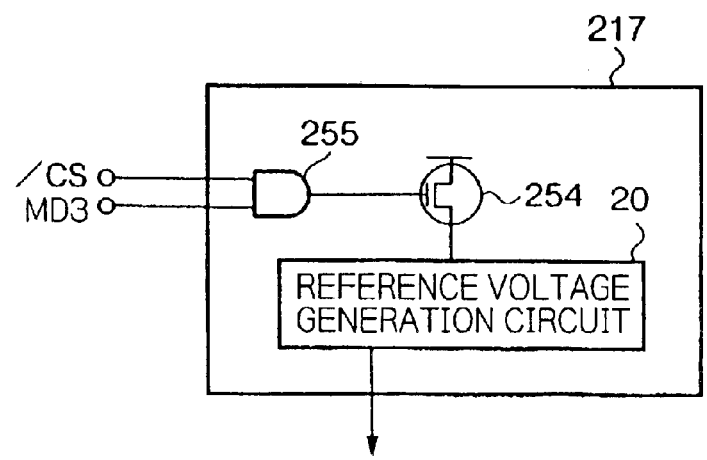
FIG. 24 is a circuit diagram showing the detailed structure of a reference voltage generation circuit according to the same embodiment.

Next, FIGS. 22 through 24 are circuit diagrams showing the detailed structures of the boost power source 215, of the substrate voltage generation circuit 216, and of the reference voltage generation circuit 217. In the boost power source 215, a P channel transistor 250 and an AND gate 251 have the same respective functions as the transistor 240 and the AND gate 241 which were shown in FIG. 21. That is to say, when the semiconductor memory device is in the non selected state (the chip select signal/CS is at "H" level) and moreover the device is in the standby mode 3 (the mode set signal MD3 is "H" level), the transistor 250 is cut off and the supply of power source to the boost power source 18 is stopped, while in other cases the power source is supplied to the boost power source 18. The above matters are exactly the same for the substrate voltage generation circuit 216 and the reference voltage generation circuit 217; the transistors 252 and 254 which are included in these circuits correspond to the transistor 250 in the boost power source 215, and the AND gates 253 and 255 correspond to the AND gate 251 within the boost power source 215.

The operation during standby mode switching with the semiconductor memory device according to the above described structure takes place as follows.

① Standby Mode 1

To set the semiconductor memory device to the standby mode 1, it is sufficient to drop the chip select signal/CS. By doing this, the standby mode control circuit 201 generates a one shot pulse from the falling edge of the chip select signal/CS, and resets the latch 238 and the latch 239, and both of the mode select signals MD2 and MD3 go to "L" level.

Due to this, in the refresh control circuit 204, along with the transistor 240 going to ON and power source being supplied to the internal refresh control circuit 5, the refresh control signals REFA and REFB and the refresh address R_ADD generated by the refresh control circuit 5 come to be output just as they are. Furthermore, power source also comes to be supplied to the boost power source 18, the substrate voltage generation circuit 19, and the reference voltage generation circuit 20 which are respectively internal to the boost power source 215, the substrate voltage generation circuit 216, and the reference voltage generation circuit 217. By performing the above operations, operation of the type explained in the above described embodiments is made possible.

② Standby Mode 2

To set the standby mode 2, it is sufficient to write the data "F0"h to the address "0" as described above. By doing this, the standby mode control circuit 201 brings the mode select signal MD2 to the "H" level from the rising edge of the write enable signal/WE. Since the chip select signal/CS goes to "H" level when at this time point the semiconductor memory device is not selected, or when thereafter it becomes no longer selected, thereby the refresh control circuit 204 ceases supply of power source to the internal refresh control circuit 5.

Furthermore, since the output of the refresh control circuit 5 becomes indefinite because the supply of power source to it has ceased, thereby the refresh control circuit 204 fixes the refresh address R_ADD at "0", and also fixes the levels of the refresh control signals REFA and REFB at "L" level and "H" level. Furthermore, since at this time point the chip select signal/CS is "H" level, even if the bits of the internal address LC_ADD change, the ATD circuit 4 does not generate any one shot pulse in the address transition detect signal ATD, instead maintaining it at "L" level.

Due to this, the row control circuit 16 fixes all of the row enable signal RE, the sense amplifier enable signal SE, the pre-charge enable signal PE, and the control signal CC at "L" level. Accordingly, the column enable signal CE and the latch control signal LC are also kept at "L" level. On the other hand, since the refresh control signal REFB is fixed at "H" level and moreover the address transition detect signal ATD is fixed at "L" level, therefore the multiplexer 6 continuously selects the side of the internal address L_ADD. By doing as above, the refresh operation is interrupted and the current consumption is reduced. It should be understood that the power source continues to be supplied to the boost power source 18, to the substrate voltage generation circuit 19, and to the reference voltage generation circuit 20 (refer to FIGS. 22 through 24), since at this time the mode set signal MD3 remains at "L" level.

③ Standby Mode 3

To set the standby mode 3, it is sufficient to write the data "0F"h to the address "0" as described above. By doing this, the standby mode control circuit 201 raises both the mode set signal MD2 and the mode set signal MD3 to "H" level from the rising edge of the write enable signal/WE. Due to this, at the time point that the chip select signal/CS has gone to "H" level, in the same way as for the standby mode 2, the refresh control circuit 204 ceases the supply of power source to the internal refresh control circuit 5. Simultaneously with this, the boost power source 215, the substrate voltage generation circuit 216, and the reference voltage generation circuit 217 stop the supply of power source to, respectively, the internal boost power source 18, the substrate voltage generation circuit 19, and the reference voltage generation circuit 20. Due to this, in addition to the refresh control being interrupted in the same manner as in the standby mode 2, also the current is cut off from the power source system control circuitry, so that a further reduction of current consumption is attained.

As described above, since in this embodiment it is not necessary to supply any signal from the exterior of the semiconductor memory device like the power down control signal "PowerDown" which was explained with respect to the first embodiment, accordingly it is possible to reduce the number of pins to that extent. It should be understood that, although in the above explanation the first embodiment was taken as a basis, it would also be acceptable to apply the same concepts to the second or the subsequent embodiments. Moreover, the control of standby mode which was explained in the embodiments described above could also be applied to a conventional semiconductor memory device such as a pseudo-SRAM or the like.

[Variant Embodiments]

Although in each of the embodiments described above each of the memory cells of the memory cell array 7 was built up of a single transistor and a single capacitor, the structure of the memory cells is not limited by this format. Although, of course, this type of memory cell is most desirable from the point of view of chip size and so on, with the semiconductor memory device of the present invention, the use of memory cells other than single transistor single capacitor ones is not ruled out. That is to say, in the case of DRAM memory cells whose structure is smaller than that of the memory cells of a general-purpose SRAM, there is the beneficial effect that it is possible to reduce the chip size as compared with a general-purpose SRAM, even if they are not of a single transistor single capacitor structure. Furthermore, although in each of the embodiments described above it was arranged to perform the refresh, for example, upon the falling edge of the one shot pulse which was generated in the address transition detect signal ATD, it would also be acceptable to invert the logic of this one shot pulse, and to perform the refresh upon its rising edge. This is exactly the same for each of the other signals, as well as with the address transition detect signal ATD.

Furthermore, with the semiconductor memory devices according to the various embodiments described above, although of course the embodiment is acceptable in which the entire circuit which was shown in, for example, FIG. 1 is mounted upon a single chip, an embodiment would also be acceptable of a type in which the entire circuit was separated into several functional blocks and each functional block was mounted upon a separate chip. As an example of the latter, a hybrid IC (integrated circuit) may be conceived in which the control section which generates the various control signals and address signals, and the memory cell section, are mounted upon separate chips (a control chip and a memory chip). That is to say, a structure of a type in which various types of control signals are supplied to a memory chip from a control chip which is provided exterior to a memory chip is also included within the scope of the present invention.

INDUSTRIAL APPLICABILITY

The present invention offers techniques for implementing semiconductor memory devices which have the following special characteristics.

Normal reading and writing access does not become delayed due to refresh.

Even in circumstances such as skew being present in the address, the inconveniences do not occur of access delay taking place and of the memory cells being destroyed.

It is possible to shorten the entire memory cycle by reducing the write time period.

Even operating according to a general-purpose SRAM specification, and even with increase of capacity, the chip size is small, the power consumption is low, and moreover the price is cheap.

A standby mode the same as employed with a general-purpose SRAM, and also a unique low power consumption mode that is not seen with existing semiconductor memory devices, are available.

What is claimed is:

1. A semiconductor memory device comprising:
a memory cell array comprising memory cells which require refresh;
an access circuit which performs refresh of the memory cell array after reading or writing for an access address has been performed for the memory cell array; and
a control circuit which, after a memory cycle in which a write request and write data presented asynchronously for the access address is input, makes the access circuit perform late writing using the access address and the write data provided in the memory cycle.

2. A semiconductor memory device according to claim 1, wherein, in a memory cycle in which a next write request for the preceding write request is presented, the control circuit performs writing corresponding to the preceding write request by late writing.

3. A semiconductor memory device according to claim 1, wherein, when the write request becomes invalid in the memory cycle in which the write request is presented, the control circuit takes in the access address and the write data presented in the memory cycle and uses the access address and the write data in the late writing.

4. A semiconductor memory device according to claim 1, wherein the control circuit detects that a chip is in the non selected state or the deactivated state, and performs the late writing during the non selected state or the deactivated state.

5. A semiconductor memory device according to claim 1, further comprising: an address transition detect circuit which detects whether a chip has transited from the non selected state to the selected state, or that the access addres has changed, and
wherein the control circuit starts the reading or the writing after a skew period has elapsed which is set greater than or equal to the maximum value of a skew included at least one of a chip select signal which controls the selected state or non selected state, and the access address, taking the time of detection as a reference.

6. A semiconductor memory device according to claim 5, wherein the control circuit sets the completion timing of the skew period after the time at which it is determined whether the write request is presented.

7. A semiconductor memory device according to claim 5, wherein, if writing, reading, or refresh which was started in a memory cycle preceding to the current memory cycle in which a read request or a write request is supplied has not been completed by the completion timing of a skew period for the current memory cycle, the control circuit delays the start of writing or reading in the current memory cycle until the writing, reading, or refresh has been completed.

8. A semiconductor memory device according to claim 7, wherein the access circuit performs refresh after reading or writing only once in a plurality of memory cycles, and the control circuit delays the start of writing or reading in a memory cycle which is subsequent to the memory cycle in which the refresh is performed.

9. A semiconductor memory device according to claim 1, wherein the access circuit performs reading or late writing simultaneously for a plurality of addresses in the memory cell array, and the control circuit performs the operation of sequentially outputting to the outside read data which have been obtained by the reading, or the operation of sequentially taking in write data which are input from the outside for the next late writing, in parallel with the refresh.

10. A semiconductor memory device according to claim 9, wherein the control circuit detects a change of predetermined upper bits in the access addres and, when performing the reading or the late writing, successively outputs the read data or successively takes in the write data for a plurality of addresses for which the predetermined upper bits in the access address are the same, while varying the lower address in the access address which is made up from the bits other than the predetermined upper bits.

11. A semiconductor memory device according to claim 10, wherein the control circuit successively outputs the read data or successively takes in the write data according to the lower address supplied from the outside.

12. A semiconductor memory device according to claim 10, wherein the control circuit successively outputs the read data or successively takes in the write data while varying the lower address according to a predetermined order based upon an initial value of the lower address supplied from the outside.

13. A semiconductor memory device according to claim 1, wherein the control circuit detects that a chip is in the non selected state or the deactivated state, and performs the refresh during the non selected state or the deactivated state.

14. A semiconductor memory device according to claim 1, further comprising:

a refresh control circuit comprising circuitry within the access circuit and the control circuit which performs control of the refresh, and a refresh address generation circuit which generates a refresh address showing memory cells to be refreshed, and which updates the refresh address each time the refresh is performed;

a voltage generation circuit which generates voltages supplied to parts within the device; and a mode switching circuit which switches to one of a first mode in which power source is supplied both to the refresh control circuit and to the voltage generation circuit, a second mode in which supply of power source to the refresh control circuit is stopped while power source is supplied to the voltage generation circuit, and a third mode in which supply of power source both to the refresh control circuit and to the voltage generation circuit is stopped, and which controls whether supply of power source is performed to the refresh control circuit and the voltage generation circuit according to the switched mode.

15. A semiconductor memory device according to claim 14, wherein the mode switching circuit performs switching of mode by detecting that writing of predetermined data in each mode has been performed for a predetermined address.

16. A semiconductor memory device comprising:

a memory cell array comprising memory cells which require refresh;

an access circuit which performs refresh of the memory cell array accompanying a write cycle for an access address, and performs refresh of the memory cell array spontaneously after a predetermined time period has elapsed from performing the refresh which accompanies the write cycle; and a control circuit which, after a memory cycle in which a write request and write data presented asynchronously for the access address is input, makes the access circuit performing late writing using the access address and the write data which is provided in the memory cycle.

17. A semiconductor memory device according to claim 16, wherein the access circuit performs spontaneous refresh after temporarily selecting a word line in the memory cell array which is designated by the access address in a write cycle for the access address.

18. A semiconductor memory device according to claim 16, wherein the access circuit performs spontaneous refresh after temporarily selecting a word line in the memory cell array which is designated by the access address in a read cycle for the access address.

* * * * *

UNITED STATES PATENT AND TRADEMARK OFFICE
CERTIFICATE OF CORRECTION

PATENT NO. : 6,834,020 B2
DATED : December 21, 2004
INVENTOR(S) : Hiroyuki Takahashi et al.

It is certified that error appears in the above-identified patent and that said Letters Patent is hereby corrected as shown below:

<u>Title page,</u>
Item [56], References Cited, please insert the following:
-- U.S. PATENT DOCUMENTS

| | | |
|---|---|---|
| 5,323,360 | 6/1994 | Pelley, III |
| 5,717,653 | 2/1998 | Suzuki |

FOREIGN PATENT DOCUMENTS

| | | |
|---|---|---|
| KR | 10-0209542 | 7/1999 -- |

Signed and Sealed this

Fifth Day of April, 2005

JON W. DUDAS
*Director of the United States Patent and Trademark Office*